(12) United States Patent
Zhao et al.

(10) Patent No.: US 7,893,546 B2
(45) Date of Patent: Feb. 22, 2011

(54) BALL GRID ARRAY PACKAGE ENHANCED WITH A THERMAL AND ELECTRICAL CONNECTOR

(75) Inventors: Sam Ziqun Zhao, Irvine, CA (US); Reza-ur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/260,784

(22) Filed: Oct. 29, 2008

(65) Prior Publication Data
US 2009/0057871 A1 Mar. 5, 2009

Related U.S. Application Data

(60) Continuation of application No. 11/475,118, filed on Jun. 27, 2006, now Pat. No. 7,462,933, which is a division of application No. 10/284,312, filed on Oct. 31, 2002, now Pat. No. 7,161,239, and a continuation-in-part of application No. 09/984,259, filed on Oct. 29, 2001, now Pat. No. 7,132,744, which is a continuation-in-part of application No. 09/742,366, filed on Dec. 22, 2000, now abandoned.

(60) Provisional application No. 60/352,877, filed on Feb. 1, 2002.

(51) Int. Cl.
H01L 23/48 (2006.01)
H01L 23/34 (2006.01)

(52) U.S. Cl. .................. 257/784; 257/707; 257/713

(58) Field of Classification Search .......... 257/707, 257/713, 784, E23.101
See application file for complete search history.

(56) References Cited

U.S. PATENT DOCUMENTS

| 3,790,866 A | 2/1974 | Meyer et al. |
| 4,611,238 A | 9/1986 | Lewis et al. |
| 5,045,921 A | 9/1991 | Lin et al. |

(Continued)

FOREIGN PATENT DOCUMENTS

DE 42 13 251 A 10/1992

(Continued)

OTHER PUBLICATIONS

A Communication from the European Patent Office cited in Application No. 03 001 959.0-1235, dated Aug. 19, 2009, 5 pages.

(Continued)

*Primary Examiner*—Nitin Parekh
(74) *Attorney, Agent, or Firm*—Sterne, Kessler, Goldstein & Fox PLLC

(57) ABSTRACT

Ball grid array (BGA) packages are provided. A BGA package includes a substrate that has a surface and a stiffener that has a surface and a protruding portion. The surface of the substrate has an opening therein. The protruding portion is located on the surface of the stiffener. The surface of the stiffener is coupled to the surface of the substrate. The protruding portion extends through the opening. An area of the surface of the stiffener is less than an area of the surface of the substrate. A surface of the protruding portion is capable of attachment to a printed circuit board (PCB) when the BGA package is mounted to the PCB.

10 Claims, 62 Drawing Sheets

U.S. PATENT DOCUMENTS

| | | |
|---|---|---|
| 5,065,281 A | 11/1991 | Hernandez et al. |
| 5,173,766 A | 12/1992 | Long et al. |
| 5,208,504 A | 5/1993 | Parker et al. |
| 5,216,278 A | 6/1993 | Lin et al. |
| 5,285,352 A | 2/1994 | Pastore et al. |
| 5,291,062 A | 3/1994 | Higgins, III |
| 5,294,826 A | 3/1994 | Marcantonio et al. |
| 5,366,589 A | 11/1994 | Chang |
| 5,394,009 A | 2/1995 | Loo |
| 5,397,917 A | 3/1995 | Ommen et al. |
| 5,397,921 A | 3/1995 | Karnezos |
| 5,409,865 A | 4/1995 | Karnezos |
| 5,433,631 A | 7/1995 | Beaman et al. |
| 5,438,216 A | 8/1995 | Juskey et al. |
| 5,474,957 A | 12/1995 | Urushima |
| 5,490,324 A | 2/1996 | Newman |
| 5,534,467 A | 7/1996 | Rostoker |
| 5,541,450 A | 7/1996 | Jones et al. |
| 5,543,662 A | 8/1996 | Burward-Hoy |
| 5,552,635 A | 9/1996 | Kim et al. |
| 5,572,405 A | 11/1996 | Wilson et al. |
| 5,578,869 A | 11/1996 | Hoffman et al. |
| 5,583,377 A | 12/1996 | Higgins, III |
| 5,583,378 A | 12/1996 | Marrs et al. |
| 5,642,261 A * | 6/1997 | Bond et al. ................ 361/704 |
| 5,644,163 A * | 7/1997 | Tsuji ......................... 257/706 |
| 5,648,679 A | 7/1997 | Chillara et al. |
| 5,650,659 A | 7/1997 | Mostafazadeh et al. |
| 5,650,662 A | 7/1997 | Edwards et al. |
| 5,691,567 A | 11/1997 | Lo et al. |
| 5,717,252 A | 2/1998 | Nakashima et al. |
| 5,736,785 A | 4/1998 | Chiang et al. |
| 5,744,863 A | 4/1998 | Culnane et al. |
| 5,796,170 A | 8/1998 | Marcantonio |
| 5,798,909 A | 8/1998 | Bhatt et al. |
| 5,801,432 A | 9/1998 | Rostoker et al. |
| 5,834,848 A | 11/1998 | Iwasaki |
| 5,835,355 A | 11/1998 | Dordi |
| 5,843,808 A | 12/1998 | Karnezos |
| 5,844,168 A | 12/1998 | Schueller et al. |
| 5,856,911 A | 1/1999 | Riley |
| 5,866,949 A | 2/1999 | Schueller |
| 5,883,430 A | 3/1999 | Johnson |
| 5,889,321 A | 3/1999 | Culnane et al. |
| 5,889,324 A | 3/1999 | Suzuki |
| 5,894,410 A | 4/1999 | Barrow |
| 5,895,967 A | 4/1999 | Stearns et al. |
| 5,901,041 A | 5/1999 | Davies et al. |
| 5,903,052 A | 5/1999 | Chen et al. |
| 5,905,633 A | 5/1999 | Shim et al. |
| 5,907,189 A | 5/1999 | Mertol |
| 5,907,903 A | 6/1999 | Ameen et al. |
| 5,920,117 A | 7/1999 | Sono et al. |
| 5,945,741 A * | 8/1999 | Ohsawa et al. ............. 257/777 |
| 5,949,137 A | 9/1999 | Domadia et al. |
| 5,953,589 A | 9/1999 | Shim et al. |
| 5,972,734 A | 10/1999 | Carichner et al. |
| 5,976,912 A | 11/1999 | Fukutomi et al. |
| 5,977,626 A | 11/1999 | Wang et al. |
| 5,977,633 A | 11/1999 | Suzuki et al. |
| 5,982,621 A | 11/1999 | Li |
| 5,986,340 A | 11/1999 | Mostafazadeh et al. |
| 5,986,885 A | 11/1999 | Wyland |
| 5,998,241 A | 12/1999 | Niwa |
| 5,999,415 A | 12/1999 | Hamzehdoost |
| 6,002,147 A | 12/1999 | Iovdalsky et al. |
| 6,002,169 A | 12/1999 | Chia et al. |
| 6,011,304 A | 1/2000 | Mertol |
| 6,011,694 A | 1/2000 | Hirakawa |
| 6,020,637 A | 2/2000 | Karnezos |
| 6,028,358 A | 2/2000 | Suzuki |
| 6,034,427 A | 3/2000 | Lan et al. |
| 6,040,984 A | 3/2000 | Hirakawa |
| 6,057,601 A | 5/2000 | Lau et al. |
| 6,060,777 A | 5/2000 | Jamieson et al. |
| 6,069,407 A | 5/2000 | Hamzehdoost |
| 6,077,724 A | 6/2000 | Chen |
| 6,084,297 A | 7/2000 | Brooks et al. |
| 6,084,777 A | 7/2000 | Kalidas et al. |
| 6,114,761 A | 9/2000 | Mertol et al. |
| 6,117,797 A | 9/2000 | Hembree |
| 6,122,171 A | 9/2000 | Akram et al. |
| 6,133,064 A | 10/2000 | Nagarajan et al. |
| 6,140,707 A | 10/2000 | Plepys et al. |
| 6,145,365 A | 11/2000 | Miyahara |
| 6,160,705 A | 12/2000 | Stearns et al. |
| 6,162,659 A | 12/2000 | Wu |
| 6,163,458 A | 12/2000 | Li |
| 6,166,434 A | 12/2000 | Desai et al. |
| 6,184,580 B1 | 2/2001 | Lin |
| 6,194,778 B1 * | 2/2001 | Ohsawa et al. ............. 257/668 |
| 6,201,300 B1 | 3/2001 | Tseng et al. |
| 6,207,467 B1 | 3/2001 | Vaiyapuri et al. |
| 6,212,070 B1 | 4/2001 | Atwood et al. |
| 6,242,279 B1 | 6/2001 | Ho et al. |
| 6,246,111 B1 | 6/2001 | Huang et al. |
| 6,278,613 B1 | 8/2001 | Fernandez et al. |
| 6,288,444 B1 | 9/2001 | Abe et al. |
| 6,313,521 B1 | 11/2001 | Baba |
| 6,313,525 B1 | 11/2001 | Sasano |
| 6,347,037 B2 | 2/2002 | Iijima et al. |
| 6,362,525 B1 | 3/2002 | Rahim |
| 6,365,980 B1 | 4/2002 | Carter et al. |
| 6,369,455 B1 | 4/2002 | Ho et al. |
| 6,380,620 B1 * | 4/2002 | Suminoe et al. ............. 257/706 |
| 6,380,623 B1 | 4/2002 | Demore |
| 6,442,043 B1 * | 8/2002 | Seki et al. ................... 361/761 |
| 6,462,274 B1 | 10/2002 | Shim et al. |
| 6,472,741 B1 | 10/2002 | Chen et al. |
| 6,515,361 B2 | 2/2003 | Lee et al. |
| 6,525,942 B2 | 2/2003 | Huang et al. |
| 6,528,869 B1 | 3/2003 | Glenn et al. |
| 6,528,892 B2 | 3/2003 | Caletka et al. |
| 6,537,848 B2 | 3/2003 | Camenforte et al. |
| 6,541,832 B2 | 4/2003 | Coyle |
| 6,545,351 B1 | 4/2003 | Jamieson et al. |
| 6,551,918 B2 | 4/2003 | Yuzawa et al. |
| 6,552,266 B2 | 4/2003 | Carden et al. |
| 6,552,428 B1 | 4/2003 | Huang et al. |
| 6,552,430 B1 | 4/2003 | Perez et al. |
| 6,559,525 B2 | 5/2003 | Huang |
| 6,563,712 B2 | 5/2003 | Akram et al. |
| 6,583,516 B2 | 6/2003 | Hashimoto |
| 6,602,732 B2 | 8/2003 | Chen |
| 6,614,660 B1 | 9/2003 | Bai et al. |
| 6,617,193 B1 | 9/2003 | Toshio et al. |
| 6,624,523 B2 | 9/2003 | Chao et al. |
| 6,657,870 B1 | 12/2003 | Ali et al. |
| 6,664,617 B2 | 12/2003 | Siu |
| 6,724,071 B2 | 4/2004 | Combs |
| 6,724,080 B1 | 4/2004 | Ooi et al. |
| 6,825,108 B2 | 11/2004 | Khan et al. |
| 6,853,070 B2 | 2/2005 | Khan et al. |
| 6,861,750 B2 | 3/2005 | Zhao et al. |
| 6,876,553 B2 | 4/2005 | Zhao et al. |
| 6,879,039 B2 | 4/2005 | Khan et al. |
| 6,882,042 B2 | 4/2005 | Zhao et al. |
| 6,906,414 B2 | 6/2005 | Zhao et al. |
| 6,989,593 B2 | 1/2006 | Khan et al. |
| 7,005,737 B2 | 2/2006 | Zhao et al. |
| 7,038,312 B2 | 5/2006 | Khan et al. |
| 7,102,225 B2 | 9/2006 | Khan et al. |
| 7,132,744 B2 | 11/2006 | Zhao et al. |
| 7,161,239 B2 | 1/2007 | Zhao et al. |

| | | | |
|---|---|---|---|
| 7,202,559 B2 | 4/2007 | Zhao et al. | |
| 7,227,256 B2 | 6/2007 | Zhao et al. | |
| 7,245,500 B2 | 7/2007 | Khan et al. | |
| 7,259,448 B2 | 8/2007 | Zhang et al. | |
| 2001/0001505 A1 | 5/2001 | Schueller et al. | |
| 2001/0040279 A1 | 11/2001 | Mess et al. | |
| 2001/0045644 A1 | 11/2001 | Huang | |
| 2002/0053731 A1 | 5/2002 | Chao et al. | |
| 2002/0072214 A1 | 6/2002 | Yuzawa et al. | |
| 2002/0079562 A1 | 6/2002 | Zhao et al. | |
| 2002/0079572 A1 | 6/2002 | Khan et al. | |
| 2002/0096750 A1 | 7/2002 | Suzuki | |
| 2002/0096767 A1 | 7/2002 | Cote et al. | |
| 2002/0098617 A1 | 7/2002 | Lee et al. | |
| 2002/0171144 A1 | 11/2002 | Zhang et al. | |
| 2002/0180040 A1 | 12/2002 | Camenforte et al. | |
| 2002/0185717 A1 | 12/2002 | Eghan et al. | |
| 2002/0185734 A1 | 12/2002 | Zhao et al. | |
| 2002/0185750 A1 | 12/2002 | Khan et al. | |
| 2002/0190361 A1 | 12/2002 | Zhao et al. | |
| 2003/0138613 A1 | 7/2003 | Thoman et al. | |
| 2003/0146503 A1 | 8/2003 | Khan et al. | |
| 2003/0146509 A1 | 8/2003 | Zhao et al. | |
| 2003/0179549 A1 | 9/2003 | Zhong et al. | |
| 2004/0072456 A1 | 4/2004 | Dozier, II et al. | |
| 2005/0029657 A1 | 2/2005 | Khan et al. | |
| 2005/0280127 A1 | 12/2005 | Zhao et al. | |
| 2006/0065972 A1 | 3/2006 | Khan et al. | |
| 2007/0007644 A1 | 1/2007 | Zhao et al. | |
| 2007/0045824 A1 | 3/2007 | Zhao et al. | |

FOREIGN PATENT DOCUMENTS

| | | | |
|---|---|---|---|
| DE | 100 56 281 A | | 5/2002 |
| EP | 0 573 297 A2 | | 12/1993 |
| EP | 0 504 411 B1 | | 6/1998 |
| FR | 2 803 098 A3 | | 6/2001 |
| JP | 61-49446 | | 3/1986 |
| JP | 7-283336 | | 10/1995 |
| JP | 10-50877 | | 2/1998 |
| JP | 10-189835 | | 7/1998 |
| JP | 10-247702 | | 9/1998 |
| JP | 10-247703 | | 9/1998 |
| JP | 11-17064 | | 1/1999 |
| JP | 11-102989 | | 4/1999 |
| JP | 2000-286294 | | 10/2000 |
| JP | 2001-68512 | | 3/2001 |
| TW | 383908 | | 3/2000 |
| TW | 417219 | | 1/2001 |

OTHER PUBLICATIONS

Ahn, S.H. and Kwon, Y.S., "Popcorn Phenomena in a Ball Grid Array Package", IEEE Transactions on Components, Packaging, and Manufacturing Technology Part B: Advanced Packaging, IEEE, Aug. 1995, vol. 18, No. 3, pp. 491-496.

Amkor Electronics, "Amkor BGA Packaging: Taking the World by Storm", Electronic Packaging & Production, Cahners Publishing Company, May 1994, page unknown.

Anderson, L. and Trabucco, B., "Solder Attachment Analysis of Plastic BGA Modules", Surface Mount International Conference, Surface Mount International, Aug. 28-Sep. 1, 1994, San Jose, California, pp. 189-194.

Andrews, M., "Trends in Ball Grid Array Technology," Ball Grid Array National Symposium, Mar. 29-30, 1995, Dallas, Texas, 10 pages.

Attarwala, A.I. Dr. and Stierman, R., "Failure Mode Analysis of a 540 Pin Plastic Ball Grid Array", Surface Mount International Conference, Surface Mount International, Aug. 28-Sep. 1, 1994, San Jose, California, pp. 252-257.

Banerji, K., Development of the Slightly Larger Than IC Carrier (SLICC), Journal of Surface Mount Technology, Jul. 1994, pp. 21-26.

Bauer, C., Ph.D., "Partitioning and Die Selection Strategies for Cost Effective MCM Designs", Journal of Surface Mount Technology, Oct. 1994, pp. 4-9.

Bernier, W.E. et al., "BGA vs. QFP: A Summary of Tradeoffs for Selection of High I/O Components", Surface Mount International Conference Proceedings, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages", IEEE Transactions on Components, Packaging, and Manufacturing Technology Part A, IEEE, Dec. 1995, vol. 18, No. 4, pp. 732-738.

Chadima, M., "Interconnecting Structure Manufacturing Technology," Ball Grid Array National Symposium, Dallas, Texas, Mar. 29-30, 1995.

Chanchani, R. et al., "Mini BGA: Pad and Pitch Ease Die Test and Handling", Advanced Packaging, IHS Publishing Group, May/Jun. 1995, pp. 34, 36-37.

Chung, T.C. et al., "Rework of Plastic, Ceramic, and Tape Ball Grid Array Assemblies", Ball Grid Array National Symposium Proceedings, Dallas, Texas, Mar. 29-30, 1995, pp. 1-15.

Cole, M.S. and Caulfield, T. "A Review of Available Ball Grid Array (BGA) Packages", Journal of Surface Mount Technology, Surface Mount Technology Association, Jan. 1996, vol. 9, pp. 4-11.

Cole, M.S. and Caulfield, T., "Ball Grid Array Packaging", Surface Mount International Conference Proceedings, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", Advanced Packaging, IHS Publishing Group, Sep./Oct. 1994, vol. 3, No. 5, pp. 28, 30 and 32.

Dody, G. and Burnette, T., "BGA Assembly Process and Rework", Journal of Surface Mount Technology, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP, LOC and BGA Packages", 45th Electronic Components & Technology Conference, IEEE, May 21-24, 1995, Las Vegas, NV, pp. 285-292.

Ejim, T.L. et al., "Designed Experiment to Determine Attachment Reliability Drivers for PBGA Packages", Journal of Surface Mount Technology, Surface Mount Technology Association, Jan. 1996, vol. 9, pp. 30-38.

Ewanich, J. et al., "Development of a Tab (TCP) Ball Grid Array Package", Proceedings of the 1995 International Electronics Packaging Conference, San Diego, CA, Sep. 24-27, 1995, pp. 588-594.

Fauser, S. et al, "High Pin-Count PBGA Assembly", Circuits Assembly, Feb. 1995, vol. 6, No. 2, pp. 36-38 and 40.

Fauser, Suzanne et al., "High Pin Count PBGA Assembly: Solder Defect Failure Modes and Root Cause Analysis", Surface Mount International, Proceedings of the Technical Program, Surface Mount International, Aug. 28-Sep. 1, 1994, San Jose, California, pp. 169-174.

Ferguson, M. "Ensuring High-Yield BGA Assembly", Circuits Assembly, Feb. 1995, vol. 6, No. 2, pp. 54, 56 and 58.

Freda, M., "Laminate Technology for IC Packaging", Electronic Packaging & Production, Cahners Publishing Company, Oct. 1995, vol. 35, No. 11, pp. S4-S5.

Freedman, M., "Package Size and Pin-Out Standardization", Ball Grid Array National Symposium, Mar. 29-30, 1995, 7 pages.

Freyman, B. and Pennisi, R., "Over-molded Plastic Pad Arrary Carriers (OMPAC): A Low Cost, High Interconnect Density IC Packaging Solution for Consumer and Industrial Electronics", 41st Electronic Components & Technology Conference, IEEE, May 11-16, 1991, pp. 176-182.

Freyman, B. et al., "Surface Mount Process Technology for Ball Grid Array Packaging", Surface Mount International Conference Proceedings, Surface Mount International, Aug. 29-Sep. 2, 1993, San Jose, California, pp. 81-85.

Freyman, B. et al., "The Move to Perimeter Plastic BGAs", Surface Mount International Conference Proceedings, San Jose, CA, Aug. 29-31, 1995, pp. 373-382.

Freyman, B., "Trends in Plastic BGA Packaging," Ball Grid Array National Symposium, Dallas, Texas, Mar. 29-30, 1995, 45 pages.

Gilleo, K., "Electronic Polymers: Die Attach and Oriented Z-Axis Films", Advanced Packaging, IHS Publishing Group, Sep./Oct. 1994, vol. 3, No. 5, pp. 37-38, 40 and 42.

Guenin, B. et al., "Analysis of a Thermally Enhanced Ball Grid Array Package", IEEE Transactions on Components, Packaging, and Manufacturing Technology, Part A, IEEE Components, Packaging, and Manufacturing Technology Society, Dec. 1995, vol. 18, No. 4, pp. 749-757.

Hart, C., "Vias in Pads for Coarse and Fine Pitch Ball Grid Arrays", Surface Mount International Conference Proceedings, Surface Mount International, Aug. 28-Sep. 1, 1994, San Jose, California, pp. 203-207.

Hart, C. "Vias in Pads", Circuits Assembly, Feb. 1995, vol. 6, No. 2, pp. 42, 44-46 and 50.

Hattas, D., "BGAs Face Production Testing: New Package Offers Promise but Must Clear Technology Hurdles.", Advanced Packaging, IHS Publishing Group, Summer 1993, vol. 2, No. 3, pp. 44-46.

Schueller, R.D. et al., "Performance and Reliability of a Cavity Down Tape BGA Package," IEEE Electronic Packaging Technology Conference, 1997, pp. 151-162.

Hodson, T., "Study Examines BGA Use", Electronic Packaging & Production, Mar. 1993, page unknown.

Holden, H., "The Many Techniques of Small Via Formation for Thin Boards", The Institute for Interconnecting and Packaging Electronic Circuits Ball Grid Array National Symposium, San Diego, CA, Jan. 18-19, 1996, pp. 1-7.

Houghten, J., "New Package Takes on QFPs", Advanced Packaging, IHS Publishing Group, Winter 1993, vol. 2, No. 1, pp. 38-39.

"How to Give Your BGAs a Better Bottom Line.", Advanced Packaging, IHS Publishing Group, Jan./Feb. 1995, page unknown.

Huang, W. and Ricks, J.,"Electrical Characterization of PBGA for Communication Applications by Simulation and Measurement", National Electronic Packaging and Production Conference West '95, Feb. 26-Mar. 2, 1995, Anaheim, California, pp. 300-307.

Hundt, M. et al., "Thermal Enhancements of Ball Grid Arrays", National Electronic Packaging and Production Conference West '95, Reed Exhibition Companies, Anaheim, CA, Feb. 25-29, 1996, pp. 702-711.

Hutchins, C.L., "Understanding Grid Array Packages", Surface Mount Technology Magazine, IHS Publishing Group, Nov. 1994, vol. 8, No. 11, pp. 12-13.

Hwang, J.S., "Reliability of BGS Solder Interconnections", Surface Mount Technology Magazine, IHS Publishing Group, Sep. 1994, vol. 8, No. 9, pp. 14-15.

Hwang, J.S., "A Hybrid of QFP and BGA Architectures", Surface Mount Technology Magazine, IHS Publishing Group, Feb. 1995, vol. 9, No. 2, p. 18.

Johnson, R. et al., "A Feasibility Study of of Ball Grid Array Packaging", National Electronic Packaging and Production Conference East '93, Boston, Massachusetts, Jun. 14-17, 1993, pp. 413-422.

Johnson, R. et al., "Thermal Characterization of 140 and 225 Pin Ball Grid Array Packages", National Electronic Packaging & Production Conference East '93, Boston, Massachusetts, Jun. 14-17, 1993, pp. 423-430.

Johnston, P., "Land Pattern Interconnectivity Schemes", Ball Grid Array National Symposium, Dallas, Texas, Mar. 29-30, 1995, pp. 2-21.

Johnston, P. "Printed Circuit Board Design Guidelines for Ball Grid Array Packages", Journal of Surface Mount Technology, Surface Mount Technology Association, Jan. 1996, vol. 9, pp. 12-18.

Kawahara, T. et al., "Ball Grid Array Type Package by Using of New Encapsulation Method", Proceedings of the 1995 International Electronics Packaging Conference, San Diego, CA, Sep. 24-27, 1995, pp. 577-587.

Knickerbocker, J.U. and Cole, M.S., "Ceramic BGA: A Packaging Alternative", Advanced Packaging, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", National Electronic Packaging and Production Conference West '95, IEEE, Feb. 26-Mar. 2, 1995, Anaheim, California, pp. 1523-1529.

Kunkle, R., "Discrete Wiring for Array Packages", Ball Grid Array National Symposium, Dallas, Texas, Mar. 29-30, 1995, 9 pages.

Lall, B. et al, "Methodology for Thermal Evaluation of Multichip Modules", IEEE Transactions on Components, Packaging, and Manufacturing Technology Part A, IEEE, Dec. 1995, vol. 18, No. 4, pp. 758-764.

Lasance, C. et al., "Thermal Characterization of Electronic Devices with Boundary Condition Independent Compact Models", IEEE Transactions on Components, Packaging, and Manufacturing Technology Part A, IEEE Components, Packaging, and Manufacturing Technology Society, Dec. 1995, vol. 18, No. 4, pp. 723-731.

Lau, J., "Ball Grid Array Technology", McGraw-Hill Inc., 1995, entire book submitted.

Lau, J. et al., "No Clean Mass Reflow of Large Plastic Ball Grid Array Packages", Circuit World, Wela Publications Ltd., vol. 20, No. 3, Mar. 1994, pp. 15-22.

"Literature Review", Special Supplement to Electronic Packaging & Production, Feb. 1995, Cahners Publication, 10 pages.

LSI Logic Package Selector Guide, Second Edition, LSI Logic Corporation, 1994-1995, entire document submitted.

"LTCC MCMs Lead to Ceramic BGAs," Advanced Packaging, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", Journal of Surface Mount Technology, Surface Mount International, Oct. 1994, pp. 33-41.

Marrs, R.C. and Olachea, G., "BGAs for MCMs: Changing Markets and Product Functionality", Advanced Packaging, IHS Publishing Group, Sep./Oct. 1994, vol. 3, No. 5, pp. 48, 50, and 52.

Matthew, L.C. et al., "Area Array Packaging: KGD in a Chip-Sized Package", Advanced Packaging, IHS Publishing Group, Jul./Aug. 1994, pp. 91-94.

Mawer, A. et al., "Plastic BGA Solder Joint Reliability Considerations", Surface Mount International Conference Proceedings, Surface Mount International, Aug. 28-Sep. 1, 1994, San Jose, California, pp. 239-251.

Mazzullo, T. and Schaertl, L., "How IC Packages Affect PCB Design", Surface Mount Technology Magazine, Feb. 1995, vol. 9, No. 2, pp. 114-116.

Mearig, J., "An Overview of Manufacturing BGA Technology", National Electronic Packaging and Production Conference West '95, Feb. 26-Mar. 2, 1995, Anaheim, California, pp. 295-299.

Mertol, A., "Application of the Taguchi Method on the Robust Design of Molded 225 Plastic Ball Grid Array Packages", IEEE Transactions on Components, Packaging, and Manufacturing Technology Part B: Advanced Packaging, IEEE, Nov. 1995, vol. 18, No. 4, pp. 734-743.

Mescher, P. And Phelan, G., "A Practical Comparison of Surface Mount Assembly for Ball Grid Array Components", Surface Mount International Conference Proceedings, Surface Mount International, Aug. 28-Sep. 1, 1994, San Jose, California, pp. 164-168.

Mulgaonker, S. et al., "An Assessment of the Thermal Performance of the PBGA Family", Eleventh Annual IEEE Semiconductor Thermal Measurement and Management Symposium, IEEE, San Jose, CA, Feb. 7-9, 1995,pp. 17-27.

"New PBGA Pushes Technology to Outer Limits", Advanced Packaging, IHS Publishing Group, Jan./Feb. 1995, p. 11.

Olachea, G., "Managing Heat: A Focus on Power IC Packaging", Electronic Packaging & Production (Special Supplement), Cahners Publishing Company, Nov. 1994, pp. 26-28.

"Pad Array Improves Density", Electronic Packaging & Production, Cahners Publishing Company, May 1992, pp. 25-26.

Partridge, J. and Viswanadham, P., "Organic Carrier Requirements for Flip Chip Assemblies", Journal of Surface Mount Technology, Surface Mount Technology Association, Jul. 1994, pp. 15-20.

Ramirez, C. and Fauser, S., "Fatigue Life Comparison of the Perimeter and Full Plastic Ball Grid Array", Surface Mount International Conference Proceedings, Surface Mount International, Aug. 28-Sep. 1, 1994, San Jose, California, pp. 258-266.

Rogren, P., "MCM-L Built on Ball Grid Array Formats", National Electronic Packaging and Production Conference West '94, Anaheim, California, pp. 1277-1282.

Rooks, S., "X-Ray Inspection of Flip Chip Attach Using Digital Tomosynthesis", Surface Mount International, Proceedings of the Technical Program, Aug. 28-Sep. 1, 1994, San Jose, California, pp. 195-202.

Rukavina, J., "Attachment Methodologies: Ball Grid Array Technology", Ball Grid Array National Symposium, Dallas, Texas, Mar. 29-30, 1995, 37 pages.

Sack, T., "Inspection Technology", Ball Grid Array National Symposium, Dallas, Texas, Mar. 29-30, 1995, pp. 1-41.

Sakaguchi, H., "BGA MountingTechnology," pp. 1-4, date and source unknown.

Schmolze, C. and Fraser, A., "SPICE Modeling Helps Enhance BGA Performance", Electronic Packaging & Production, Jan. 1995, pp. 50-52.

Semiconductor Group Package Outlines Reference Guide, Texas Instruments, 1995, entire document submitted.

Shimizu, J., "Plastic Ball Grid Array Coplanrity", Surface Mount International Conference, San Jose, California, Aug. 31-Sep. 2, 1993, pp. 86-91.

Sigliano, R., "Using BGA Packages: An Appealing Technology in a QFP and Fine-Pitch Market", Advanced Packaging, IHS Publishing Group, Mar./Apr. 1994, pp. 36-39.

Sirois, L., "Dispensing for BGA: Automated Liquid Dispensing in a High-Density Environment", Advanced Packaging, IHS Publishing Group, May/Jun. 1995, pp. 38 and 41.

Solberg, V., "Interconnection Structure Preparation: Impact of Material Handling and PCB Surface Finish on SMT Assembly Process Yield", Ball Grid Array National Symposium, Dallas Texas, Mar. 29-30, 1995, 10 pages.

"Survival of the Fittest", Advanced Packaging, IHS Publishing Group, Mar./Apr. 1995, page unknown.

Tuck, J., "BGA Technology Branches Out", Circuits Assembly, Feb. 1995, vol. 6, No. 2, pp. 24, 26, and 28.

"Tutorial and Short Courses", 45th Electronic Components & Technology Conference, May 21-24, 1995, Las Vegas, Nevada, IEEE, 6 pages.

Vardaman, E. J. and Crowley, R.T., "Worldwide Trends in Ball Grid Array Developments", National Electronic Packaging and Production Conference West '96, Reed Exhibition Companies, Anaheim, CA, Feb. 25-29, 1996, pp. 699-701.

Walshak, D. and Hashemi, H., "Thermal Modeling of a Multichip BGA Package", National Electronic Packaging and Production Conference West '94, Reed Exhibition Companies, Anaheim, California, Feb. 27-Mar. 4, 1994, pp. 1266-1276.

Walshak, D. and Hashemi, H., "BGA Technology: Current and Future Direction for Plastic, Ceramic and Tape BGAs", Surface Mount International Conference Proceedings, Surface Mount International, Aug. 28-Sep. 1, 1994, San Jose, California, pp. 157-163.

Xie, H. et al., "Thermal Solutions to Pentium Processors in TCP in Notebooks and Sub-Notebooks", 45th Electronic Components & Technology Conference, IEEE, Las Vegas, NV, May 21-24, 1995, pp. 201-210.

Yip, W.Y., "Package Characterization of a 313 Pin BGA", National Electronic Packaging and Production Conference West '95, Reed Exhibition Companies, Feb. 26-Mar. 2, 1995, Anaheim, California, pp. 1530-1541.

Zamborsky, E., "BGAs in the Assembly Process", Circuits Assembly, Feb. 1995, vol. 6, No. 2, pp. 60, 62-64.

Zimerman, M., "High Performance BGA Molded Packages for MCM Application", Surface Mount International Conference Proceedings, Surface Mount International, Aug. 28-Sep. 1, 1994, San Jose, California, pp. 175-180.

Zweig, G., "BGAs: Inspect the Process, Not the Product", Electronic Packaging & Production (Special Supplement), Cahners Publishing Company, Aug. 1994 (Supplement), p. 41.

Houghten, J.L., "Plastic Ball-Grid Arrays Continue to Evolve", Electronic Design, Feb. 6, 1995, pp. 141-146.

Marrs, R. et al., "Recent Technology Breakthroughs Achieved with the New SuperBGA® Package", 1995 International Electronics Packaging Conference, San Diego, California, Sep. 24-27, 1995, pp. 565-576.

Hayden, T.F. et al., "Thermal & Electrical Performance and Reliability Results for Cavity-Up Enhanced BGAs", Electronic Components and Technology Conference, IEEE,1999, pp. 638-644.

Thompson, T., "Reliability Assessment of a Thin (Flex) BGA Using a Polyimide Tape Substrate", International Electronics Manufacturing Technology Symposium, IEEE, 1999, pp. 207-213.

English-language Abstract of JP 10-189835, published Jul. 21, 1998, 2 pages (last visited Mar. 14, 2003).

English-language Abstract of JP 10-247703, published Sep. 14, 1998, 1 page.

English-language Abstract of JP 2000-286294, published Oct. 13, 2000, 2 pages (last visited Mar. 14, 2003).

English-language Abstract of JP 2001-68512, published Mar. 16, 2001, 1 page (last visited Oct. 2, 2002).

English-language Abstract of JP 10-247702, published Sep. 14, 1998, 2 pages (last visited Jan. 25, 2002).

English-language Abstract of JP 10-50877, published Feb. 20, 1998, 1 page (last visited Oct. 2, 2002).

English-language Abstract of JP 11-17064, published Jan. 22, 1999, 1 page.

English-language Abstract of JP 11-102989, published Apr. 13, 1999, 1 page.

English-language Abstract of JP 7-283336, published Oct. 27, 1995, 1 page.

English-language Abstract of JP 61-49446, published Mar. 11, 1986, 1 page.

Karnezos, M. , "An EPBGA Alternative," Advanced Packaging, Jun. 1998, pp. 90, 92, 94, and 96.

Zhao, Z., Ph.D., "Thermal Design and Modeling of Packages," IEEE Short Courses, Broadcom Corporation, Oct. 25, 2000, 95 pages.

Zhao, Z., Ph.D., "IC Package Thermal Issues and Thermal Design," ASAT, Inc., Jan. 15, 2000, 98 pages, presented at $2^{nd}$ International Icepak User's Group Meeting, Palo Alto, CA, on Feb. 7, 2000.

Heitmann, R., "A Direct Attach Evolution: TAB, COB and Flip Chip Assembly Challenges", Advanced Packaging, IHS Publishing Group, Jul./Aug. 1994, vol. 3, No. 4, pp. 95-99 and 103.

Written Primary Examination Decision of Rejection issued by the Taiwan Patent Office (with English translation attached) 5 pages.

Amkor package data sheet, "SuperFC.RTM.", from http://www.amkor.com/Products/all.sub.--datasheets/superfc.pdf, 2 pages (Jan. 2003).

Andros, F., "Tape Ball Grid Array," from Puttlitz, K.J. and Totta, P.A. (eds.), Area Array Interconnection Handbook, pp. 619-620, ISBN No. 0-7923-7919-5, Kluwer Academic Publishers (2001).

Brofman, P.J. et al., "Flip-Chip Die Attach Technology," Puttlitz, K.J. and Totta, P.A. (eds.), Area Array Interconnection Handbook, pp. 315-349, ISBN No. 0-7923-7919-5, Kluwer Academic Publishers (2001).

European Search Report for European Appl. No. 03001959.0, dated Feb. 28, 2006, 2 pages.

English Abstract for French Patent Publication No. FR2803098, 1 page, from http://v3.espacenet.com.

Ghosal, B. et al., "Ceramic and Plastic Pin Grid Array Technology," Puttlitz, K.J. and Totta, P.A. (eds.), Area Array Interconnection Handbook, pp. 551-576, ISBN No. 0-7923-7919-5, Kluwer Academic Publishers (2001).

Harper, C.A. (ed.), Electronic Packaging and Interconnection Handbook, Third Edition, pp. 7.58-7.59, ISBN No. 0-07-134745-3, McGraw-Hill Companies (2000).

International Search Report for Appln. No. PCT/US01/44952, issued Jan. 22, 2003.

International Search Report issued Jul. 25, 2002 for Appln. No. PCT/US01/44955, 4 pages.

Lin, S. and Chang, N., "Challenges in Power-Ground Integrity," Proceedings of the 2001 International Conference on Computer-Aided Design, pp. 651-654 (Nov. 4-8, 2001).

Lloyd, J. and Overhauser, D., "Electromigration wreaks havoc on IC design," EDN, pp. 145-148 (Mar. 26, 1998).

Song, W.S. and Glasser, L.A., "Power Distribution Techniques for VLSI Circuits," IEEE Journal of Solid-State Circuits, vol. SC-21, No. 1, pp. 150-156 (Feb. 1986).

Tang, K.T. and Friedman, E.G., "Simultaneous Switching Noise in On-Chip CMOS Power Distribution Networks," IEEE Transactions on Very Large Scale Integration (VLSI) Systems, vol. 10, No. 4, pp. 487-493 (Aug. 2002).

* cited by examiner stiffener temperature distribution

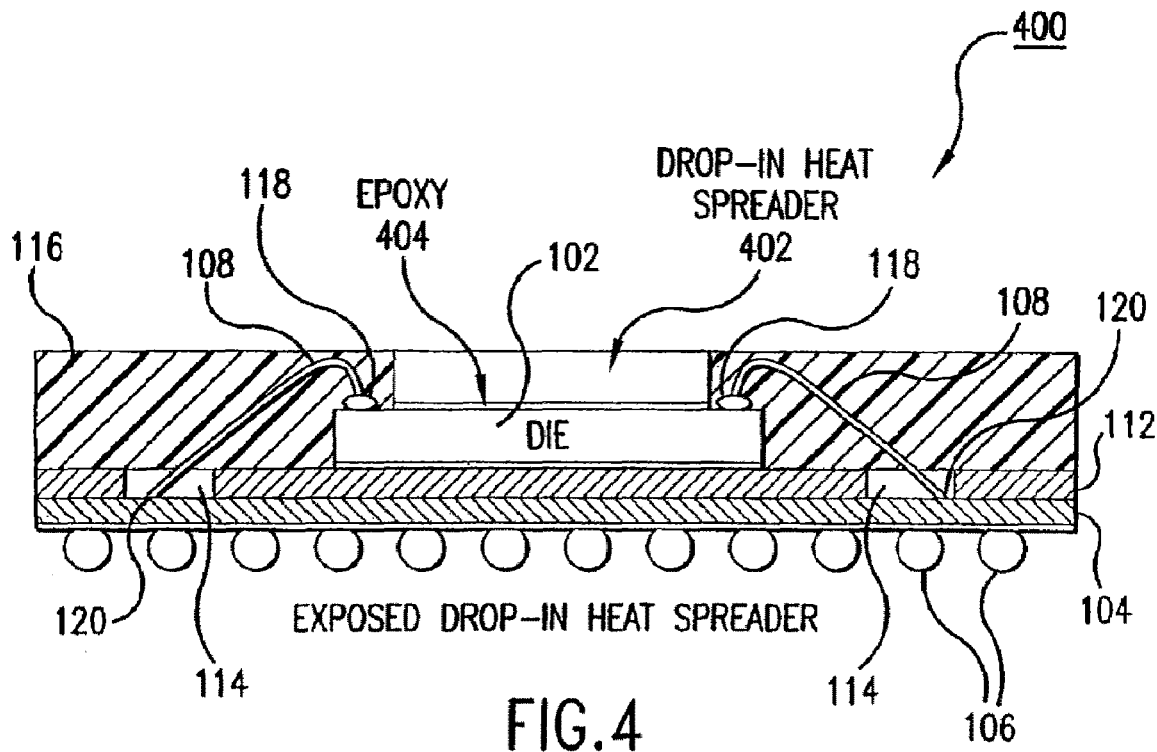
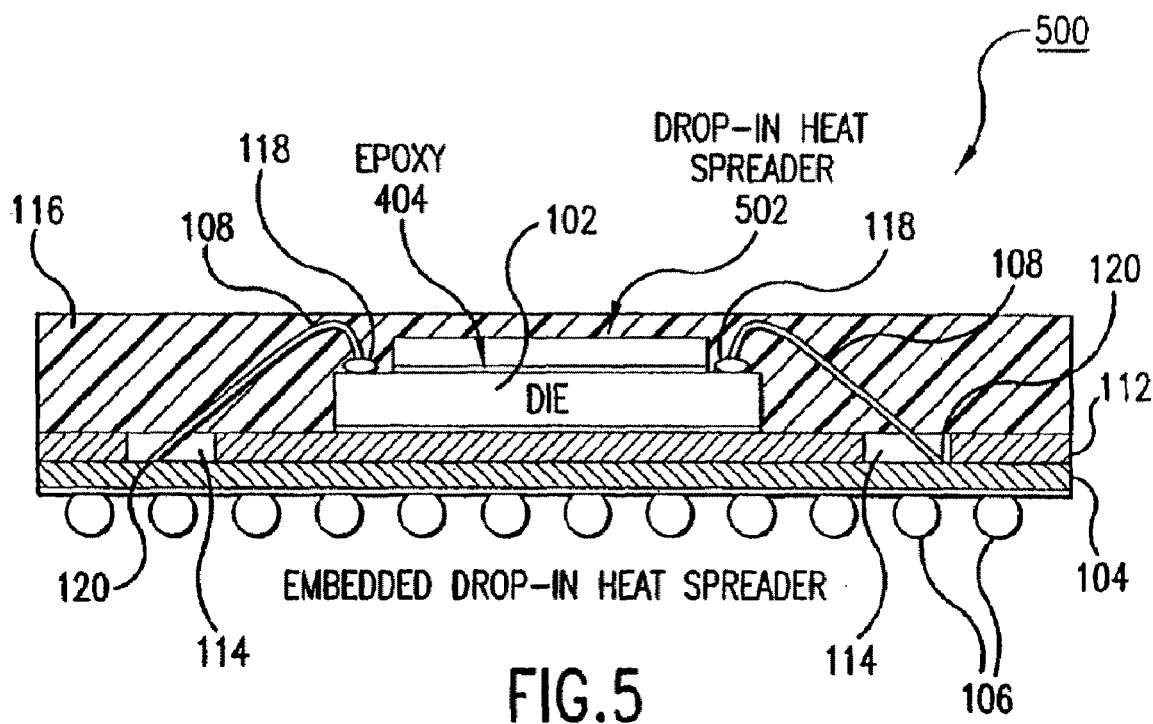

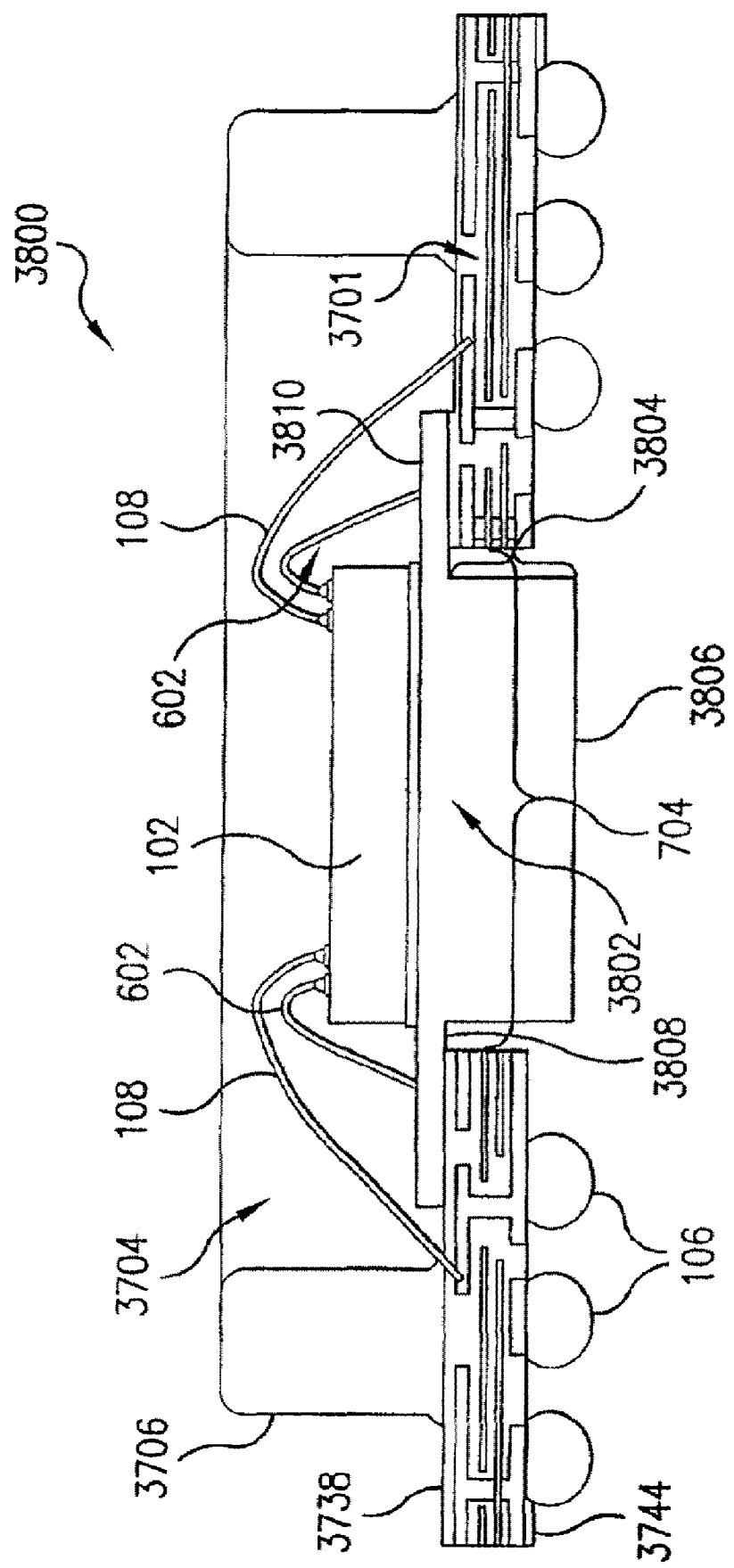

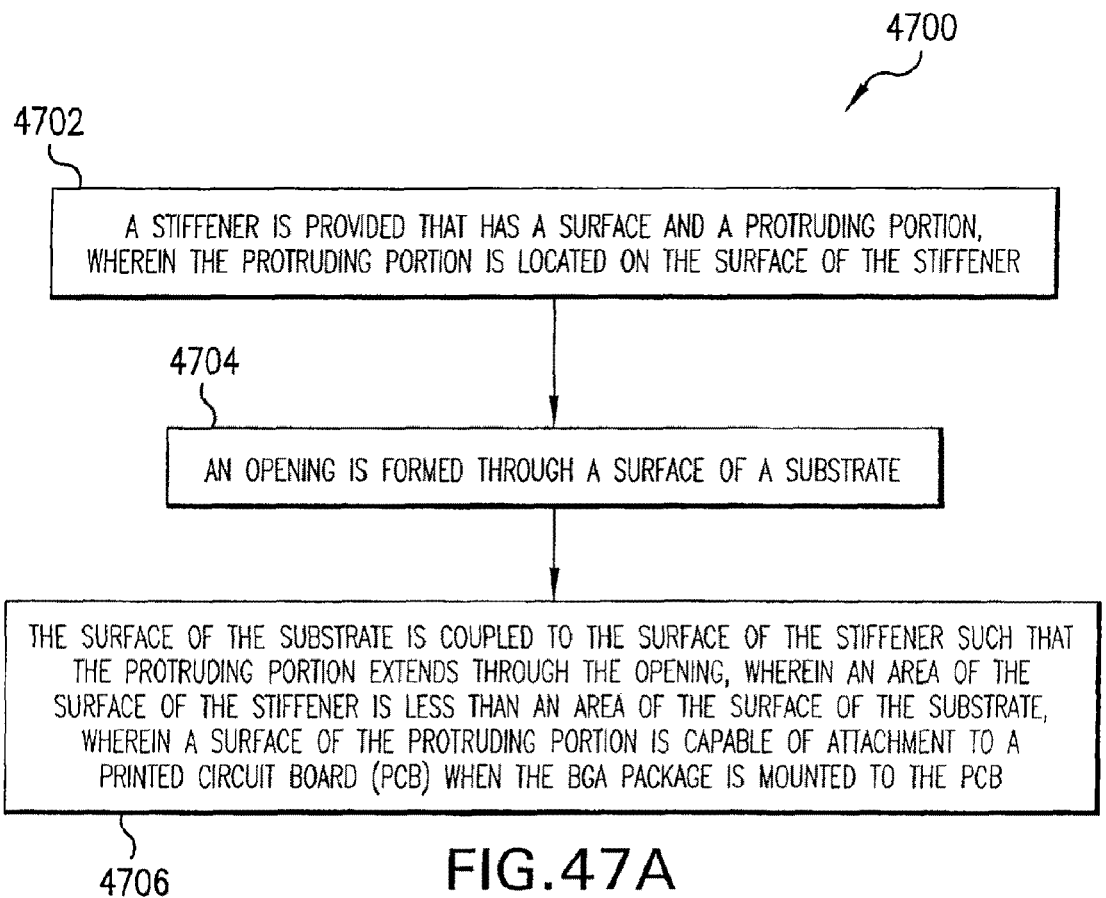

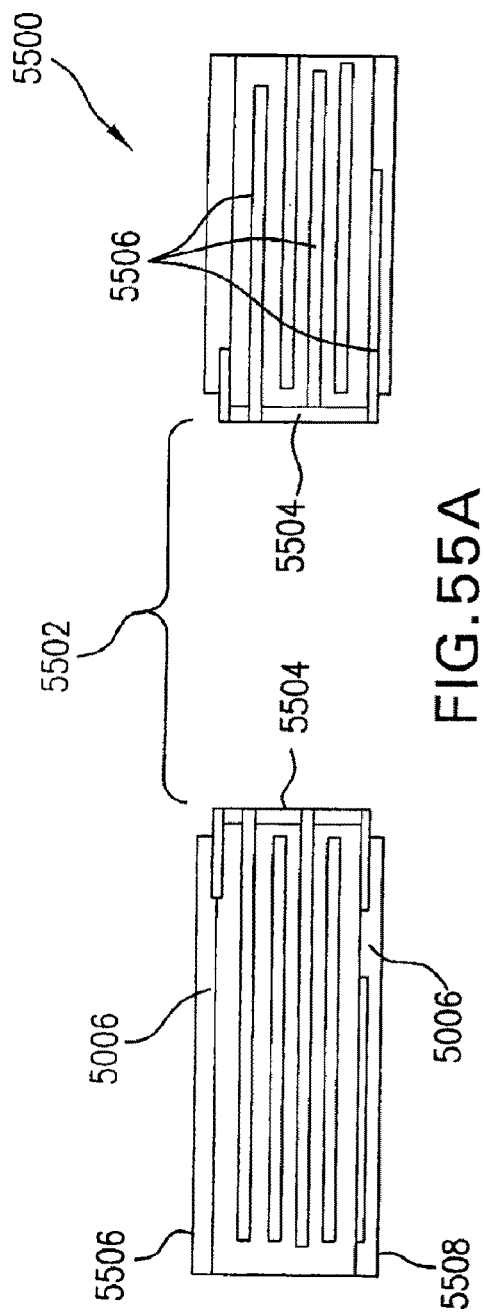
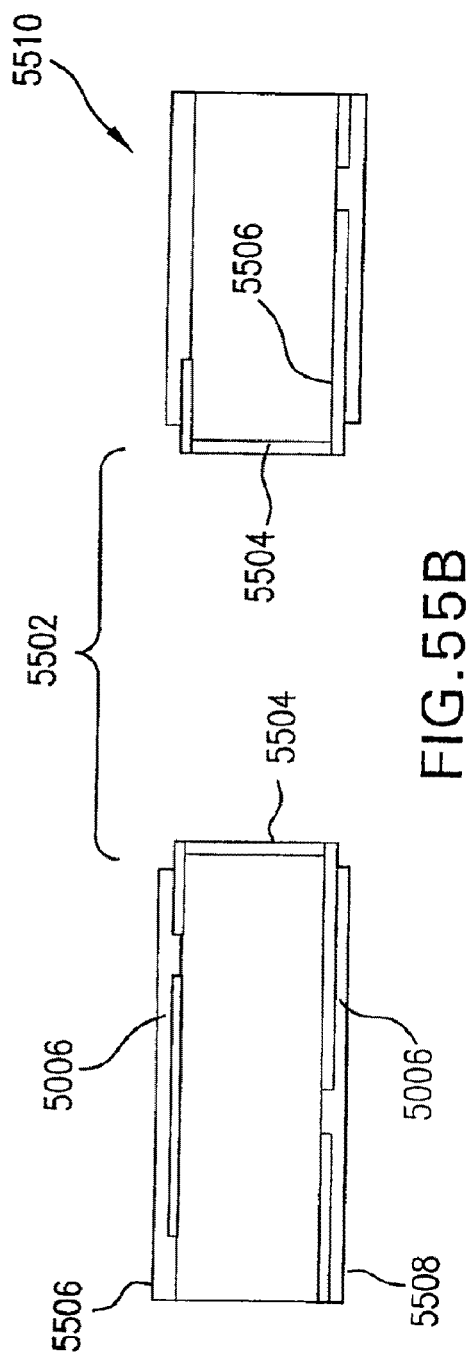

BALL GRID ARRAY PACKAGE ENHANCED WITH A THERMAL AND ELECTRICAL CONNECTOR

CROSS-REFERENCE TO RELATED APPLICATIONS

This application is a continuation of U.S. application Ser. No. 11/475,118, filed Jun. 27, 2006, now allowed, which is a divisional of U.S. application Ser. No. 10/284,312, filed Oct. 31, 2002, now U.S. Pat. No. 7,161,239, which claims the benefit of U.S. Provisional Application No. 60/352,877, filed Feb. 1, 2002. U.S. application Ser. No. 10/284,312 is a continuation-in-part of U.S. application Ser. No. 09/984,259, filed Oct. 29, 2001, now U.S. Pat. No. 7,132,744, which is a continuation-in-part of U.S. application Ser. No. 09/742,366, filed Dec. 22, 2000, now abandoned. All of the above-mentioned applications are incorporated herein by reference in their entireties.

The following applications of common assignee are related to the present application, and are herein incorporated by reference in their entireties:

"Ball Grid Array Package with Patterned Stiffener Layer," U.S. application Ser. No. 10/284,340, filed Oct. 31, 2002, now U.S. Pat. No. 6,906,414, issued Jun. 14, 2005;

"Ball Grid Array Package with Stepped Stiffener Layer," U.S. application Ser. No. 10/284,371, filed Oct. 31, 2002, now pending;

"Ball Grid Array Package Fabrication with IC Die Support Structures," U.S. application Ser. No. 10/284,349, filed Oct. 31, 2002, now U.S. Pat. No. 6,825,108, issued Nov. 30, 2004;

"Ball Grid Array Package with Multiple Interposers," U.S. application Ser. No. 10/284,166, field Oct. 31, 2002, now U.S. Pat. No. 6,861,750, issued Mar. 1, 2005; and "Ball Grid Array Package with Separated Stiffener Layer," U.S. application Ser. No. 10/284,366, filed Oct. 31, 2002, now pending.

BACKGROUND OF THE INVENTION

1. Field of the Invention

The invention relates generally to the field of integrated circuit (IC) device packaging technology and, more particularly, to substrate stiffening, heat spreading, and power delivery/current return techniques in ball grid array (BGA) packages.

2. Background Art

Integrated circuit (IC) dies are typically mounted in or on a package that facilitates attachment to a printed circuit board (PCB). One such type of IC package is a ball grid array (BGA) package. BGA packages provide for smaller footprints than many other package solutions available today. A BGA package has an array of solder balls located on a bottom external surface of a package substrate. The solder balls are reflowed to attach the package to the PCB. The IC die is mounted to a top surface of the package substrate. Wire bonds typically couple signals in the IC die to the substrate. The substrate has internal routing which electrically couples the IC die signals to the solder balls on the bottom substrate surface.

A number of BGA package substrate types exist, including ceramic, plastic, and tape (also known as "flex"). In some BGA package types, a stiffener may be attached to the substrate to supply planarity and rigidity to the package. In such packages, the IC die may be mounted to the stiffener instead of the substrate. Openings in the stiffener may be used to allow the IC die to be wire-bonded to the substrate.

Die-up and die-down BGA package configurations exist. In die-up BGA packages, the IC die is mounted on a top surface of the substrate or stiffener, opposite to the side to which the solder balls are attached. In die-down BGA packages, the IC die is mounted on a bottom surface of the substrate or stiffener, on the same side as which the solder balls are attached.

Existing BGA packages are subject to high thermal stresses that result from the heat given off during operation of the mounted IC die. The thermal stresses are primarily imposed on the IC die and solder balls due to the mismatch of the thermal expansion coefficient (CTE) between the semiconductor die and the metal stiffener. As a result, existing flex BGA packages have difficulty in meeting reliability requirements for die sizes larger than about 9 mm. See, e.g., Thompson, T., et al., *Reliability Assessment of a Thin (Flex) BGA Using a Polyimide Tape Substrate*, International Electronics Manufacturing Technology Symposium, IEEE, pp. 207-213 (1999).

The tape substrate used in flex BGA packages is typically polyimide, which has a low value of thermal conductivity. Consequently, the IC die is separated from the PCB internally by the tape substrate which acts as a thermal barrier. The lack of direct thermal connection from IC die to PCB leads to relatively high resistance to heat transfer from IC die-to-board (theta-jb).

A stiffener attached to a substrate can enhance heat spreading. However, the openings on the stiffener for wire bond connections tend to reduce the thermal connections between the IC die and the edges of the stiffener. As a result, heat spreading is limited largely to the region of the IC die attach pad, while areas at the stiffener periphery do not contribute effectively to heat spreading.

Furthermore, because of the high density of the substrate routing circuitry, it is difficult to bond each power and ground pad on the IC die to the substrate by a corresponding bond finger. As a result, the distribution of ground and power signals connecting to the IC die is frequently compromised in conventional BGA packages.

Ball grid array packages that use plastic substrates (for example, BT or FR4 plastic) are commonly known as plastic BGAs, or PBGAs. See, e.g., Lau, J. H., *Ball Grid Array Technology*, McGraw-Hill, New York, (1995). A PBGA package, for example, may add solder balls to the bottom substrate surface under the IC die to aid in conducting heat to the PCB. Solder balls such as these are referred to as thermal balls. The cost of the PBGA package, however, will increase with the number of thermal balls. Furthermore, a large array of thermal balls may be necessary for heat dissipation into the PCB for high levels of IC device power.

Hence, what is needed are BGA packages with improved heat spreading capabilities, while also providing for high levels of IC electrical performance.

BRIEF SUMMARY OF THE INVENTION

Ball grid array (BGA) packages having enhanced electrical and thermal characteristics are described herein. A BGA package includes a substrate that has a surface and a stiffener that has a surface and a protruding portion. The surface of the substrate has an opening therein. The protruding portion is located on the surface of the stiffener. The surface of the stiffener is coupled to the surface of the substrate. The protruding portion extends through the opening. An area of the surface of the stiffener is less than an area of the surface of the substrate. A surface of the protruding portion is capable of attachment to a printed circuit board (PCB) when the BGA package is mounted to the PCB.

Further aspects of the present invention, and further features and benefits thereof, are described below. The accompanying drawings, which are incorporated herein and form a part of the specification, illustrate the present invention and, together with the description, further serve to explain the principles of the invention and to enable a person skilled in the pertinent art to make and use the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 4 illustrates a cross-sectional view of a die-up flex BGA package with heat spreader, according to an embodiment of the present invention.

FIG. 5 show a cross-sectional view of an alternative BGA package, according to embodiments of the present invention, where the heat spreader is internal to the BGA package.

Figure 7:
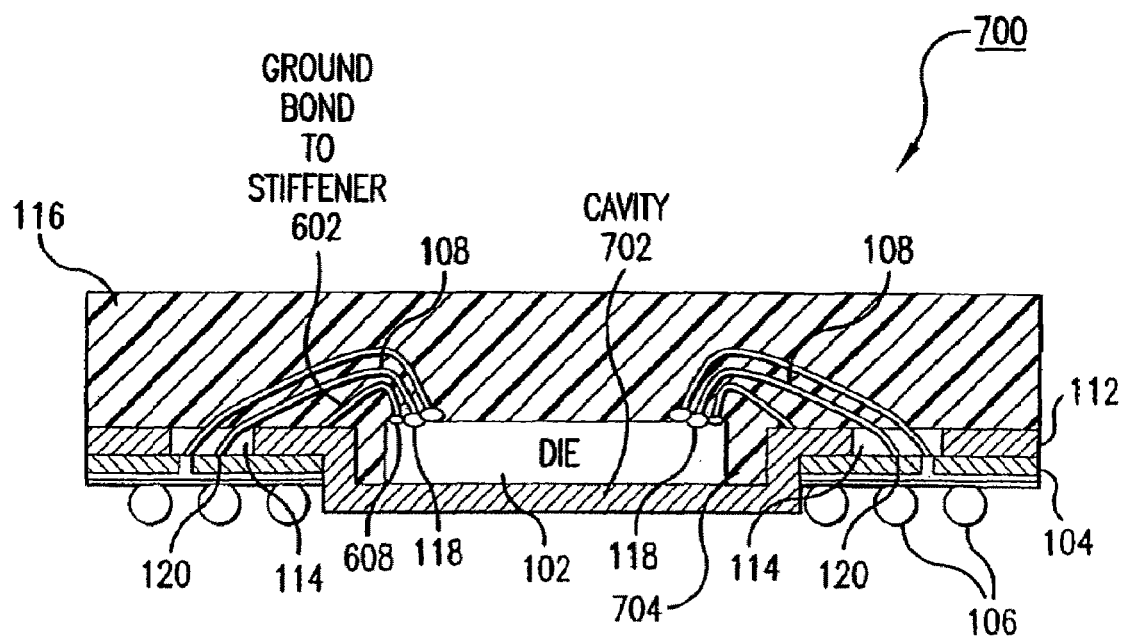
FIG. 7 illustrates a cross-sectional view of a die-up flex BGA package with patterned stiffener, according to an embodiment of the present invention.
Figure 8:
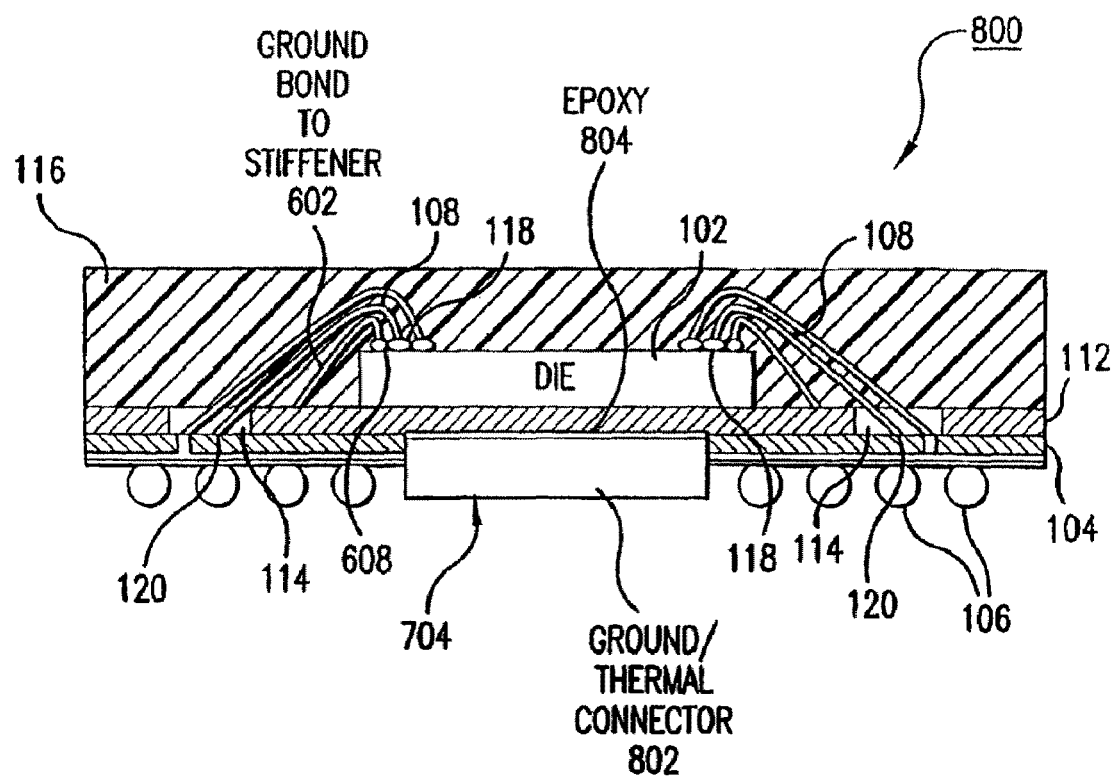
FIG. 8 illustrates a cross-sectional view of a die-up flex BGA package with ground/thermal connector, according to an embodiment of the present invention.

FIGS. 16A-D show flowcharts related to FIGS. 7 and 8 that provide operational steps of exemplary embodiments of the present invention.

Figure 9A:
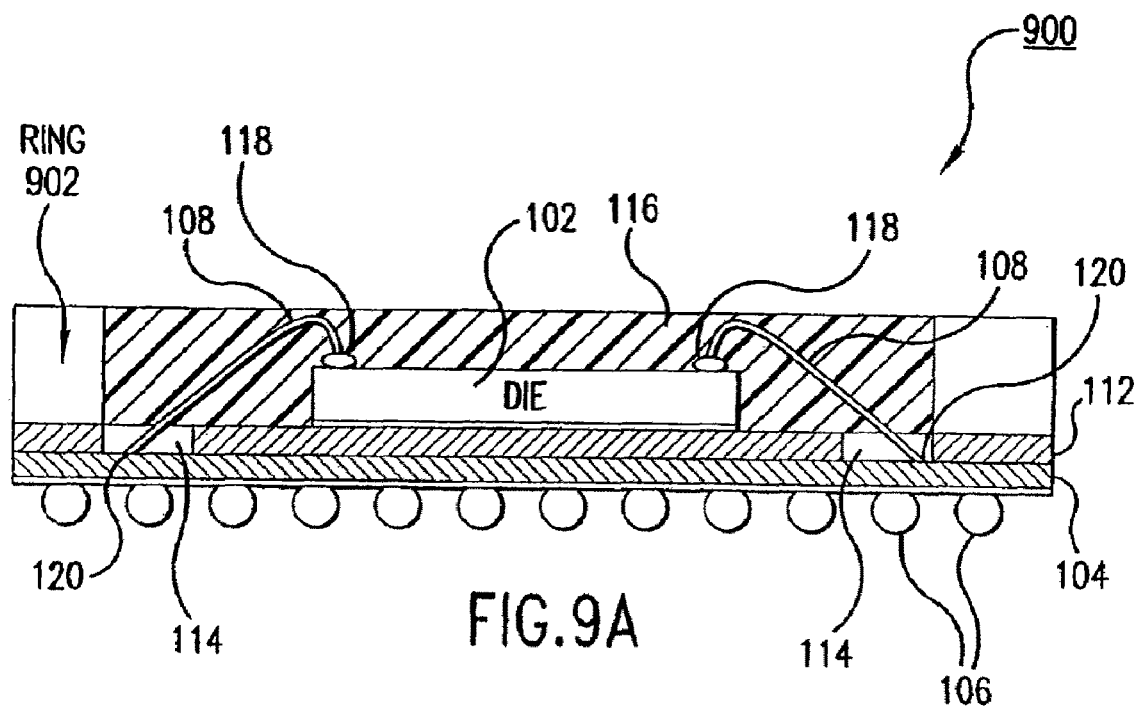
FIG. 9A illustrates a cross-sectional view of a die-up tape BGA package with metal ring, according to an embodiment of the present invention.
Figure 9B:
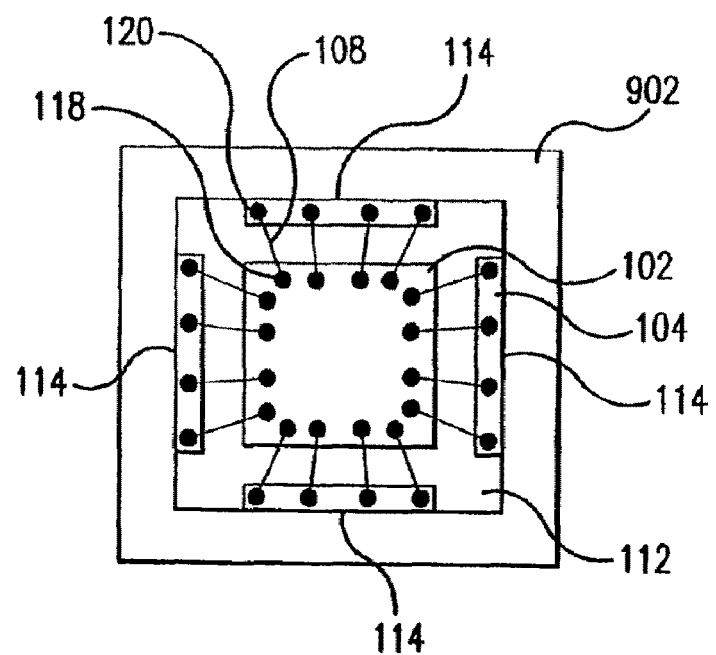
FIG. 9B illustrates a top view of the die-up tape BGA package with metal ring of FIG. 9A, according to an embodiment of the present invention.
Figure 17:
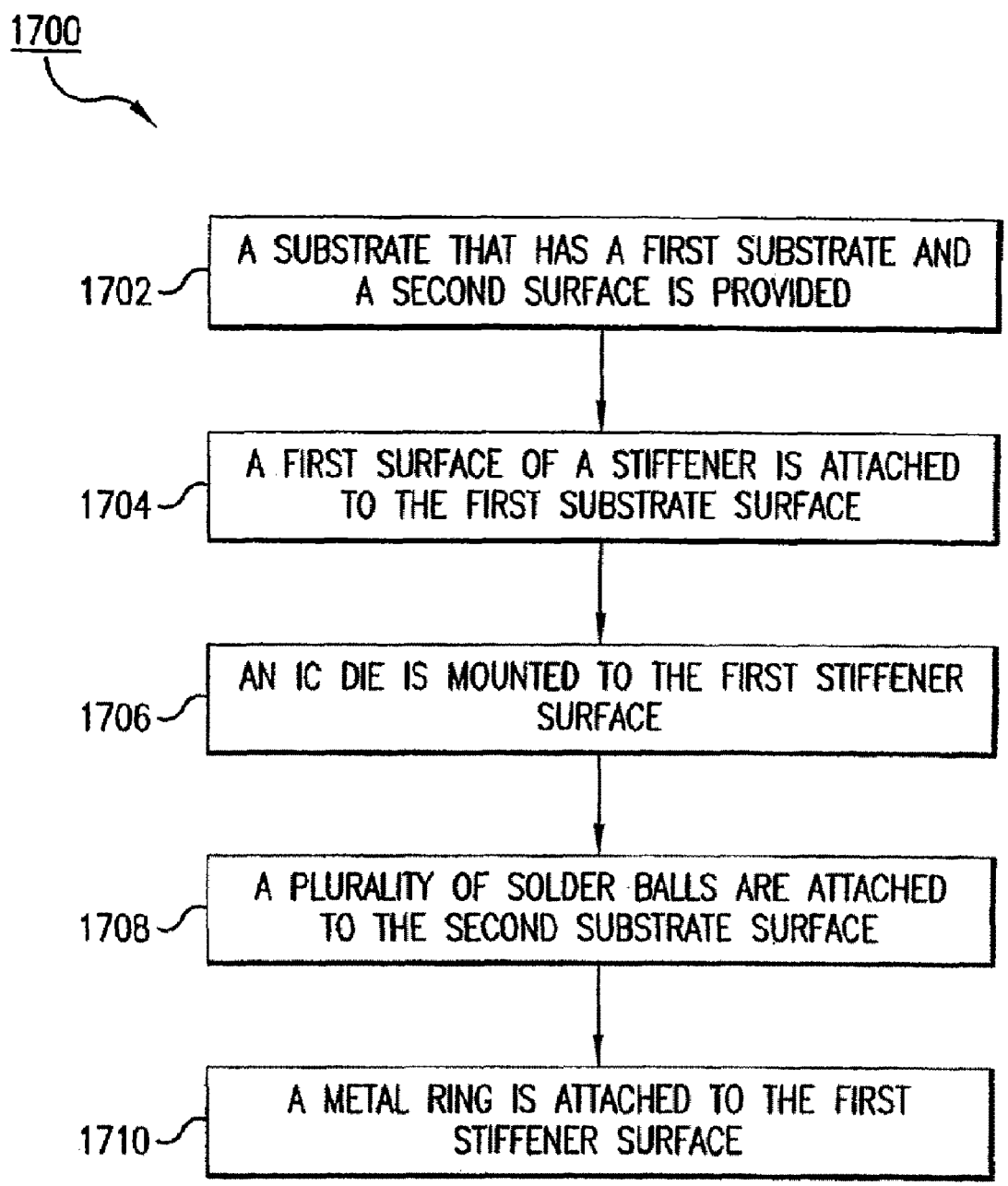

FIG. 17 shows a flowchart related to FIGS. 9A and 9B that provides operational steps of exemplary embodiments of the present invention.

Figure 10A:
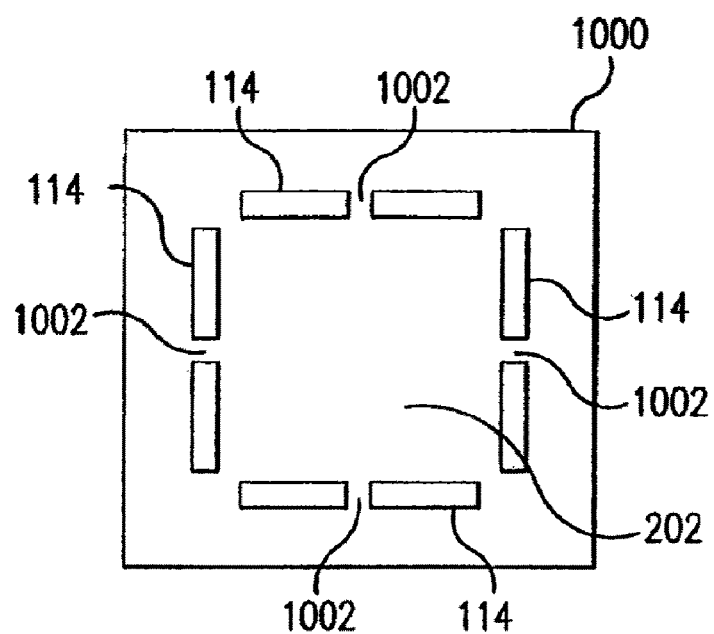
FIG. 10A illustrates a stiffener that includes one or more thermal studs, according to an embodiment of the present invention.
Figure 10B:
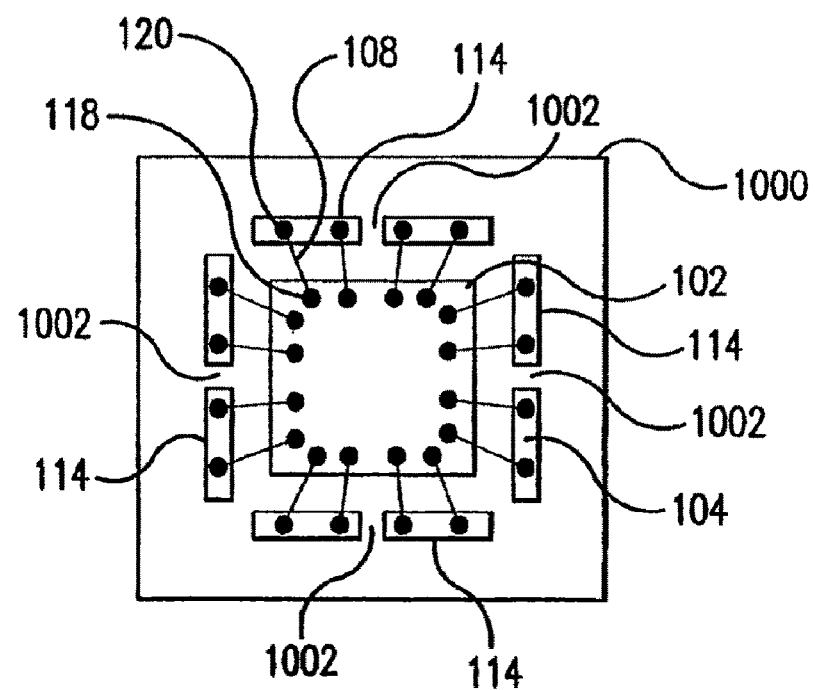
FIG. 10B illustrates an IC die that is wire bound to a substrate through openings in the stiffener of FIG. 10A, according to an embodiment of the present invention.
Figure 18:
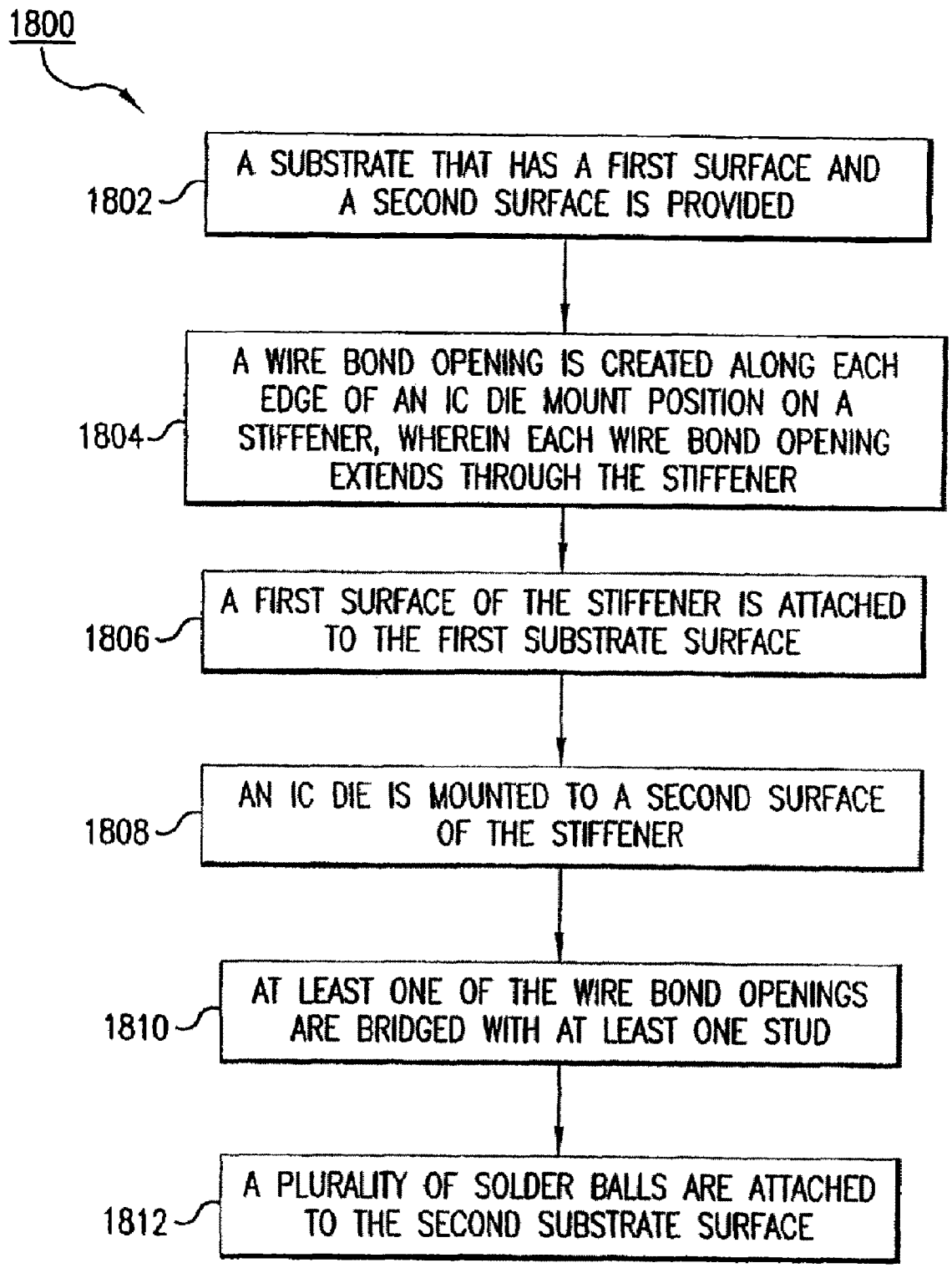

FIG. 18 shows a flowchart related to FIGS. 10A and 10B that provides operational steps of exemplary embodiments of the present invention.

Figure 11:
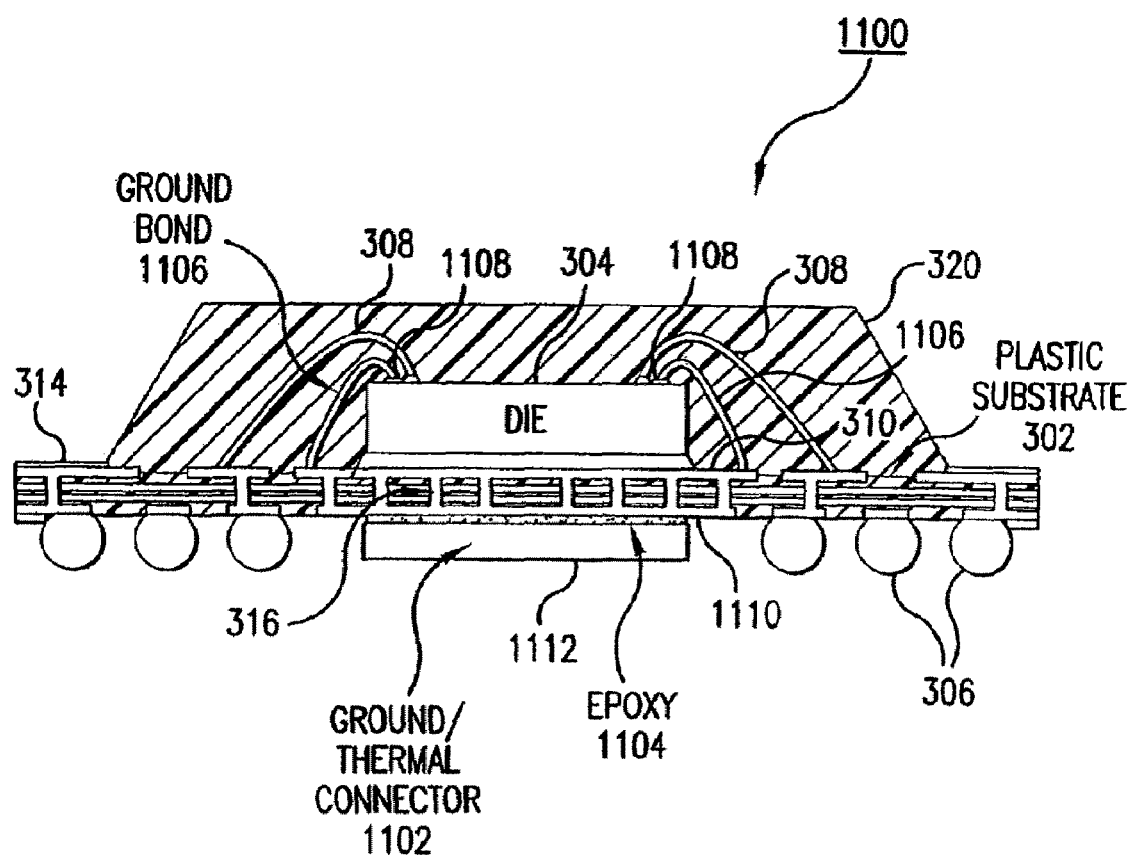
FIG. 11 illustrates a cross-sectional view of a die-up PBGA package with ground/thermal connector, according to an embodiment of the present invention.
Figure 19A:
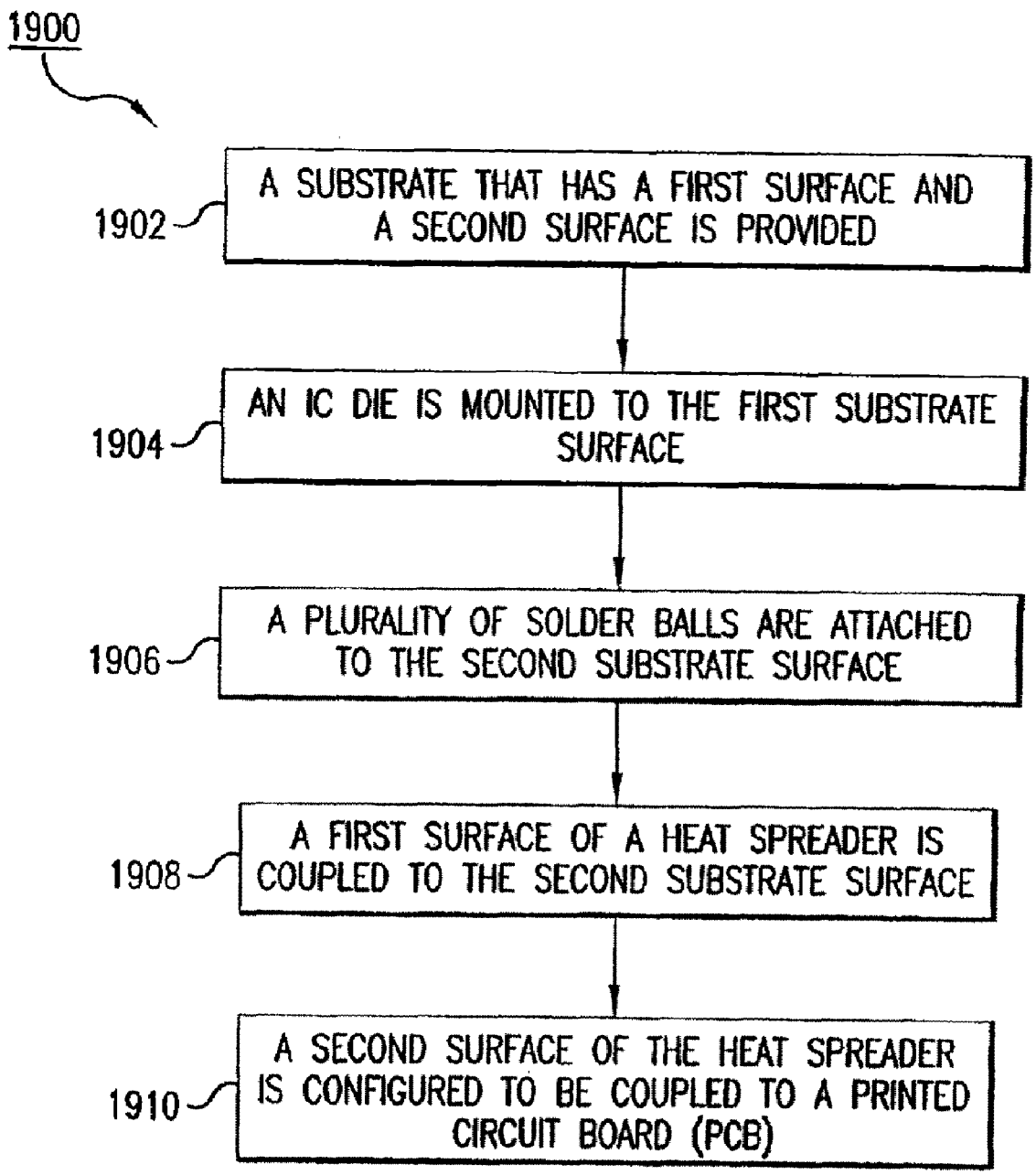
Figure 19B:
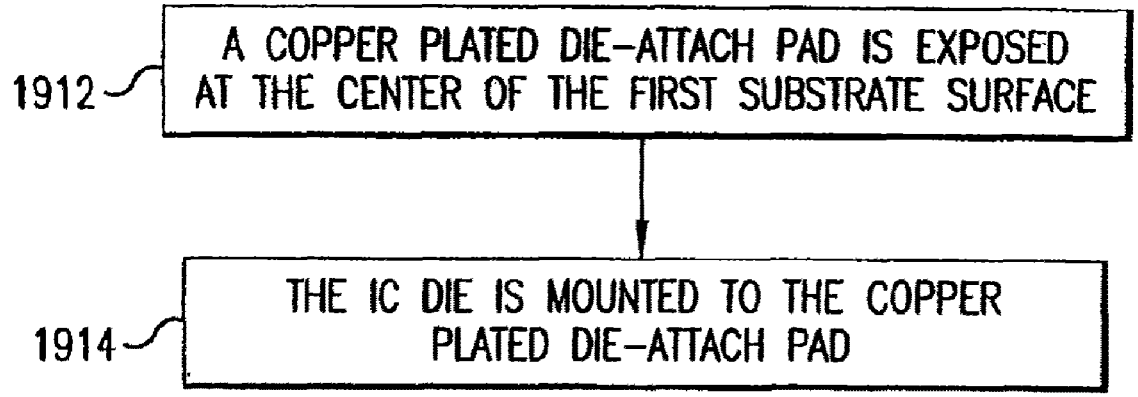
Figure 19C:
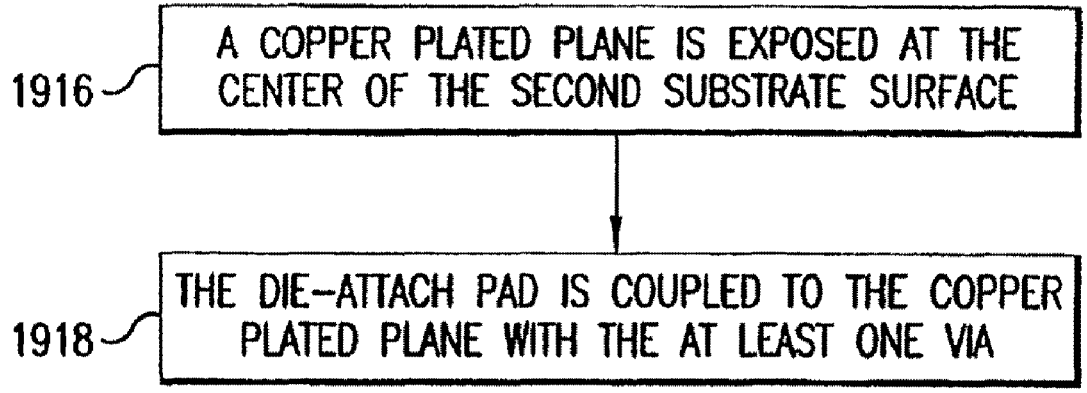

FIGS. 19A-C show flowcharts related to FIG. 11 that provide operational steps of exemplary embodiments of the present invention.

Figure 20:
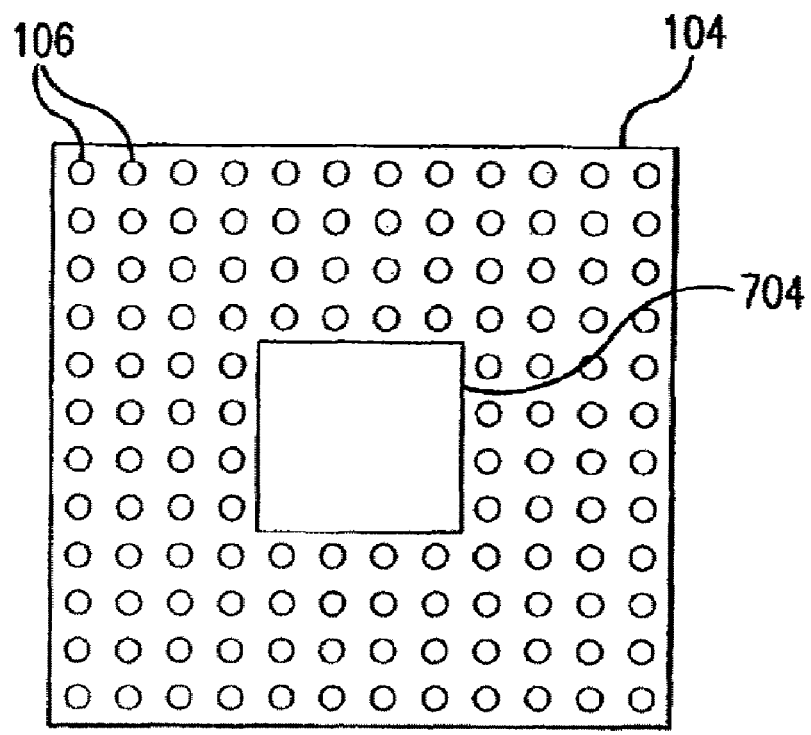

FIG. 20 illustrates a substrate that has a central window opening, according to an embodiment of the present invention.

Figure 21:
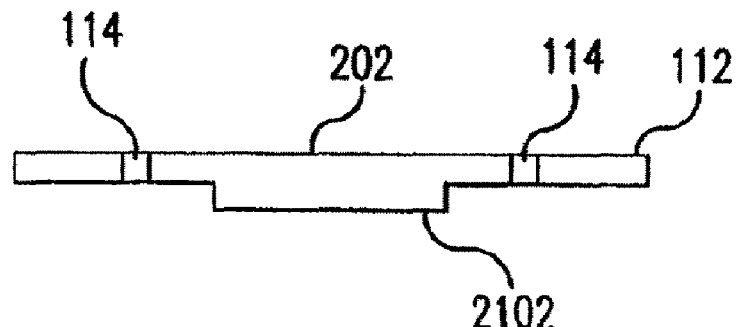

FIG. 21 illustrates a side view of a stiffener that has a downward protruding portion, according to an embodiment of the present invention.

Figure 22:
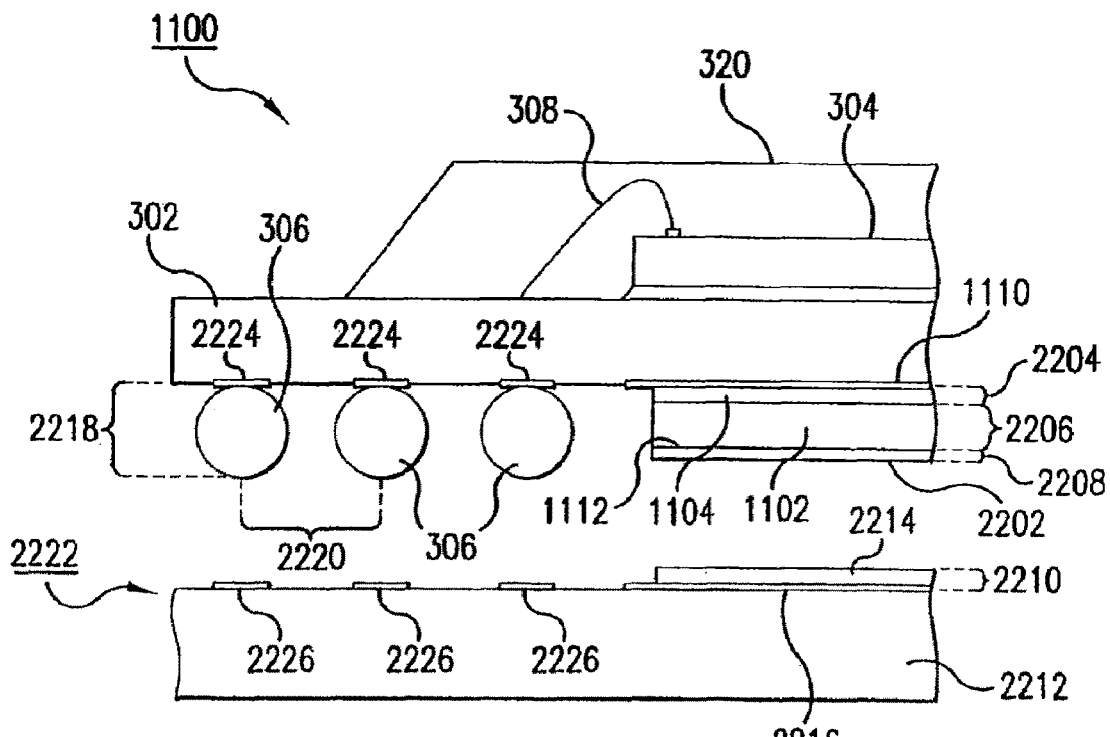

FIG. 22 illustrates a cross-sectional view of a portion of a die-up PBGA package, according to an embodiment of the present invention.

Figure 23:
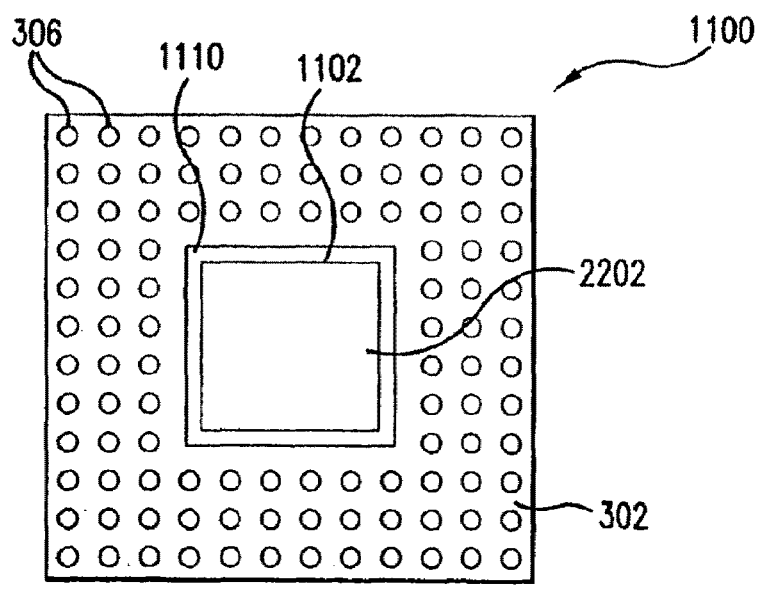

FIG. 23 shows an example ground/thermal connector attached to a bottom surface of a substrate, according to an embodiment of the present invention.

Figure 24:
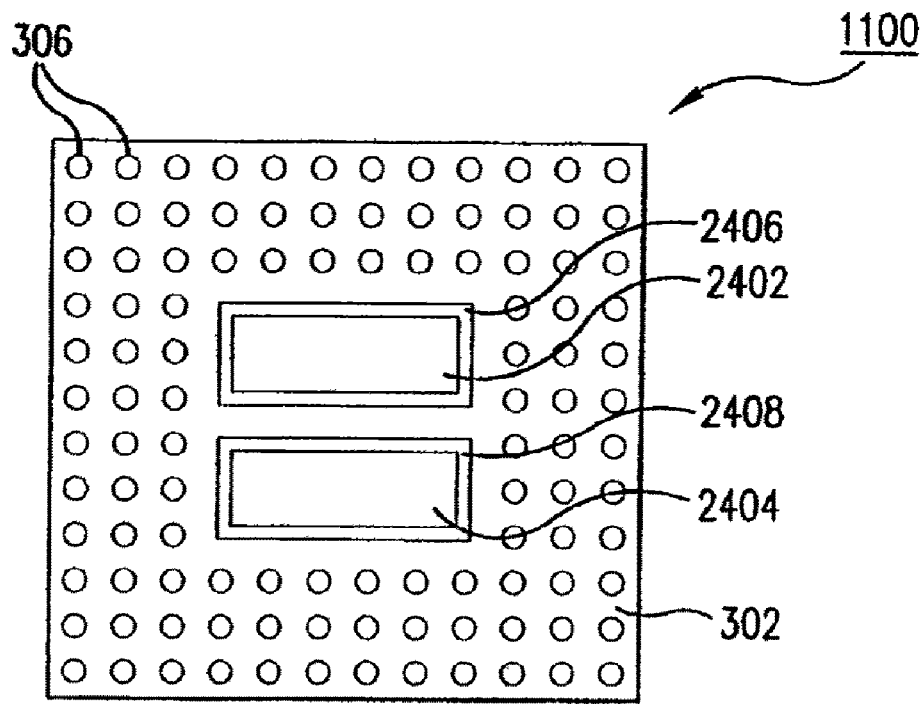

FIG. 24 shows first and second ground/thermal connectors attached to a bottom surface of a substrate, according to an exemplary embodiment of the present invention.

Figure 25:
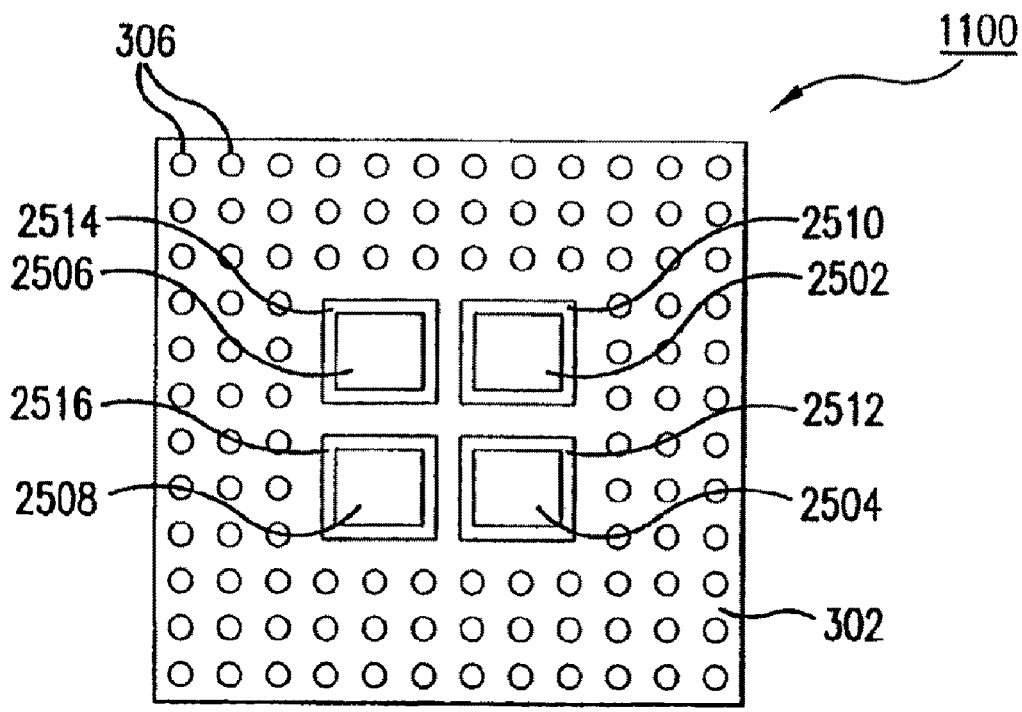

FIG. 25 shows first, second, third, and fourth ground/thermal connectors attached to a bottom surface of a substrate, according to an exemplary embodiment of the present invention.

Figure 26:
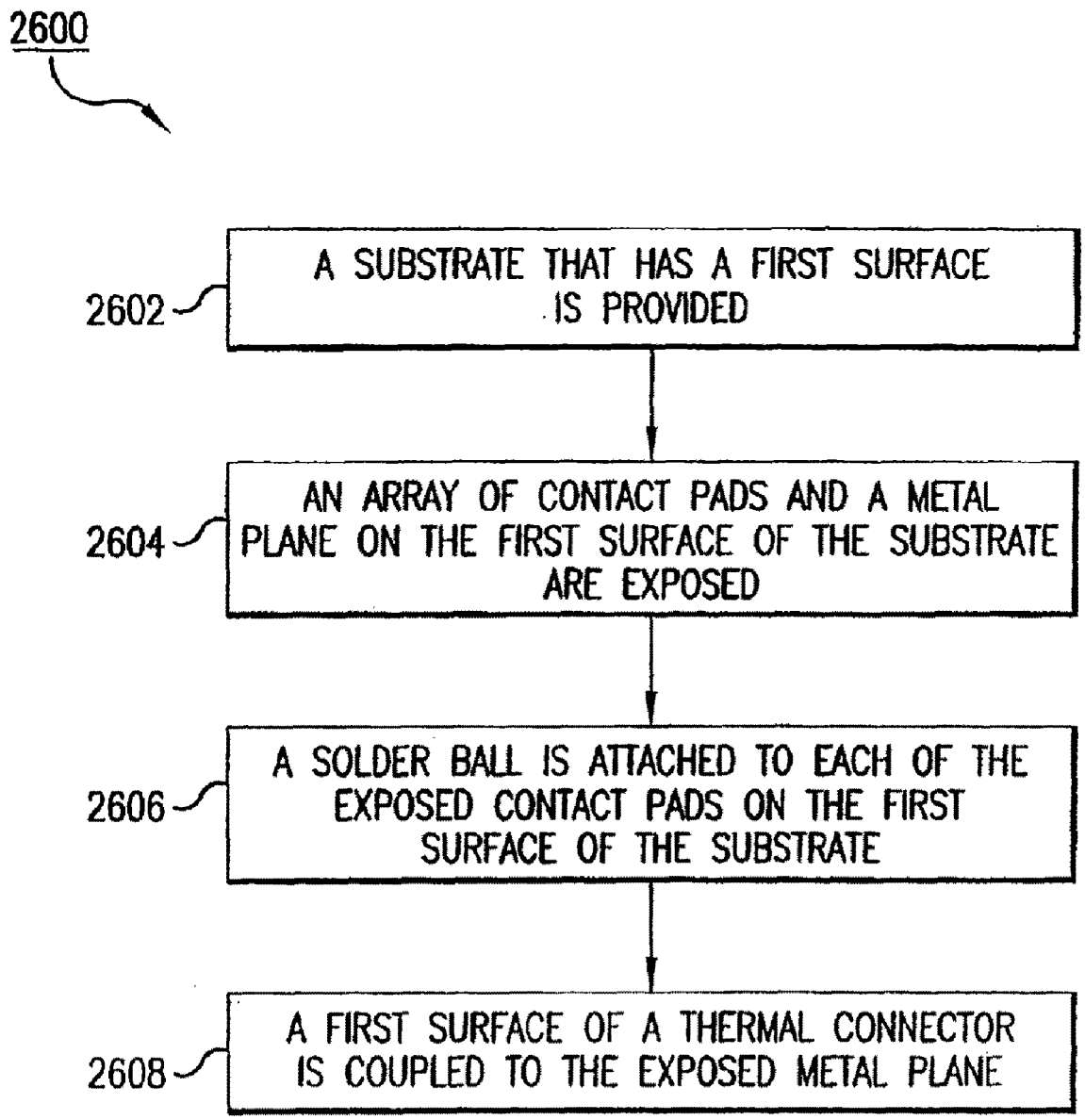

FIG. 26 shows a flowchart providing operational steps for assembling one or more embodiments of the present invention.

Figure 27:
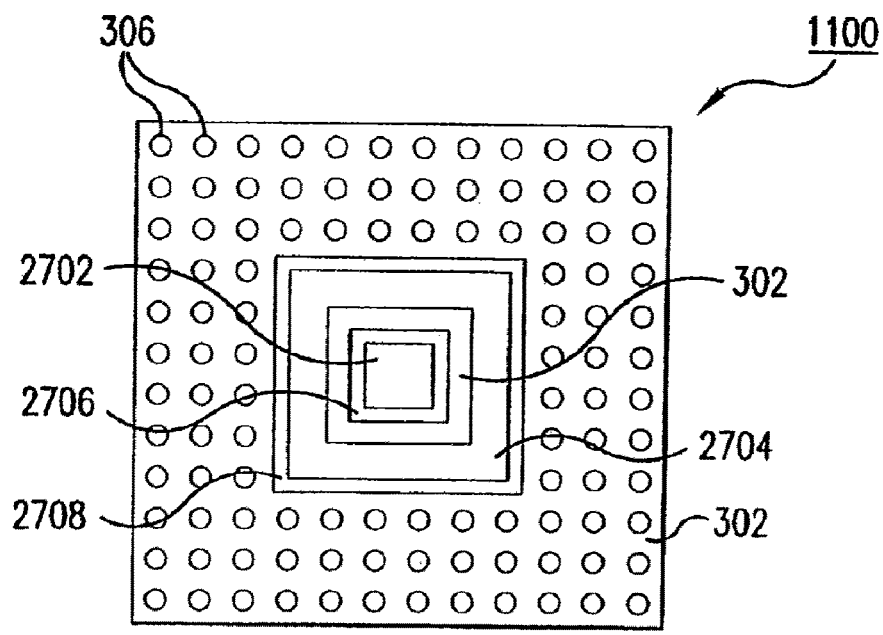

FIG. 27 shows first and second ground/thermal connectors attached to a bottom surface of a substrate, according to an exemplary embodiment of the present invention.

Figure 28:
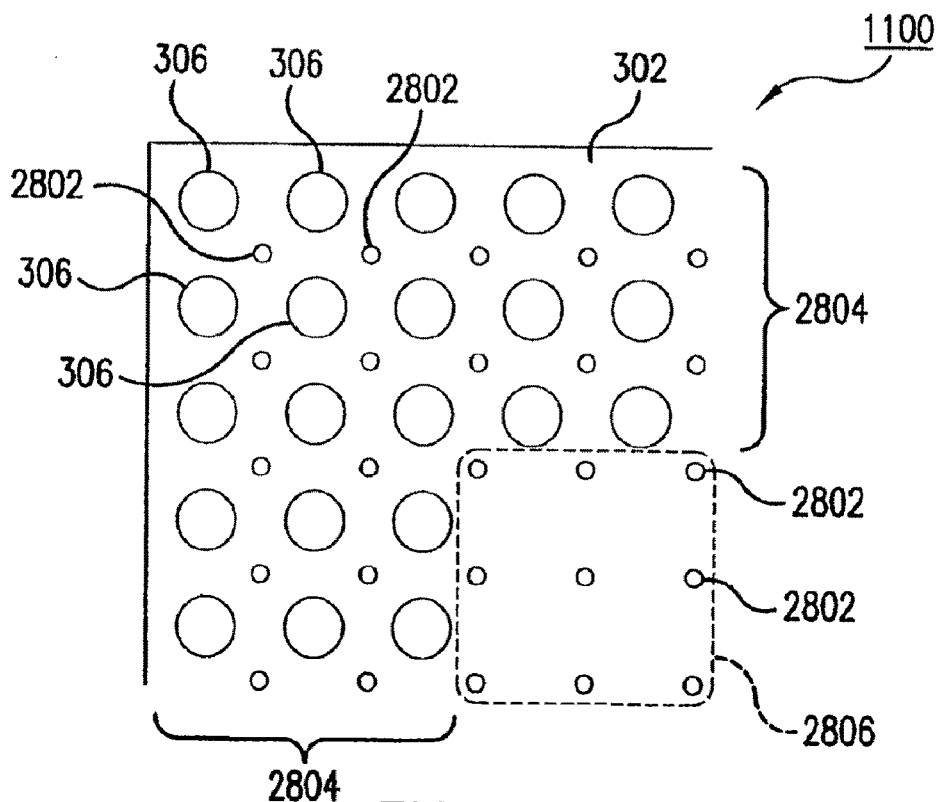

FIG. 28 shows a bottom view of a corner portion of a substrate with potential via locations.

Figure 29:
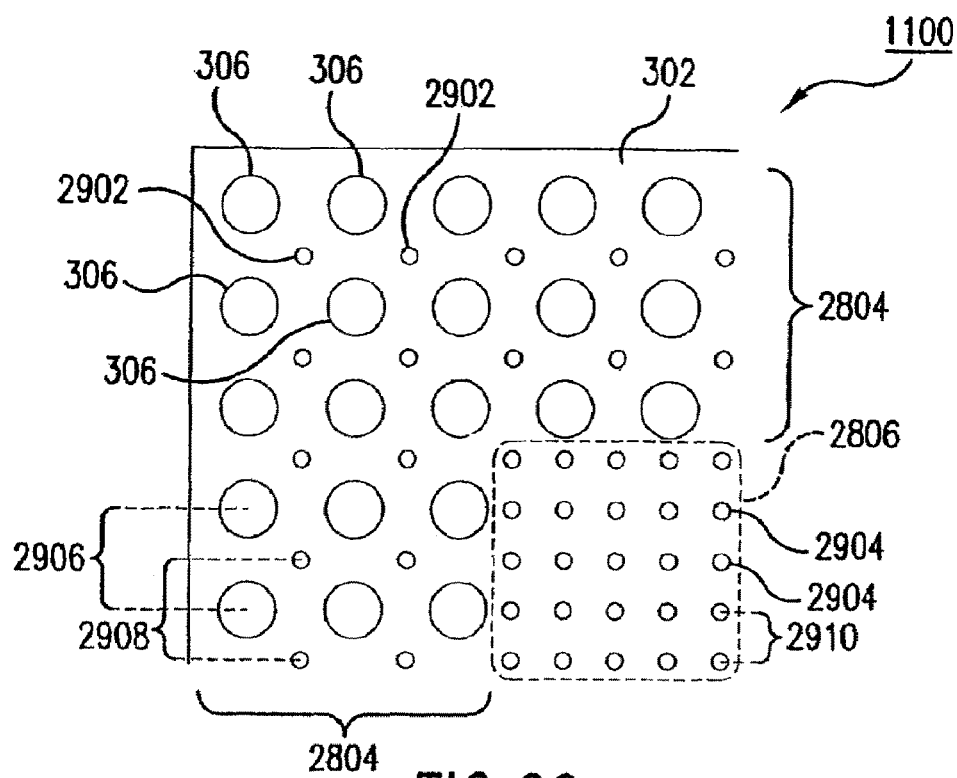
Figure 30:
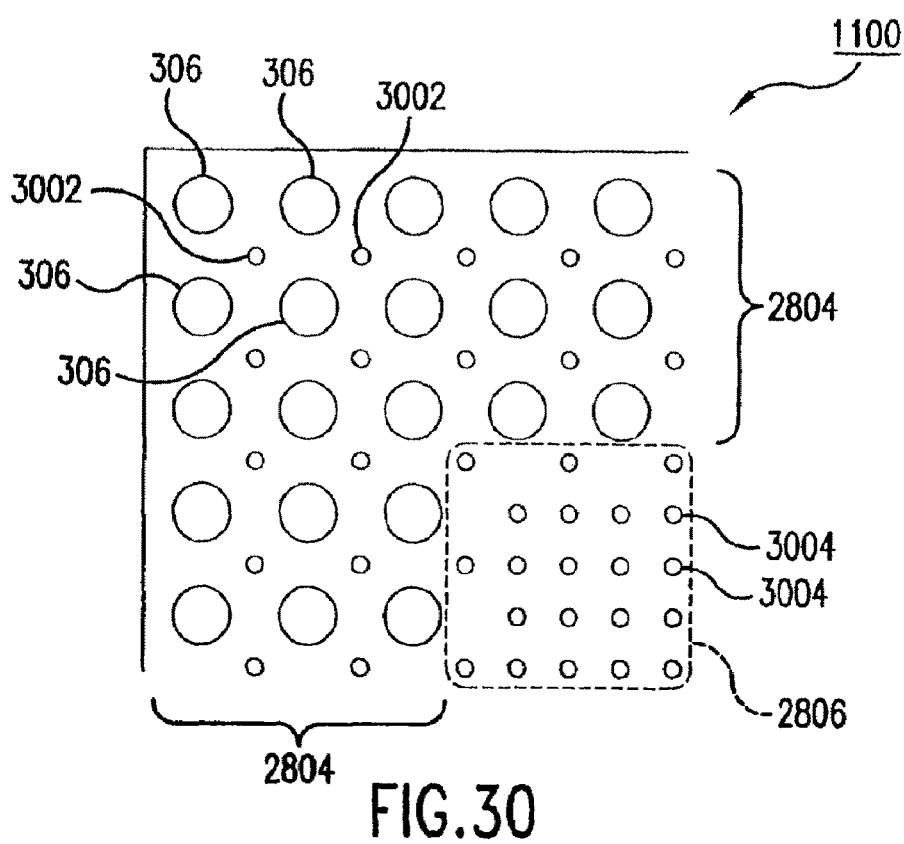

FIGS. 29 and 30 show an example bottom views of a corner portion of a substrate, according to embodiments of the present invention.

Figure 31:
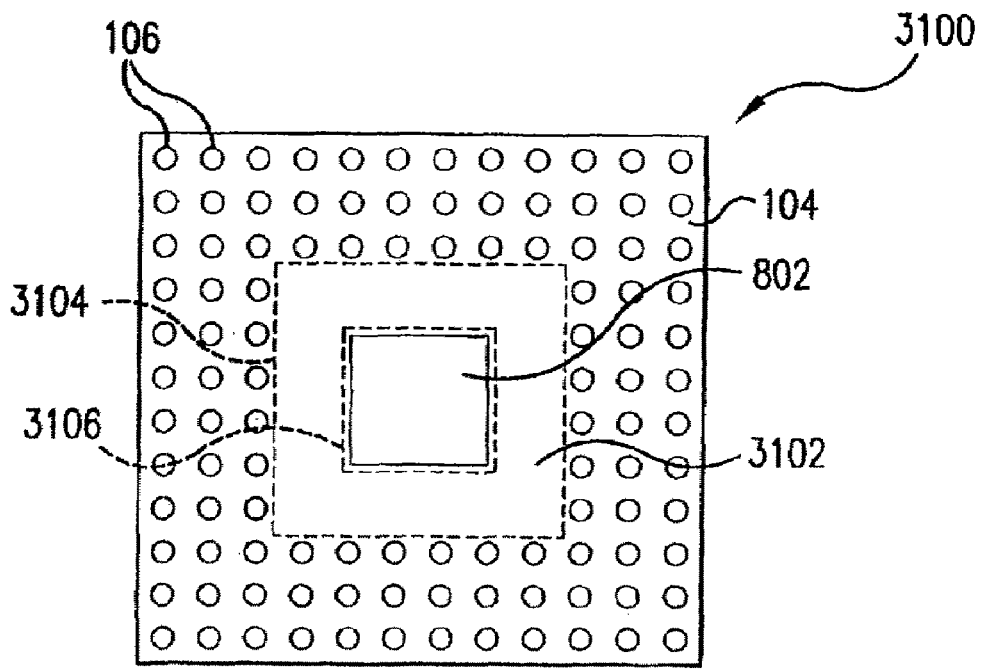

FIG. 31 shows a bottom view of an example BGA package, according to an embodiment of the present invention.

Figure 32:
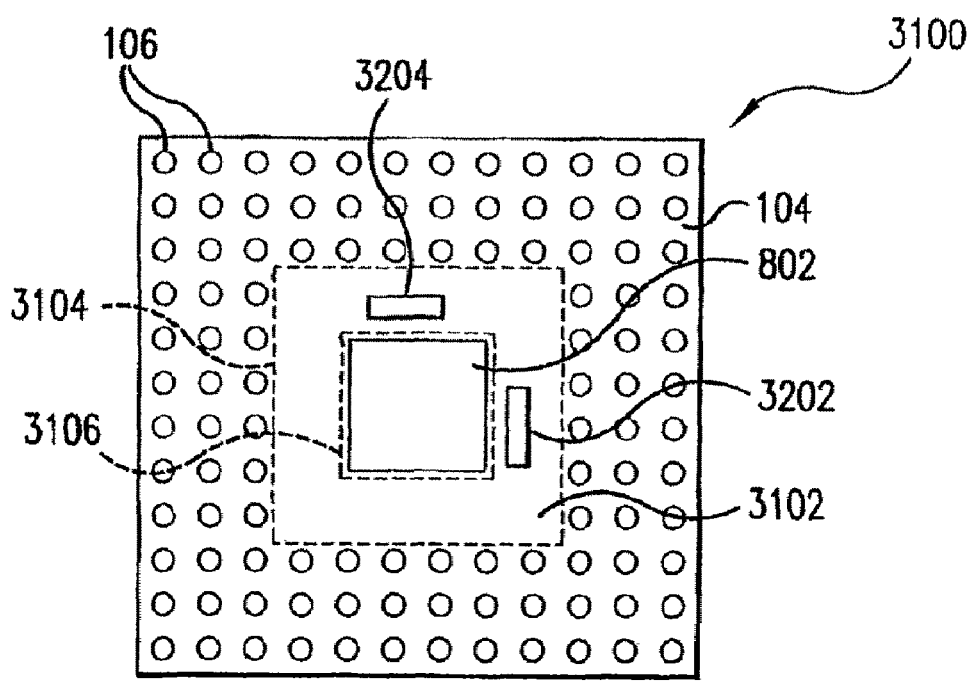

FIG. 32 shows a bottom view of the example BGA package of FIG. 31, with electronic devices attached, according to an embodiment of the present invention.

Figure 33:
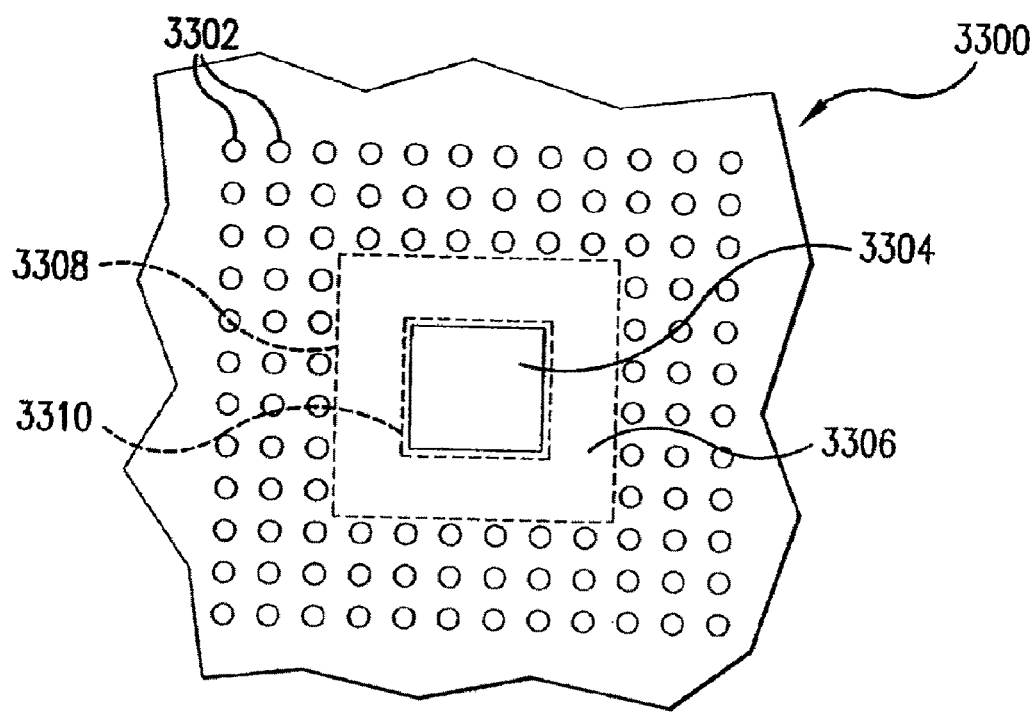

FIG. 33 shows a portion of a printed circuit board for mounting a BGA package, according to an exemplary embodiment of the present invention.

Figure 34:
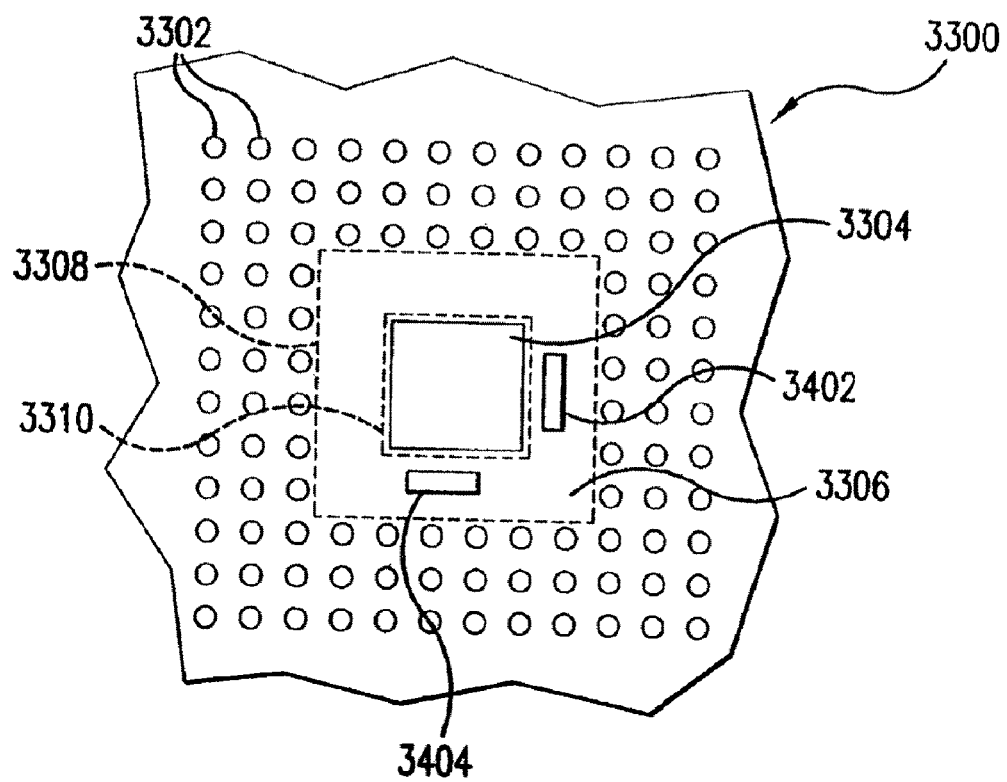

FIG. 34 shows the printed circuit board portion of FIG. 33 with electronic devices attached, according to an embodiment of the present invention.

Figure 35:
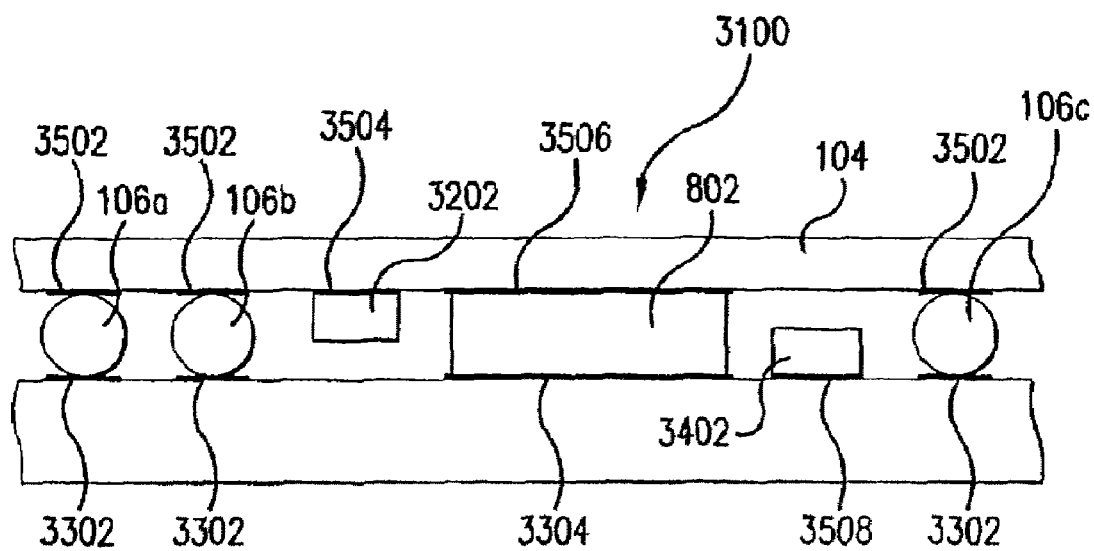

FIG. 35 shows an cross-sectional view of the BGA package of FIG. 32 mounted to the printed circuit board of FIG. 34, according to an embodiment of the present invention.

Figure 36A:
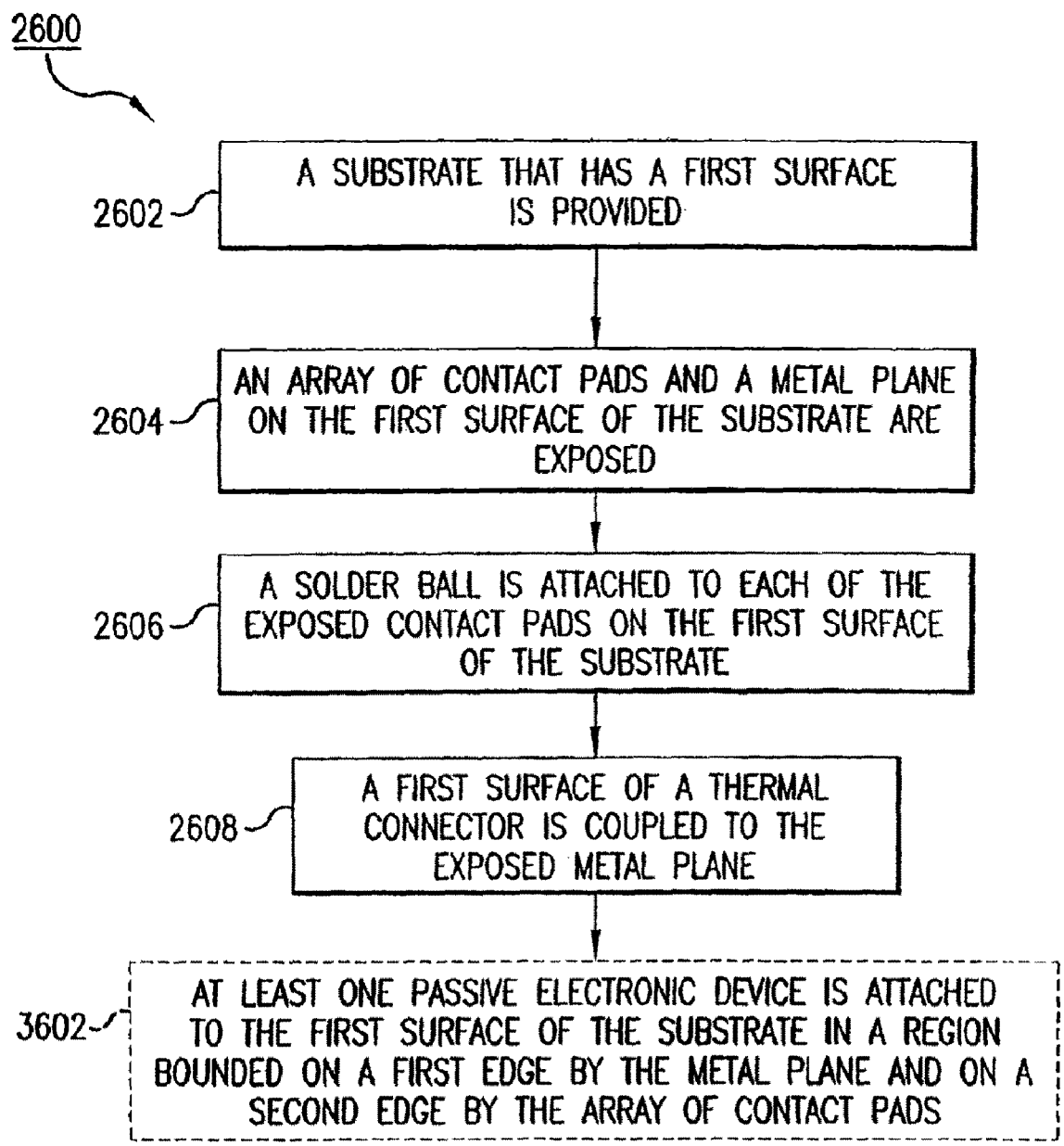
Figure 36B:
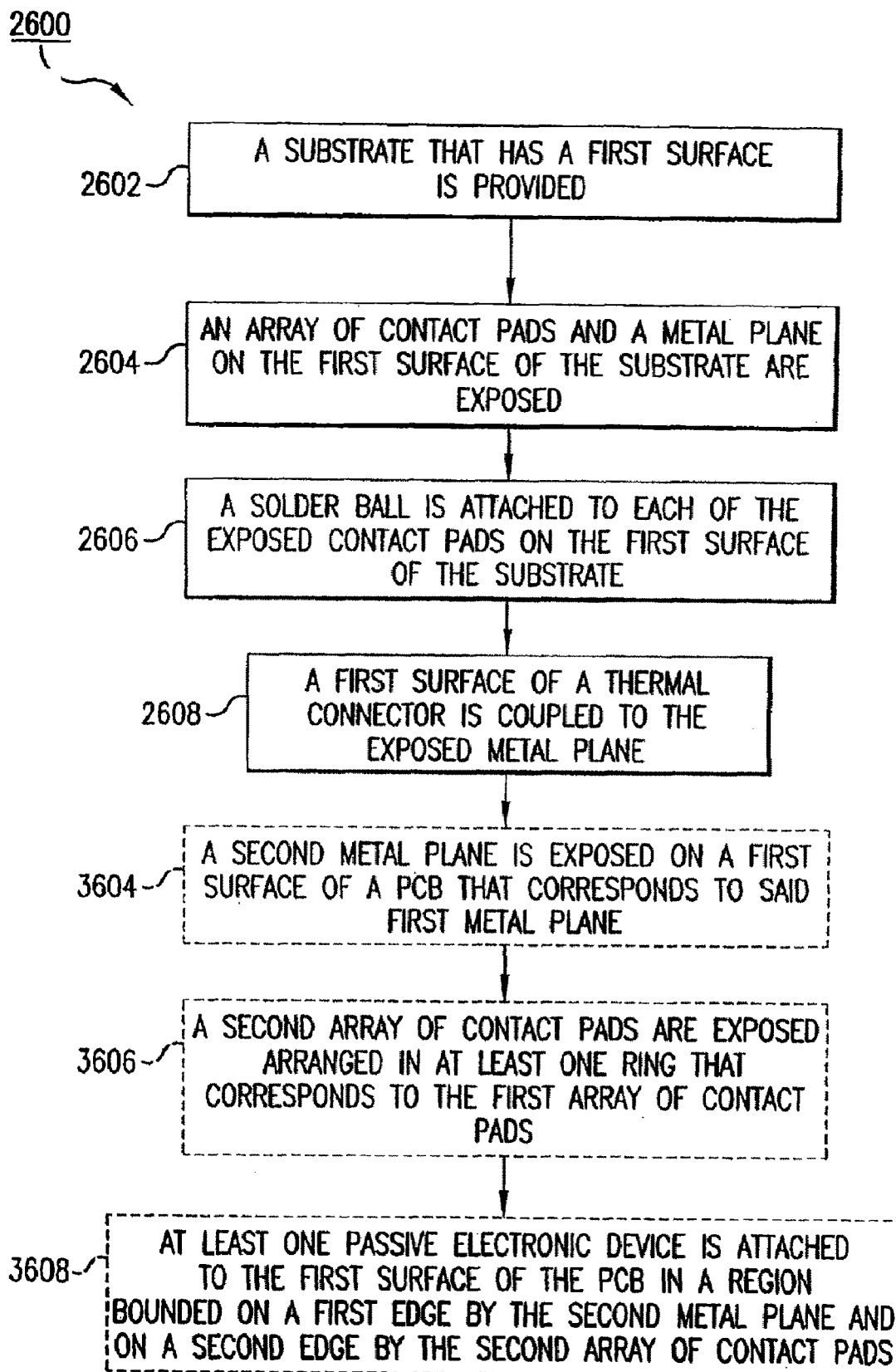

FIGS. 36A and 36B show flowcharts providing operational steps for assembling embodiments of the present invention.

Figure 37A:
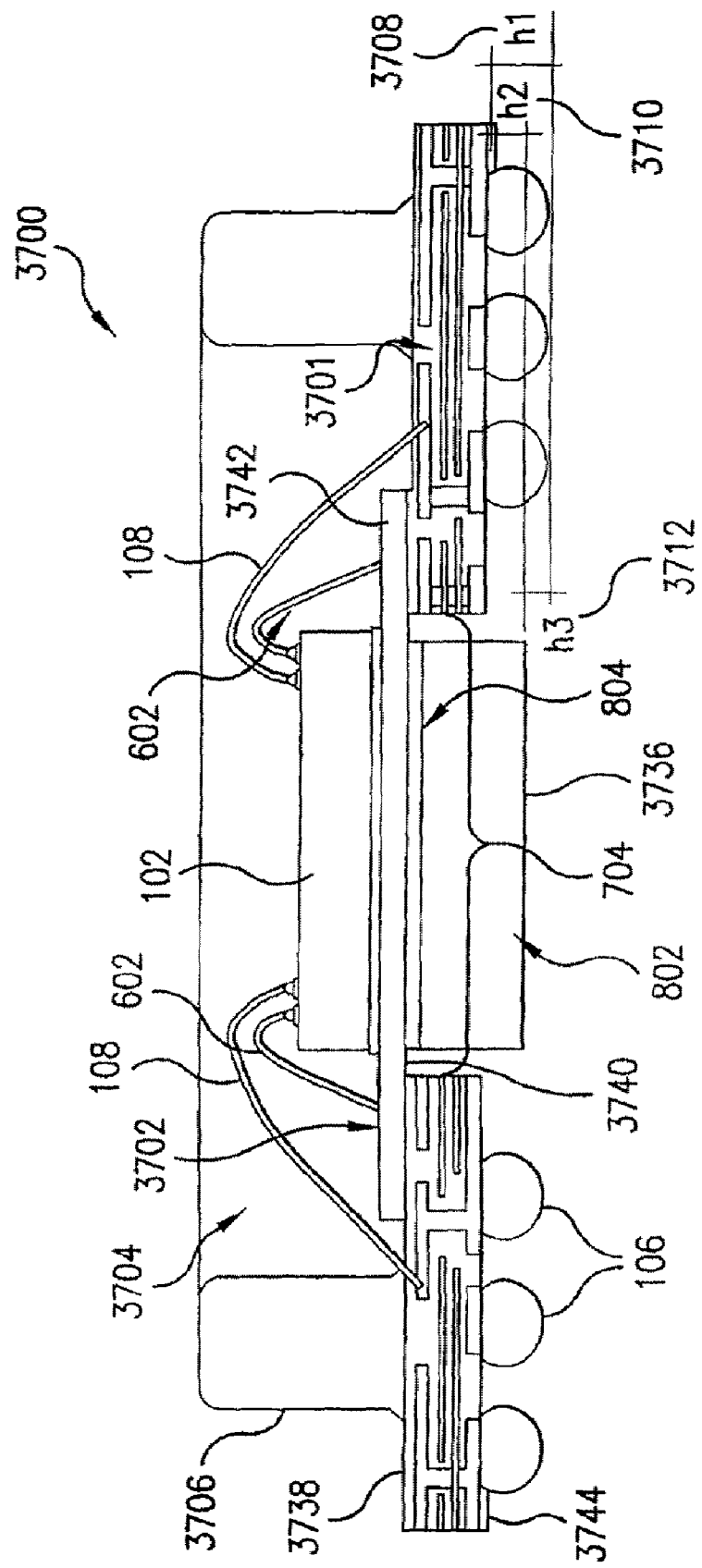

FIG. 37A illustrates a cross-sectional view of a die-up BGA package with ground/thermal connector and reduced-size stiffener, according to an embodiment of the present invention.

FIGS. 37B-37E illustrate views of exemplary BGA package stiffeners, according to embodiments of the present invention.

Figure 37C:
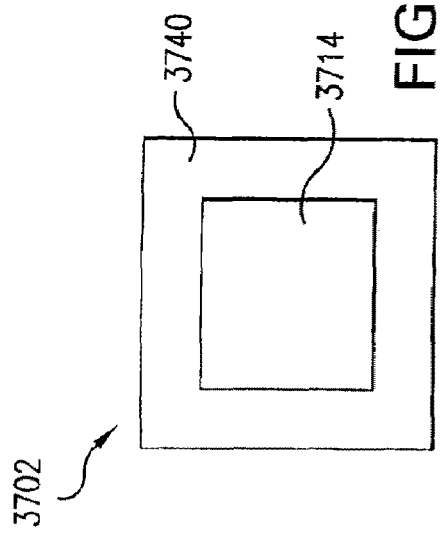
Figure 37E:
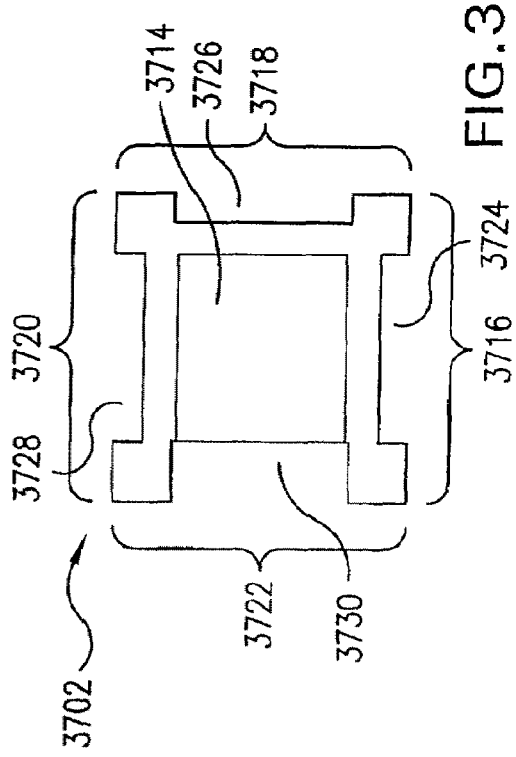
Figure 37B:
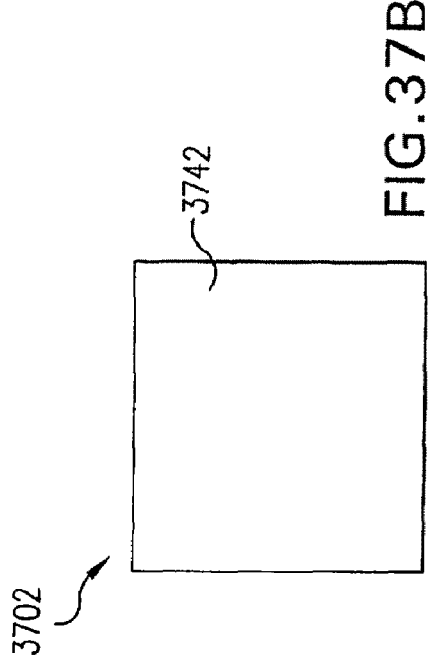
Figure 37D:
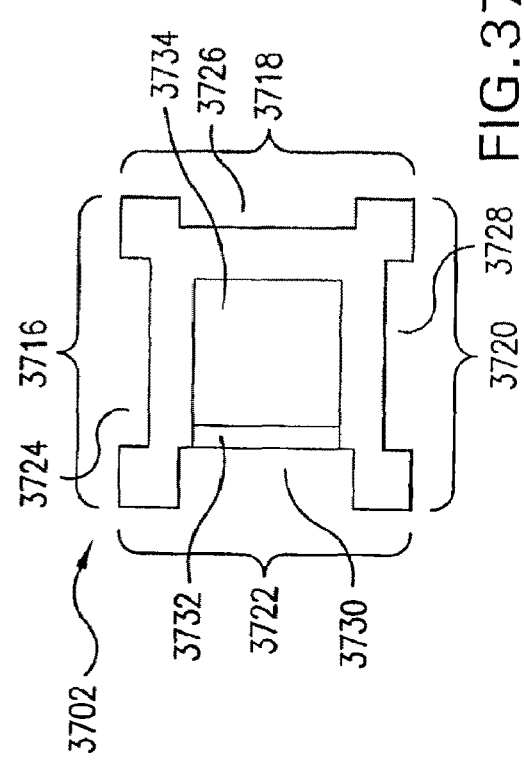
Figure 37F:
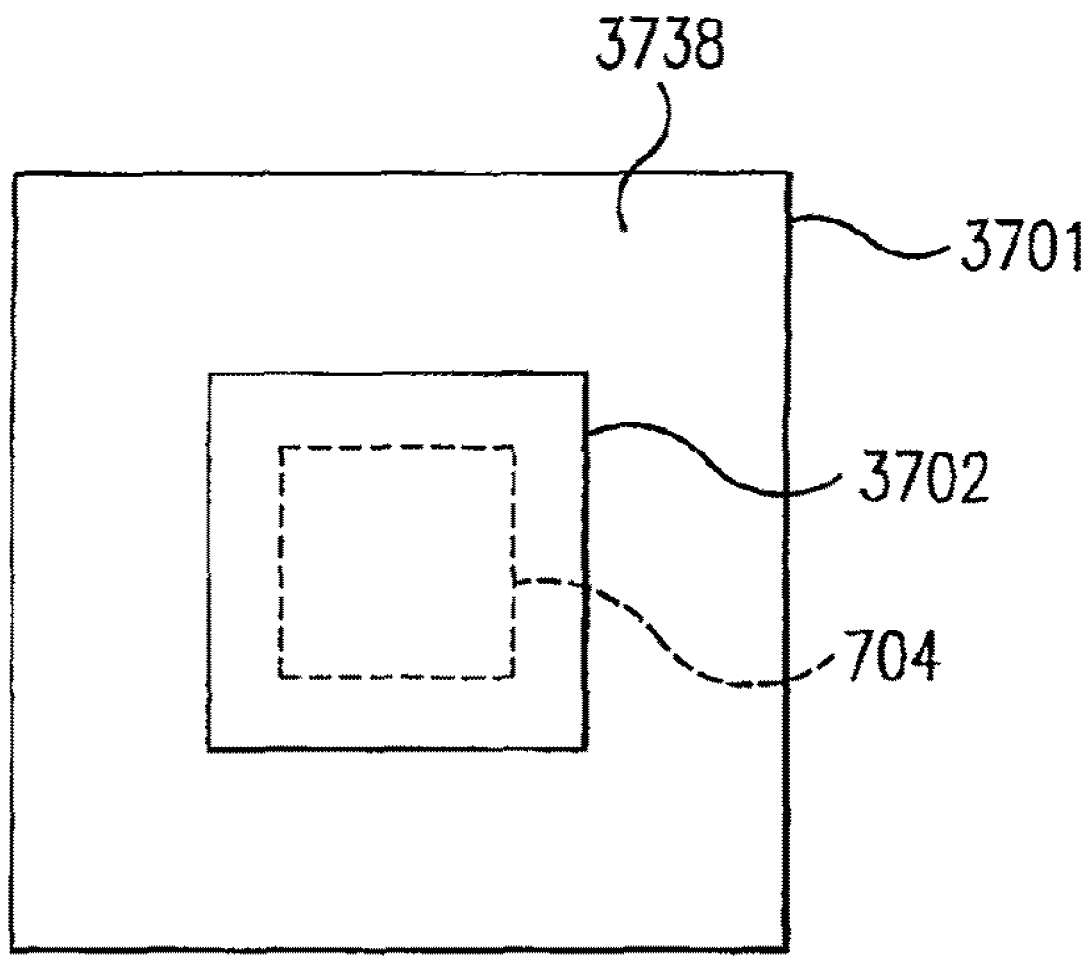

FIG. 37F illustrates a plan view of a substrate and stiffener, according to an embodiment of the present invention.

Figure 39:
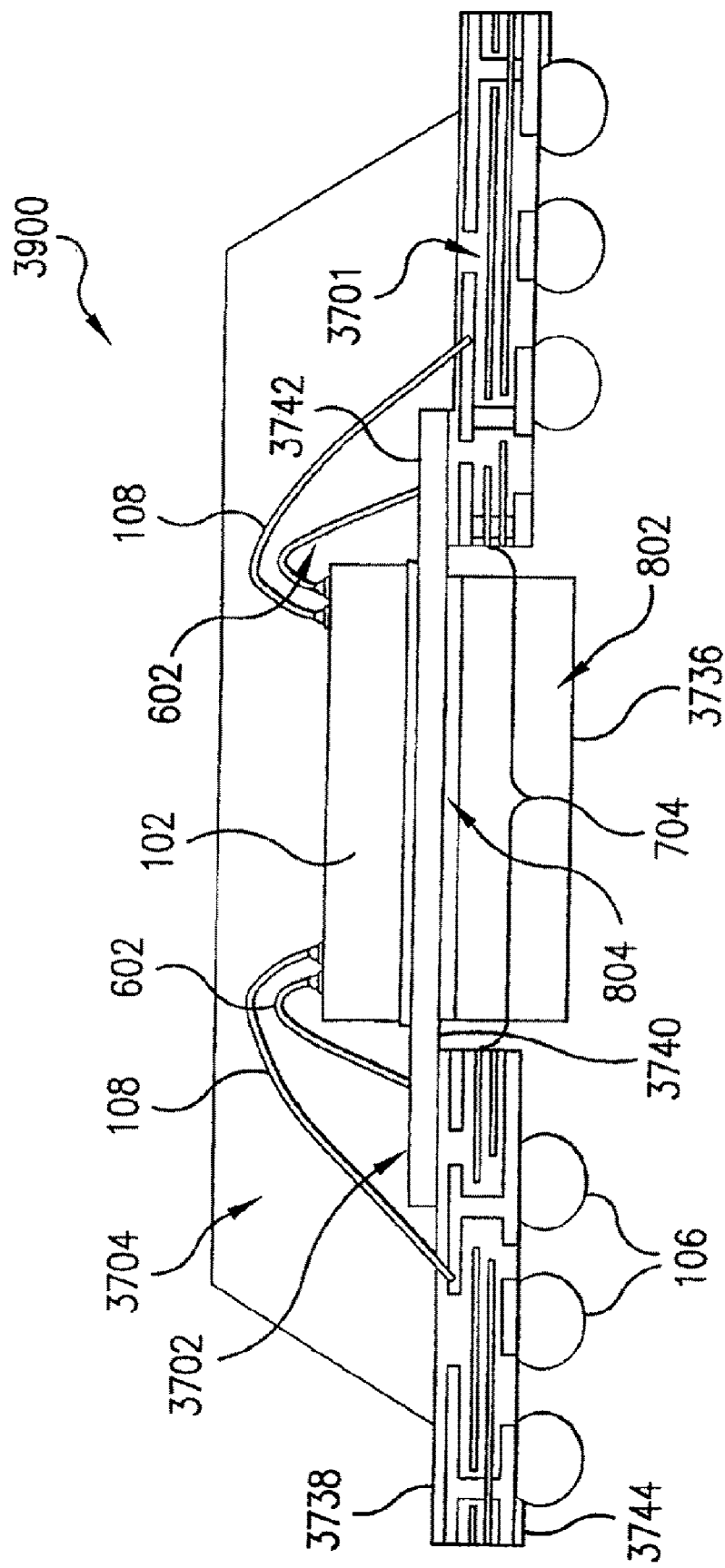
Figure 40:
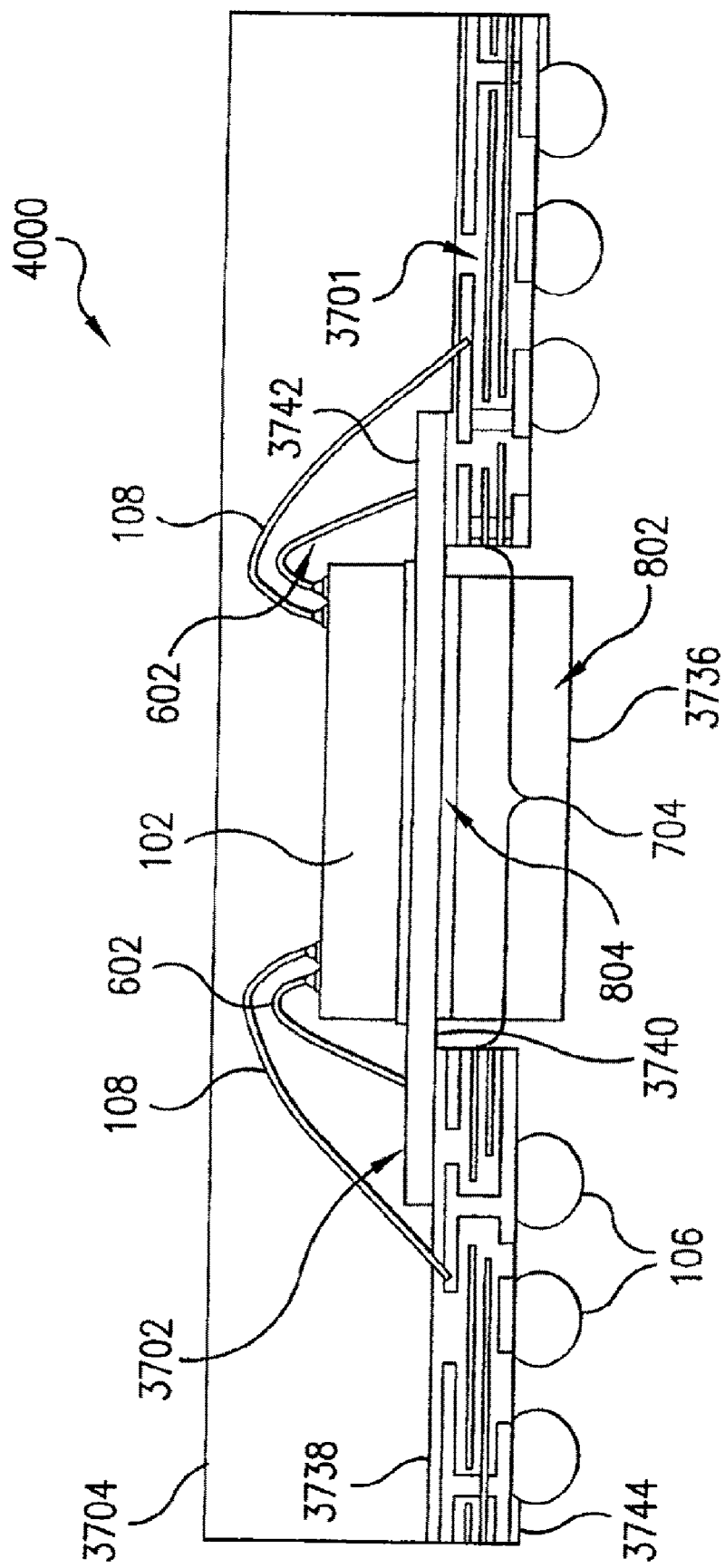

FIGS. 38-40 illustrate cross-sectional views of die-up BGA packages with ground/thermal connectors and reduced-size stiffeners, according to embodiments of the present invention.

Figure 41A:
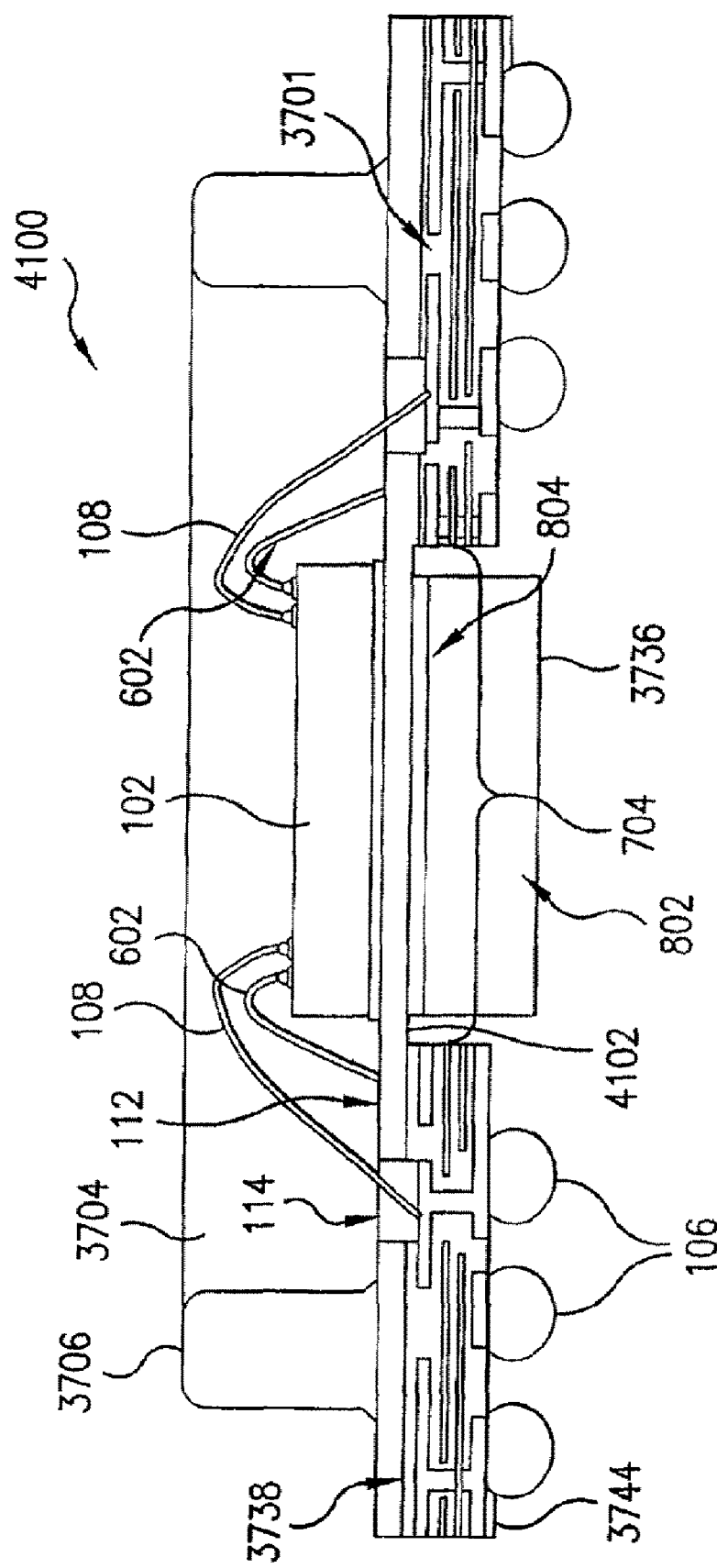

FIG. 41A illustrates a cross-sectional view of a die-up BGA package with ground/thermal connector and full-size stiffener, according to an embodiment of the present invention.

Figure 41B:
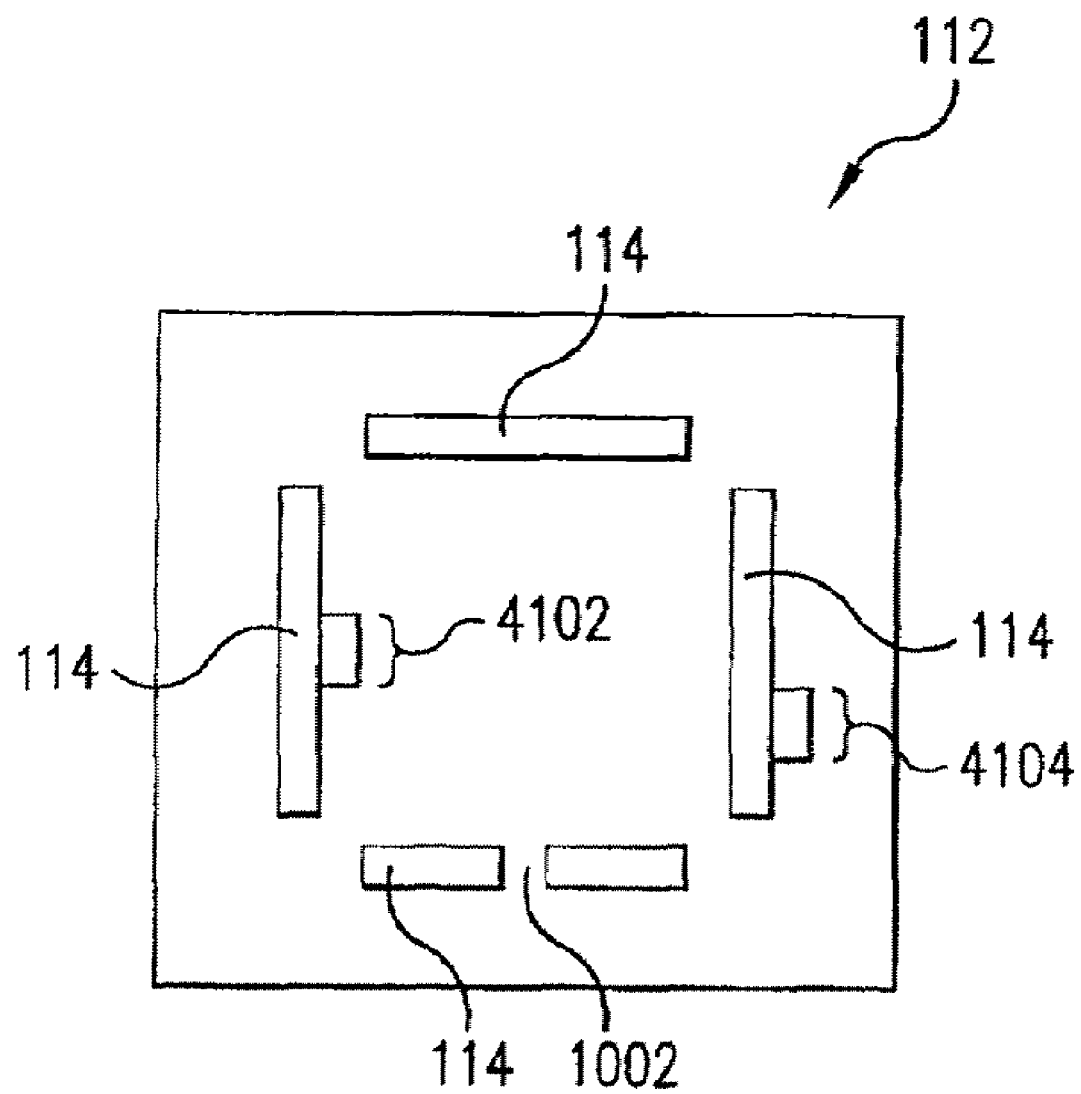

FIG. 41B illustrates a stiffener having openings with notches and a stud, according to an example embodiment of the present invention.

Figure 42:
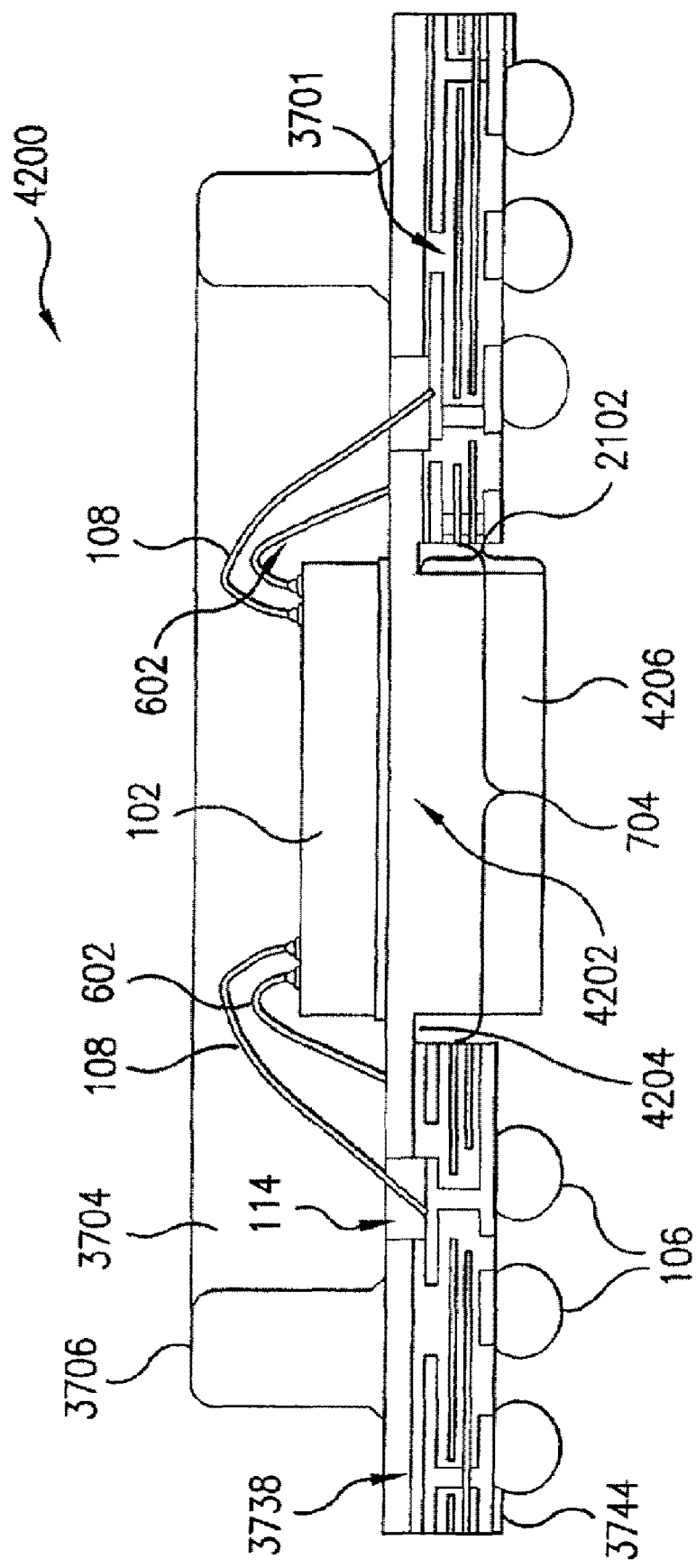
Figure 43:
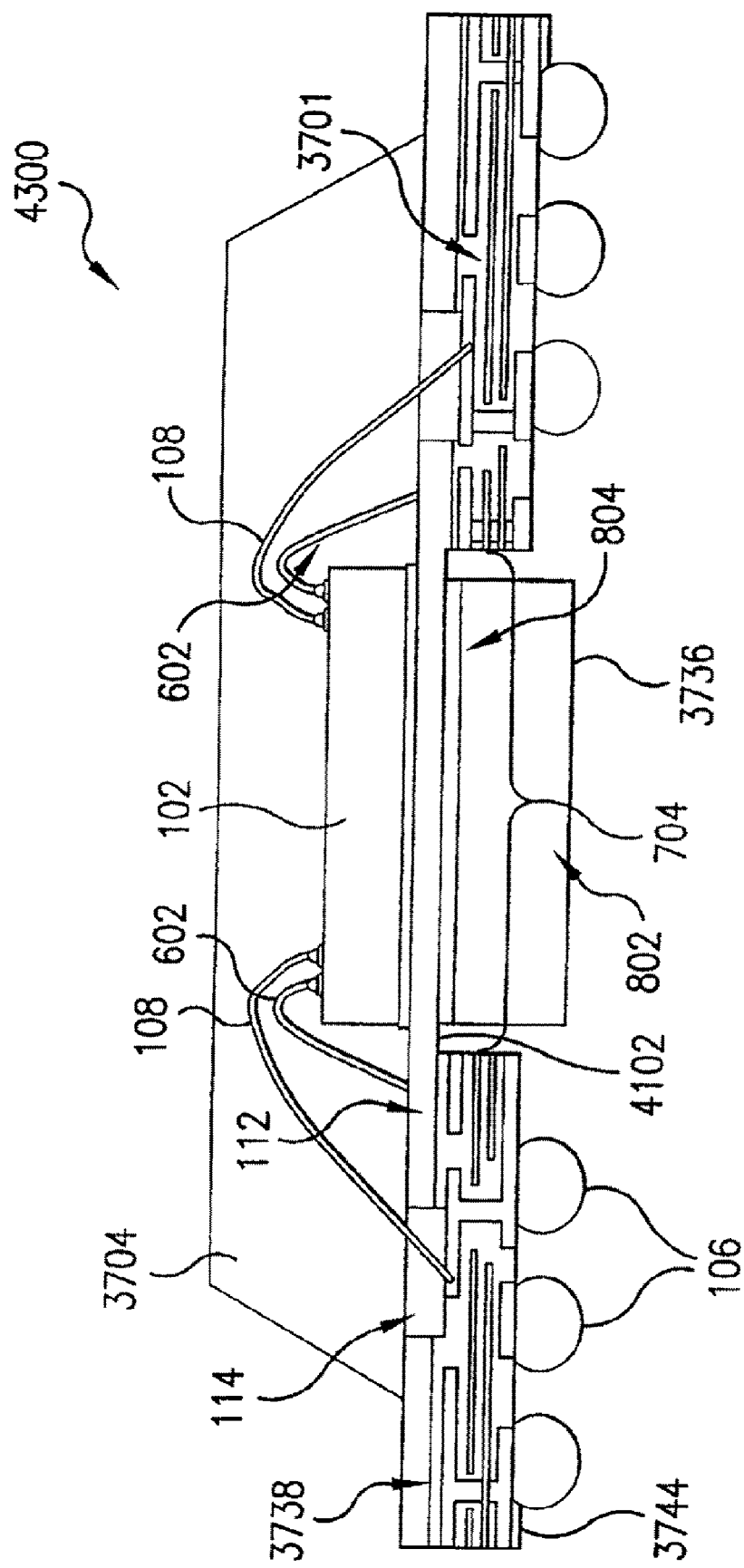
Figure 44:
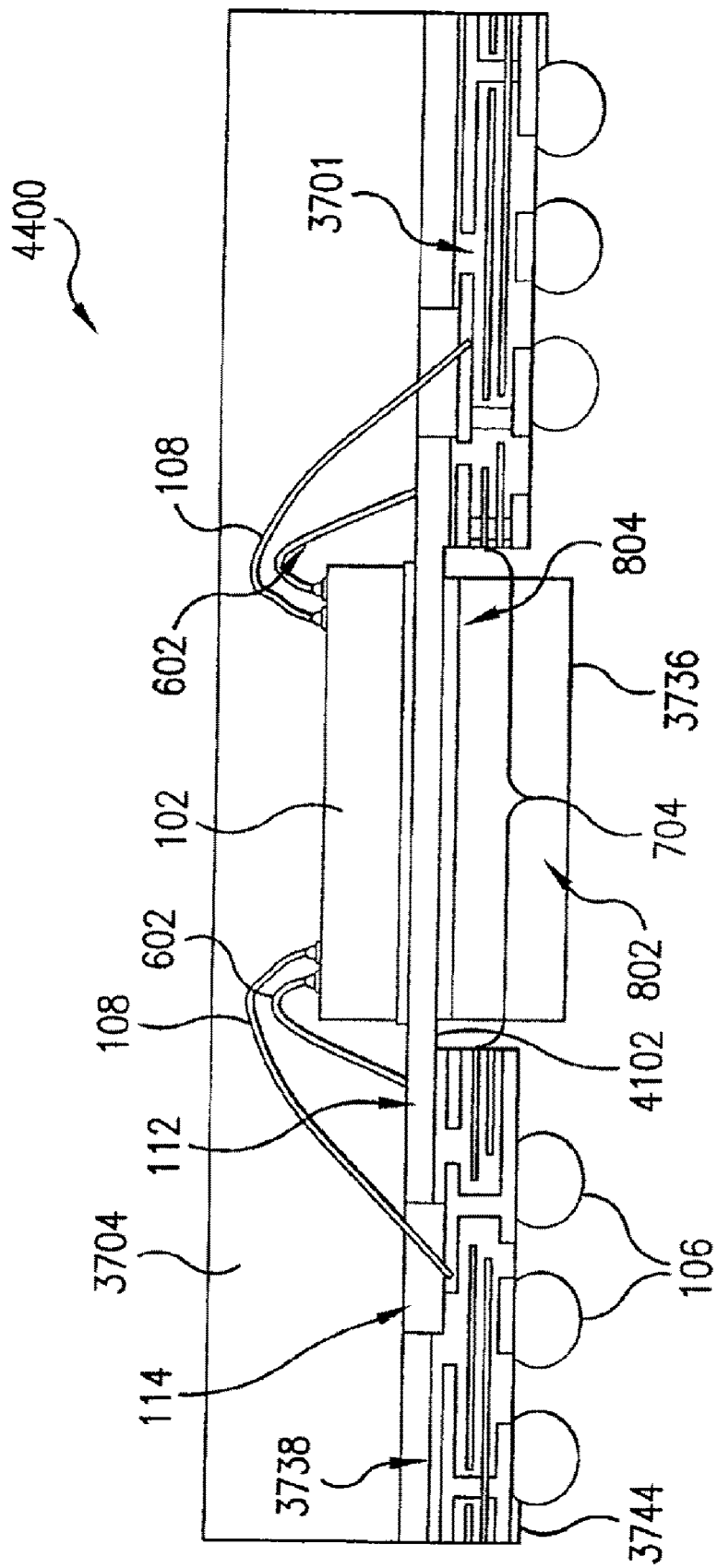

FIGS. 42-44 illustrate cross-sectional views of die-up BGA packages with ground/thermal connectors and full-size stiffeners, according to embodiments of the present invention.

Figure 45:
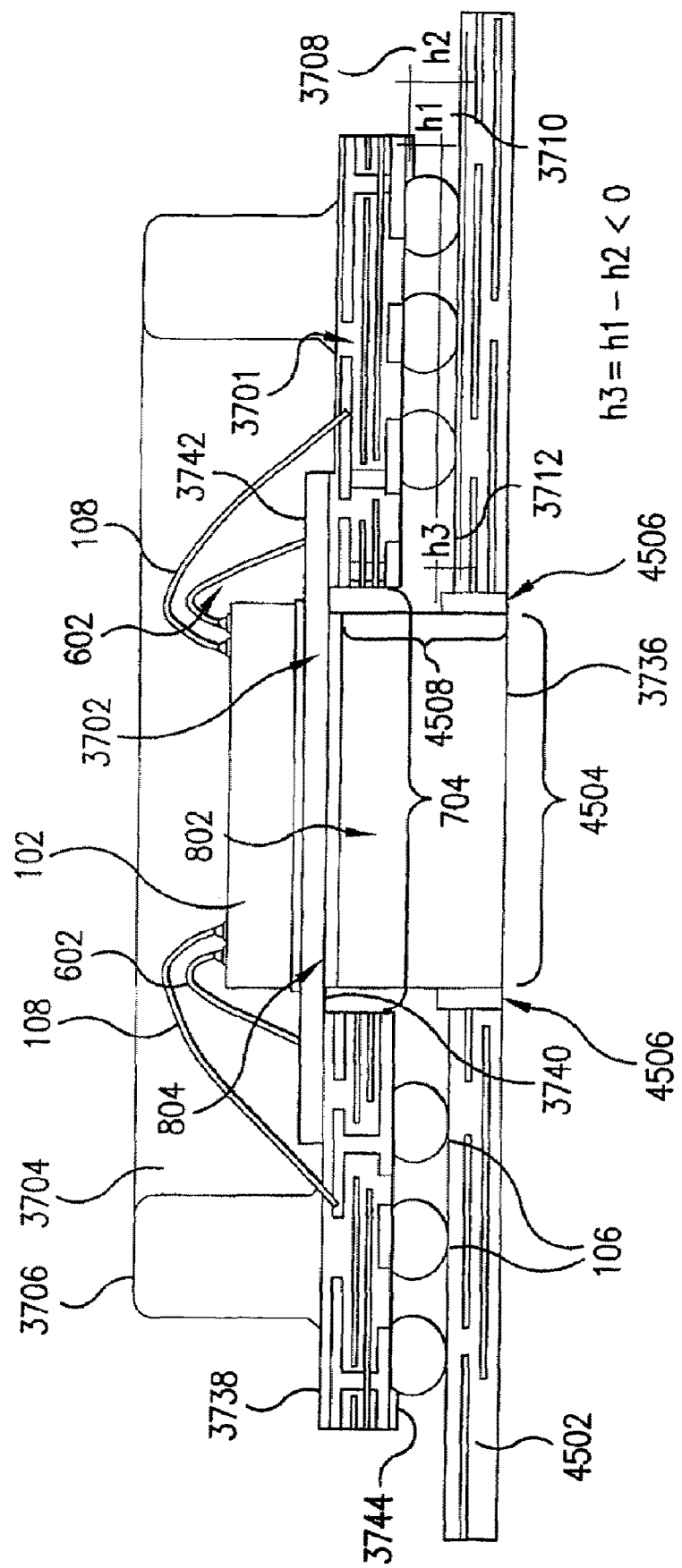

FIG. 45 illustrates a cross-sectional view of a die-up BGA package with ground/thermal connector that can extend into a PCB, according to an embodiment of the present invention.

FIGS. 46A-46F, 47A-47F, 48, and 49 show flowcharts providing operational steps for assembling one or more embodiments of the present invention.

FIGS. 50A, 50B, 51A, 51B, 52A, 52B, 53A, 53B, 54A, and 54B show views of PCBs with example land patterns, according to embodiments of the present invention.

FIGS. 55A and 55B show views of PCBs with example openings for accommodating thermal connectors, according to embodiments of the present invention.

Figure 56:
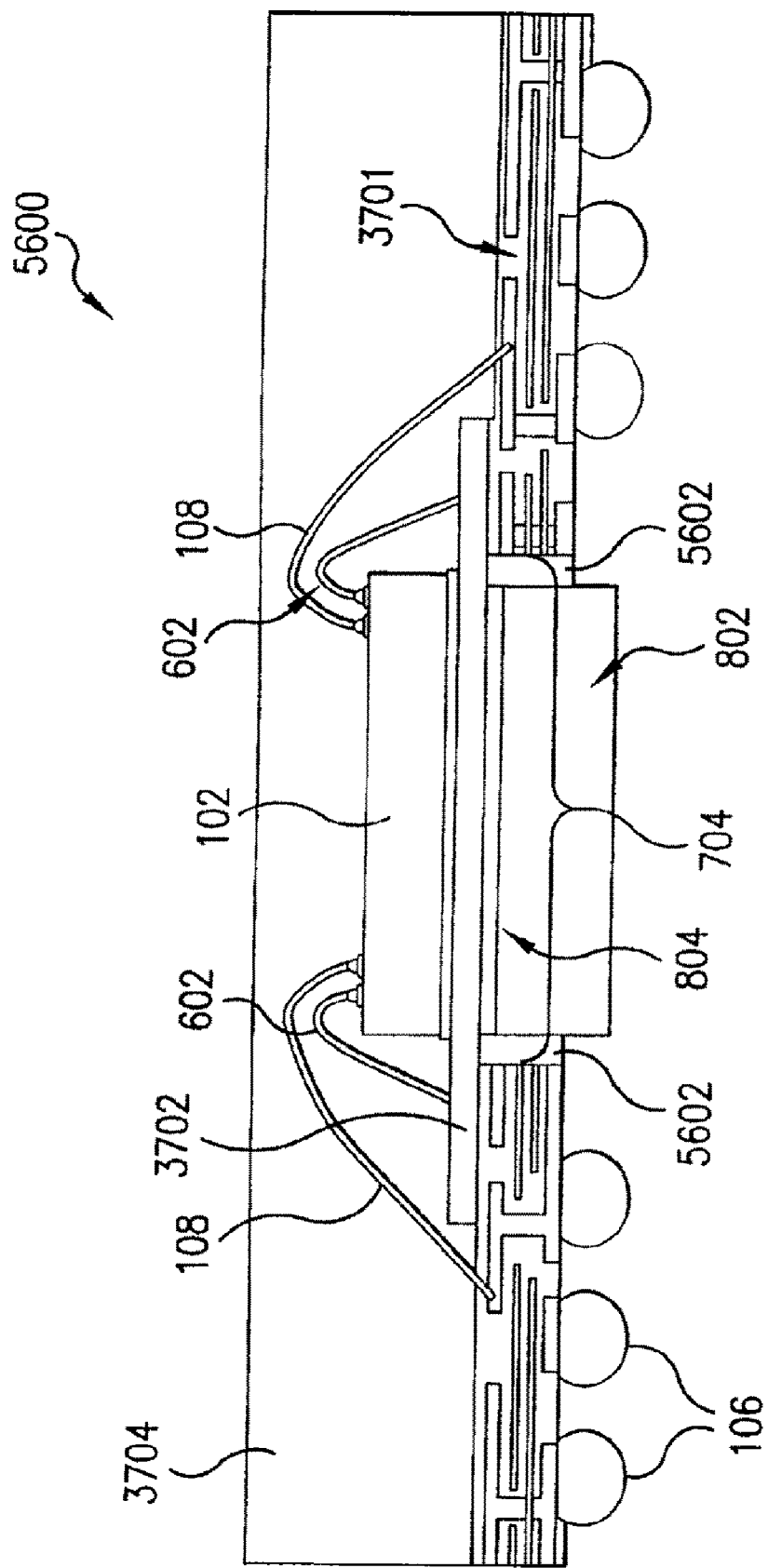

FIG. 56 shows a BGA package with seal ring, according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

The present invention is directed to a method and system for improving the mechanical, thermal, and electrical performance of BGA packages. The present invention is applicable to all types of BGA substrates, including ceramic, plastic, and tape (flex) BGA packages. Furthermore the present invention is applicable to die-up (cavity-up) and die-down (cavity-down) orientations.

Numerous embodiments of the present invention are presented herein. In a first embodiment, BGA package thermal stress at the IC die/stiffener interface is released or altered with the introduction of a heat spreader on the top surface of the IC die, enabling large size dies with high input and output (I/O) counts to be packaged using BGA technology. In a second embodiment, BGA package thermal resistance and the length of the current return path are reduced by introducing thermal/ground balls underneath or within close proximity of the IC die. In a third embodiment, the package thermal resistance and ground inductance are reduced by removing center solder balls, and enabling the attachment of a die pad to the PCB. The die pad is attached to the PCB with novel patternings of the metal stiffener, or by positioning a thermal/ground connector in between the IC die pad and the PCB. In a fourth embodiment, the package thermal resistance is reduced by attaching a metal ring to the top surface of a stiffener. In a fifth embodiment, the package thermal resistance is reduced by bridging the die pad to the outer regions of the stiffener with metal studs.

In further embodiments according to the present invention, the electrical performance of the BGA package is improved. In a sixth embodiment, electrical performance is improved by connecting ground bonds from the IC die to the stiffener. In such a configuration, the stiffener operates as a package ground plane. The package ground plane may be connected to PCB ground through either thermal/ground balls or thermal/ground connectors mentioned in embodiments above, and further described herein. In a seventh embodiment, package power distribution is enhanced by using a layer in a tape substrate as a power or ground plane.

In still further embodiments according to the present invention, plastic ball grid array (PBGA) package thermal and electrical performances are improved. In an eighth embodiment, replacing the center solder balls with a solid conductor reduces the package junction-to-board thermal resistance and package ground inductance of a PBGA package.

Ball grid array package types are described below. Further detail on the above described embodiments, and additional embodiments according to the present invention, are presented below. The embodiments described herein may be combined as required by a particular application.

Ball Grid Array (BGA) Package

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but cover the entire bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., *Ball Grid Array Technology*, McGraw-Hill, New York, (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

Figure 1A:
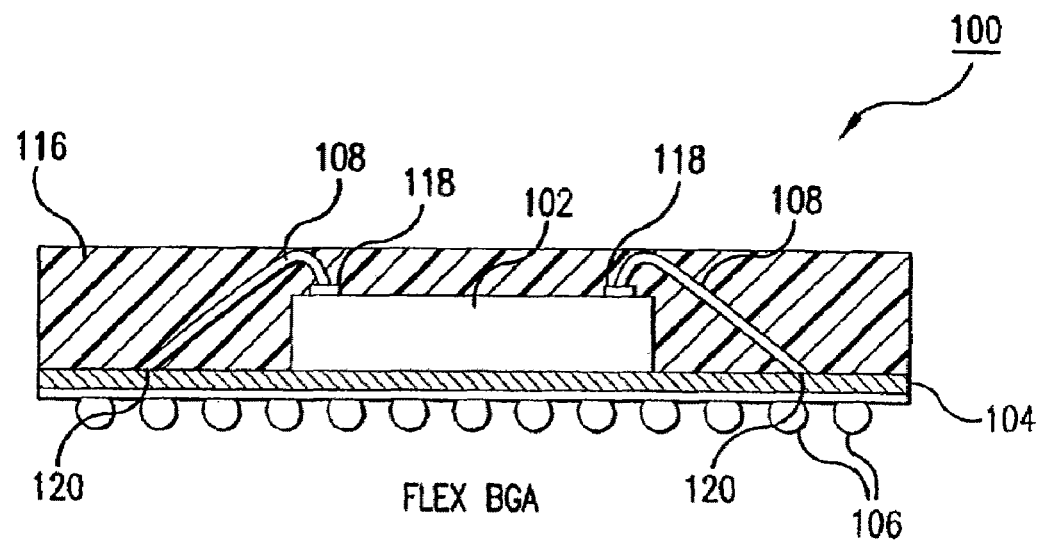
FIGS. 1A and 1B illustrate conventional flex BGA packages.

A number of BGA package substrate types exist, including ceramic, plastic (PBGA), and tape (also known as "flex") (for example, refer to Hayden, T. F., et al., *Thermal & Electrical Performance and Reliability Results for Cavity-Up Enhanced BGAs*, Electronic Components and Technology Conference, IEEE, pp. 638-644 (1999), which is incorporated herein by reference). FIG. 1A illustrates a conventional flex BGA package 100. Flex BGA package 100 includes an IC die 102, a tape substrate 104, a plurality of solder balls 106, and one or more wire bonds 108. Tape or flex BGA packages are particularly appropriate for large IC dies with large numbers of inputs and outputs, such as application specific integrated circuits (ASIC) and microprocessors.

Tape substrate 104 is generally made from one or more conductive layers bonded with a dielectric material. For instance, the dielectric material may be made from various substances, such as polyimide tape. The conductive layers are typically made from a metal, or combination of metals, such as copper and aluminum. Trace or routing patterns are made in the conductive layer material. Substrate 104 may be a single-layer tape, a two-layer tape, or additional layer tape substrate type. In a two-layer tape, the metal layers sandwich the dielectric layer, such as in a copper-Upilex-copper arrangement.

IC die 102 is attached directly to substrate 104, for example, by an epoxy. IC die 102 is any type of semiconductor integrated circuit.

One or more wire bonds 108 connect corresponding bond pads 118 on IC die 102 to contact points 120 on substrate 104.

An encapsulate, mold compound, or epoxy 116 covers IC die 102 and wire bonds 108 for mechanical and environmental protection.

Figure 1B:
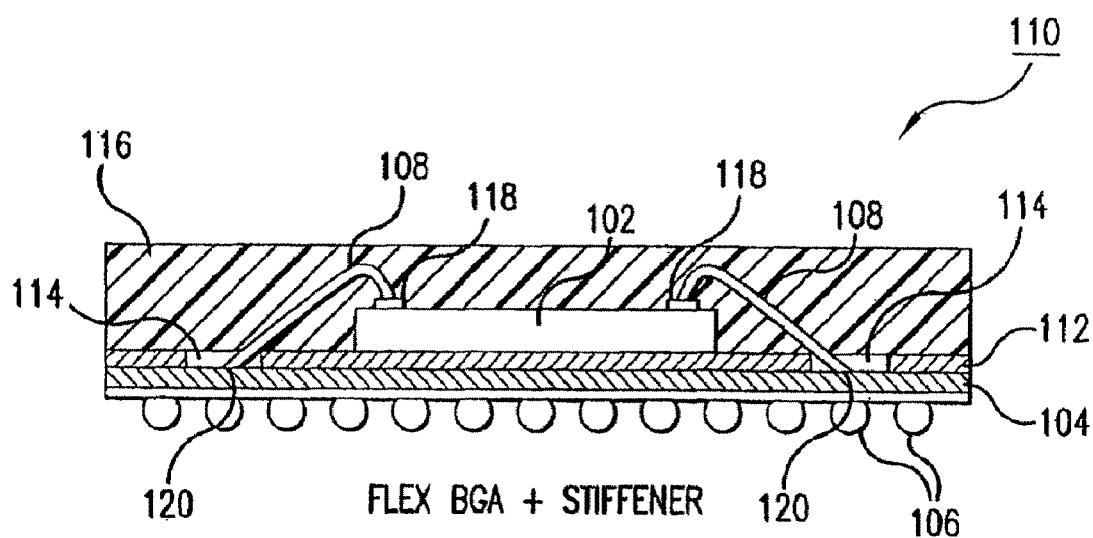

As shown in FIG. 1A, flex BGA package 100 does not include a stiffener. In some BGA package types, particularly in flex BGA packages, a stiffener can be attached to the substrate to add planarity and rigidity to the package. FIG. 1B illustrates a flex BGA package 110, similar to flex BGA package 100, that incorporates a stiffener 112. Stiffener 112 may be laminated to substrate 104. Stiffener 112 is typically made from a metal, or combination of metals, such as copper, tin, and aluminum, or may be made from a polymer, for example. Stiffener 112 also may act as a heat sink, and allow for greater heat spreading in BGA package 110. One or more openings 114 in stiffener 112 may be used to allow for wire bonds 108 to connect IC die 102 to substrate 104. Stiffener 112 may be configured in other ways, and have different opening arrangements than shown in FIG. 1B.

Figure 2A:
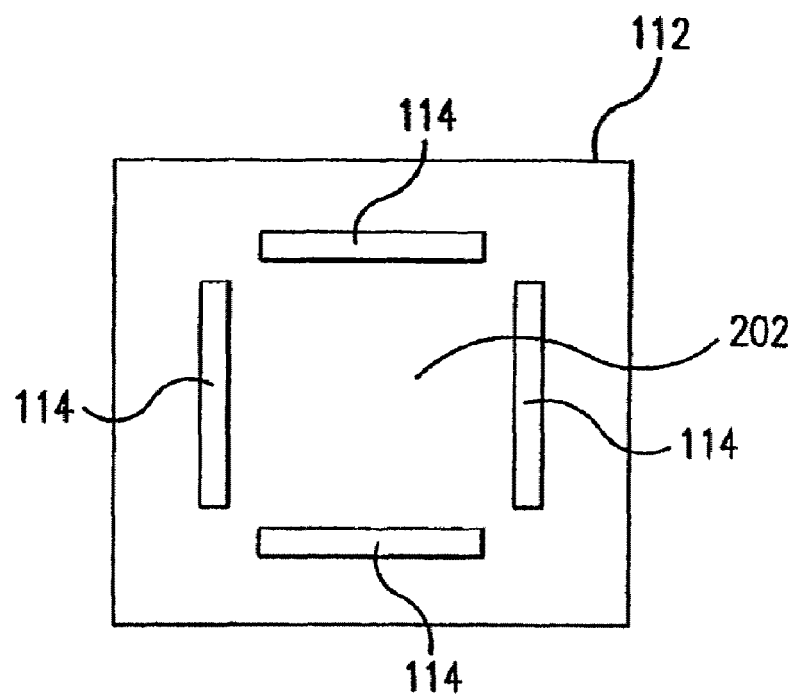
FIG. 2A shows a top view of a stiffener.
Figure 2B:
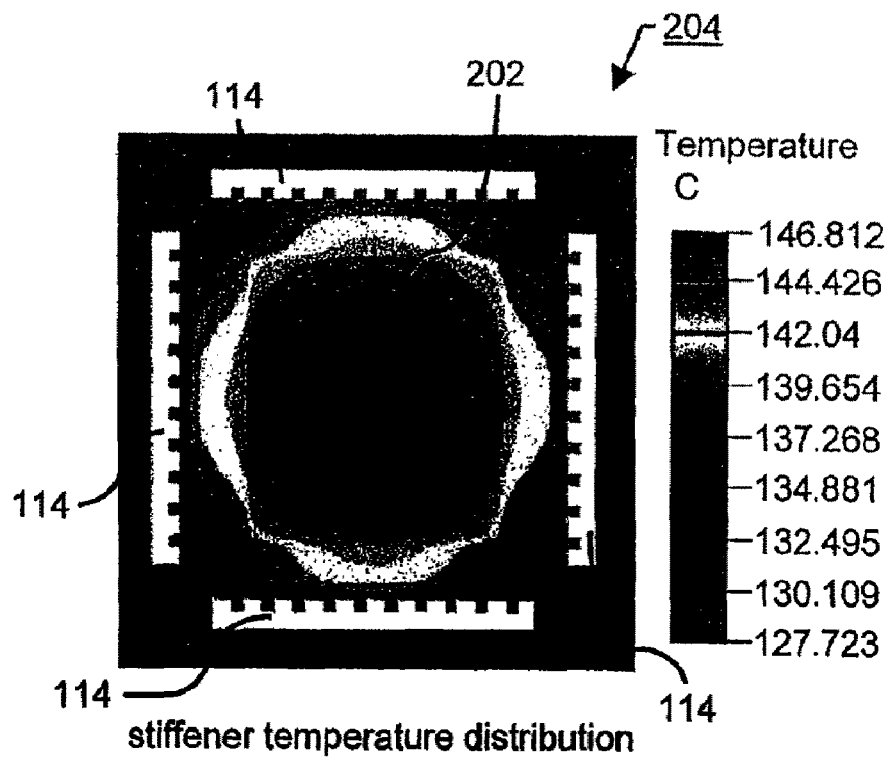
FIG. 2B shows a temperature distribution for a stiffener during operation of an IC device in a flex BGA package.

The use of a stiffener in a flex BGA package requires additional considerations when attempting to manage heat spreading. FIG. 2A shows a top view of a stiffener 112. Stiffener 112 includes an opening 114 adjacent to all four sides of an IC die mounting position 202 in the center of stiffener 112. FIG. 2B shows a temperature distribution 204 of a stiffener, such as stiffener 112, during operation of an IC die in a flex BGA package. Temperature distribution 204 shows that heat transfer from IC die mounting position 202 to the edges of stiffener 112 is substantially limited by openings 114. Openings 114 act as thermal barriers to heat spreading in stiffener 112.

Figure 2C:
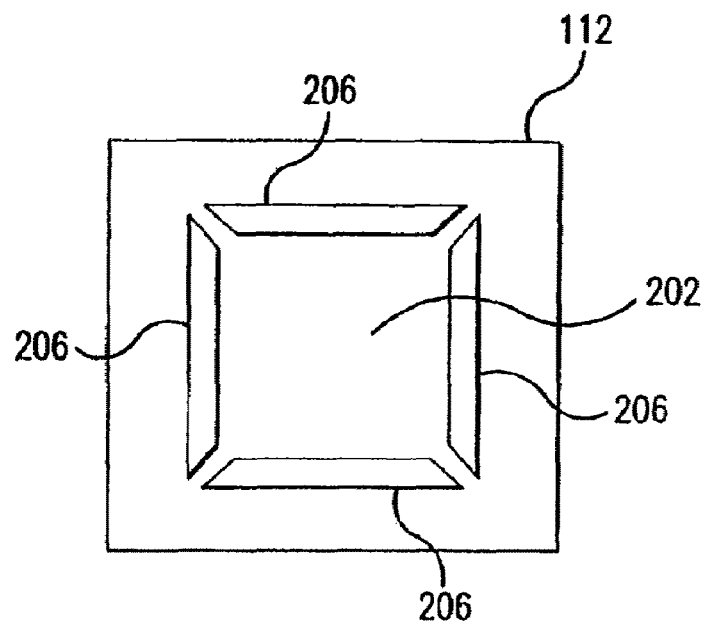
FIG. 2C shows a top view of an alternative stiffener configuration.

FIG. 2C shows a top view of an alternative configuration for stiffener 112, according to an embodiment of the present invention. Stiffener 112 includes an opening 206 adjacent to all four sides of an IC die mounting position 202 in the center of stiffener 112. Openings 206 are similar to openings 114 of FIG. 2A, but have a different shape. Further alternatively shaped openings in stiffener 112 are applicable to the present invention.

Figure 3:
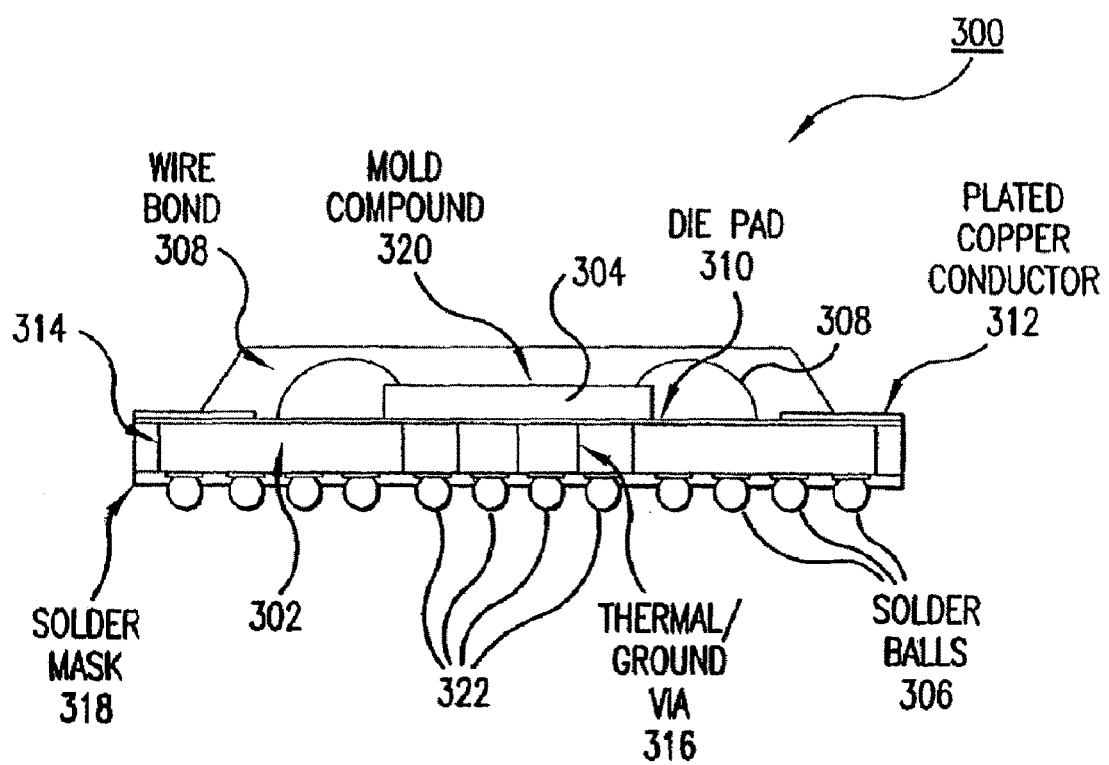
FIG. 3 shows a cross-sectional view of a conventional die-up plastic BGA package.

FIG. 3 shows a cross-sectional view of a conventional die-up PBGA package 300. PBGA package 300 includes a plastic substrate 302, an IC die 304, a plurality of solder balls 306, a plurality of wire bonds 308, a die pad 310, one or more vias 314, and one or more thermal/ground vias 316.

Plastic substrate 302 includes one or more metal layers formed on an organic substrate. For example, plastic or organic substrates may include materials such as "BT", which includes a resin called bis-maleimide triazine, and/or "FR-4," which is a fire-retardant epoxy resin-glass cloth laminate material, and/or other similar materials. IC die 304 is mounted to die pad 310. IC die 304 may be attached to die pad 310 with an epoxy, such as a silver-filled epoxy. Wire bonds 308 connect signals of IC die 304 to substrate 302. For instance, gold bonding wire is bonded from aluminum bond pads on IC die 304 to gold-plated contact pads on substrate 302. The contact pads on substrate 302 connect to solder balls 306 attached to the bottom surface of substrate 302, through vias 314 and routing within substrate 302 using copper conductors 312. Thermal/ground vias 316 connect die pad 310 to one or more thermal/ground balls 322 on the center bottom surface of substrate 302. An encapsulate, mold compound, or epoxy 320 covers IC die 304 and wire bonds 308 for mechanical and environmental protection.

Figure 12A:
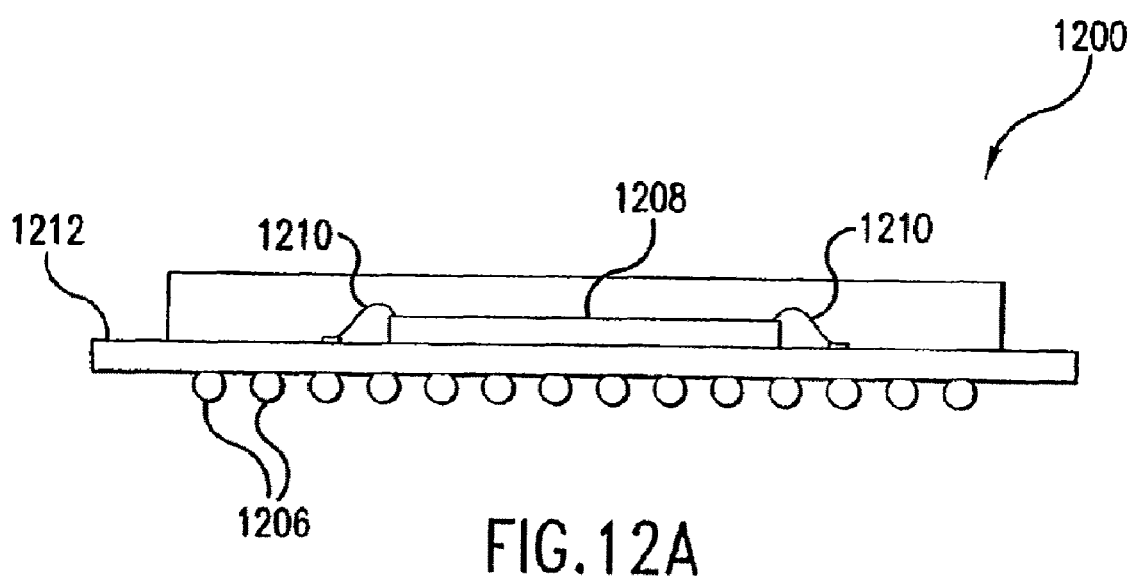
FIG. 12A illustrates a cross-sectional view of a die-up BGA package.
Figure 12B:
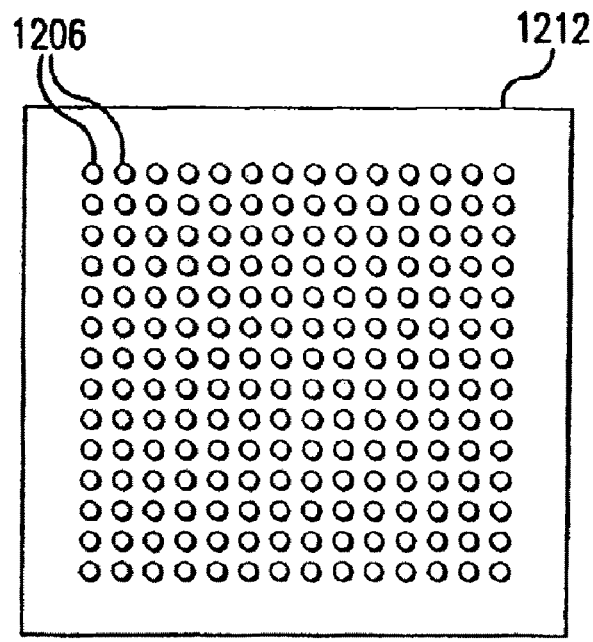
FIGS. 12B and 12C illustrate exemplary solder ball arrangements for the die-up BGA package of FIG. 12A.
Figure 12C:
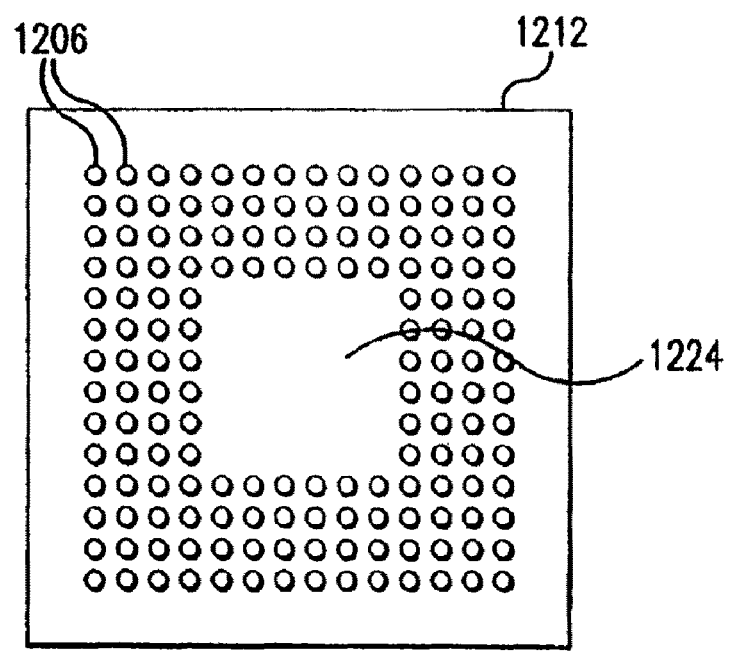

As described above, a BGA package includes an array of solder balls located on a bottom external surface of the package substrate. FIG. 12A illustrates a cross-sectional view of a die-up BGA package 1200. FIGS. 12B and 12C illustrate exemplary solder ball arrangements for die-up BGA package 1200. As shown in FIG. 12A, BGA package 1200 includes an IC die 1208 mounted on a substrate 1212. IC die 1208 is electrically connected to substrate 1212 by one or more wire bonds 1210. Wire bonds 1210 are electrically connected to solder balls 1206 underneath substrate 1212 through corresponding vias and routing in substrate 1212. The vias in substrate 1212 can be filled with a conductive material, such as solder, to allow for these connections. Solder balls 1206 are attached to substrate 1212, and are used to attach the BGA package to a PCB.

Note that although wire bonds, such as wire bonds 1210, are shown and described herein, IC dies may be mounted and coupled to a substrate with solder balls located on the bottom surface of the IC die, by a process commonly referred to as "C4" or "flip chip" packaging.

As shown in FIG. 12B, solder balls 1206 may be arranged in an array. FIG. 12B shows a 14 by 14 array of solder balls on the bottom surface of BGA package 1200. Other sized arrays of solder balls are also applicable to the present invention. Solder balls 1206 are reflowed to attach BGA package 1200 to a PCB. The PCB may include contact pads to which solder balls 1206 are bonded. PCB contact pads are generally made from a metal or combination of metals, such as copper, nickel, tin, and gold.

FIG. 12C shows a bottom view of BGA package 1200, with an alternative solder ball array arrangement. BGA package 1200 attaches an array of solder balls 1206 on a bottom surface of substrate 1212. As shown in FIG. 12C, solder balls 1206 are located in a peripheral area of the bottom surface of substrate 1212, away from a substrate center 1224. For example, solder balls 1206 on the bottom surface of substrate 1212 may be located outside an outer profile area of an IC die mounted on the opposite surface of substrate 1212. The solder ball array may be organized in any number of ways, according to the requirements of the particular BGA package application.

The solder ball arrangement shown in FIG. 12C is particularly applicable to embodiments of the present invention described below, such as for attaching a heat spreader or ground/thermal connector to a bottom surface of a BGA package. The heat spreader or ground/thermal connector may be connected in substrate center 1224.

Figure 13:
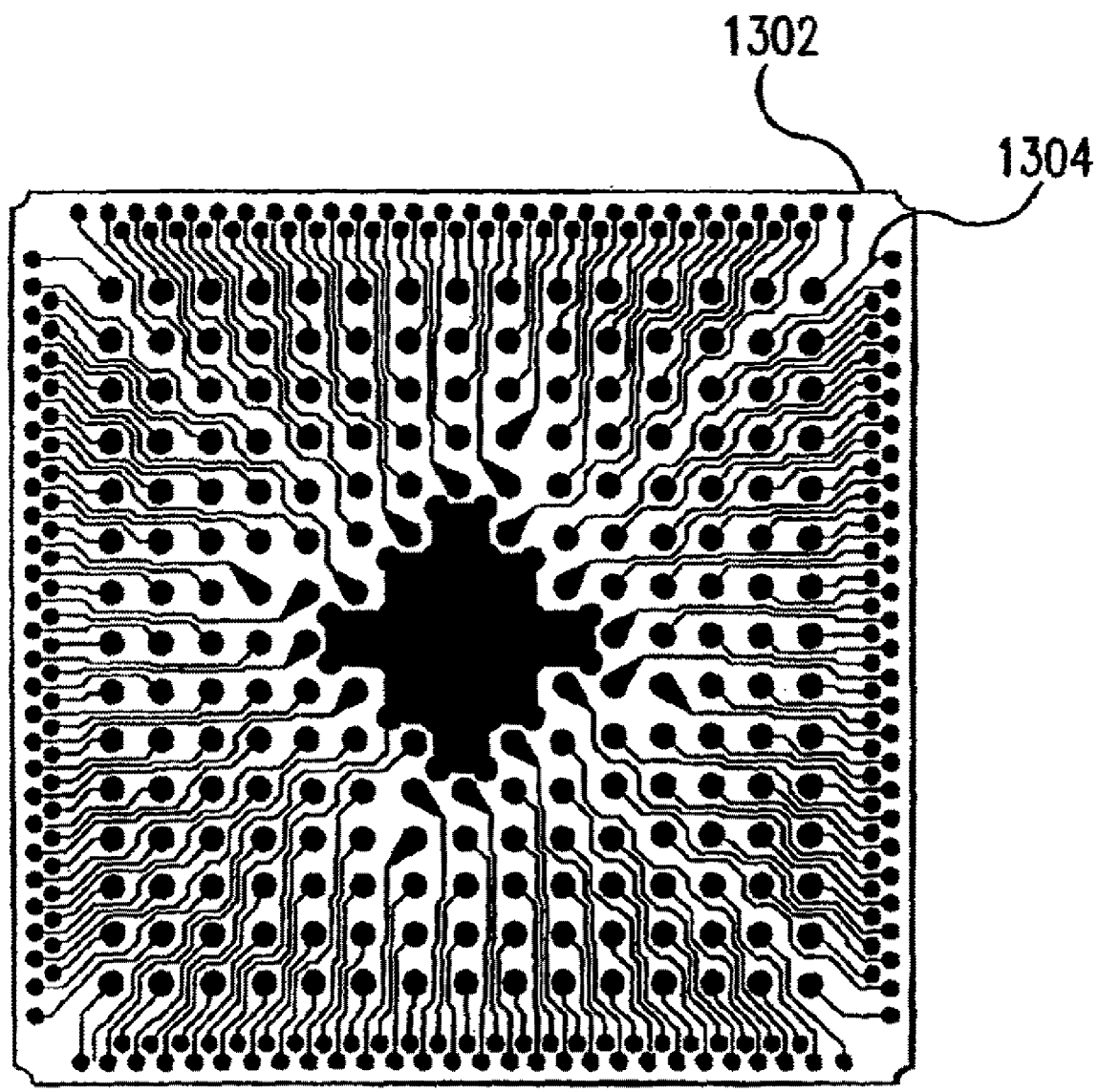
FIG. 13 shows exemplary routing in a substrate layer.

As described above, the BGA package substrate provides vias and routing on one or more layers to connect contact pads for wire bonds on its upper surface to solder balls attached to the bottom substrate surface. For illustrative purposes, FIG. 13 shows solder ball pads and routing 1304 in an example bottom substrate layer 1302.

The present invention is applicable to improving thermal and electrical performance in the BGA package types described herein, and further BGA package types.

BGA EMBODIMENTS ACCORDING TO THE PRESENT INVENTION

Further details of structural and operational implementations of ball grid array packages of the present invention are described in the following sections. These structural and operational implementations are described herein for illustrative purposes, and are not limiting. For instance, the present invention as described herein may be implemented in both die-up and die-down BGA package types, as well as other IC package types. Furthermore, each of the embodiments presented below are applicable to tape substrate BGA packages, plastic substrate BGA packages, and ceramic substrate BGA packages. The description below is adaptable to these and other package types, as would be understood to persons skilled in the relevant art(s) from the teachings herein. For instance, in plastic substrate BGA packages, and some tape BGA packages, a stiffener may not be required in the BGA package.

Features of each of the embodiments presented below may be incorporated into BGA packages independently, or may be combined in any manner, as would be apparent to persons skilled in the relevant art(s) from the teachings herein.

Drop-in Heat Spreader Embodiments

According to an embodiment of the present invention, a heat spreader may be used in a BGA package to provide for thermal stress relief and heat dissipation. In a preferred embodiment, a drop-in heat spreader is attached to the top surface of an IC die in a flex BGA package to provide for thermal stress relief and heat dissipation.

FIG. 4 illustrates a cross-sectional view of a die-up flex BGA package 400, according to an embodiment of the present invention. BGA package 400 includes IC die 102, substrate 104, plurality of solder balls 106, one or more wire bonds 108, stiffener 112, epoxy 116, a drop-in heat spreader 402, and an adhesive 404. Refer to the discussion above related to FIGS. 1A-1B for additional detail on the structure and operation of some of these elements.

Substrate 104 has a top surface to which a bottom surface of stiffener 112 is mounted. A bottom surface of substrate 104 attaches the plurality of solder balls 106. The plurality of solder balls 106 connect to vias and/or points on the bottom surface of substrate 104 to which signals internal to substrate 104 are routed and exposed.

Stiffener 112 has a top surface to which IC die 102 is mounted. In alternate embodiments, BGA package 400 does not require a stiffener, and does not include a stiffener 112. In such an alternate embodiment, IC die 102 is mounted to substrate 104.

One or more wire bonds 108 connect corresponding bond pads 118 on IC die 102 to contact points 120 on substrate 104. When a stiffener 112 is present, as shown in FIG. 4, wire bonds 108 extend through one or more openings 114 in stiffener 112 to form connections with substrate 104.

Heat spreader 402 is attached to the top surface (active surface) of IC die 102 using adhesive 404. Adhesive 404 may be an epoxy, an adhesive tape, or may be a different substance. Silver filled epoxies or thermally conductive tapes may be used for adhesive 404 to enhance heat extraction from IC die 102.

As shown in FIG. 4, heat spreader 402 is smaller in area than the upper surface of IC die 102. Alternative sizes for heat spreader 402 are also applicable to the present invention, including sizes equal to the area of IC die 102, or larger areas. Heat spreader 402 is shaped and configured to spread heat from IC die 102, as is required by the application.

As shown in FIG. 4, the top surface of heat spreader 402 forms a portion of a top surface of BGA package 400. Heat dissipation to the environment can be improved by exposing the top surface of heat spreader 402. Furthermore, in such a configuration, additional heat sinks may be attached to heat spreader 402. FIG. 5 show a cross-sectional view of an alternative BGA package 500, according to embodiments of the present invention, where a heat spreader 502 is internal to BGA package 500. Heat spreader 502 is completely encapsulated by epoxy 116.

By attaching heat spreader 402 to the top surface of IC die 102, the mechanical structure of BGA package 400 becomes more symmetrical in its center region, particularly when ground/thermal solder balls do not exist on the bottom surface of substrate 104 underneath the outer profile of IC die 102. Thermal stress at the interface of IC die 102 and stiffener 112 is substantially released or altered by heat spreader 402. Deformation caused by thermal stress in stiffener 112 and substrate 104 is substantially reduced through the use of heat spreader 402. Drop-in heat spreader 402 allows for even larger sizes for IC die 102 and greater I/O counts by providing for greater heat spreading capacity in BGA package 400.

Figure 14:
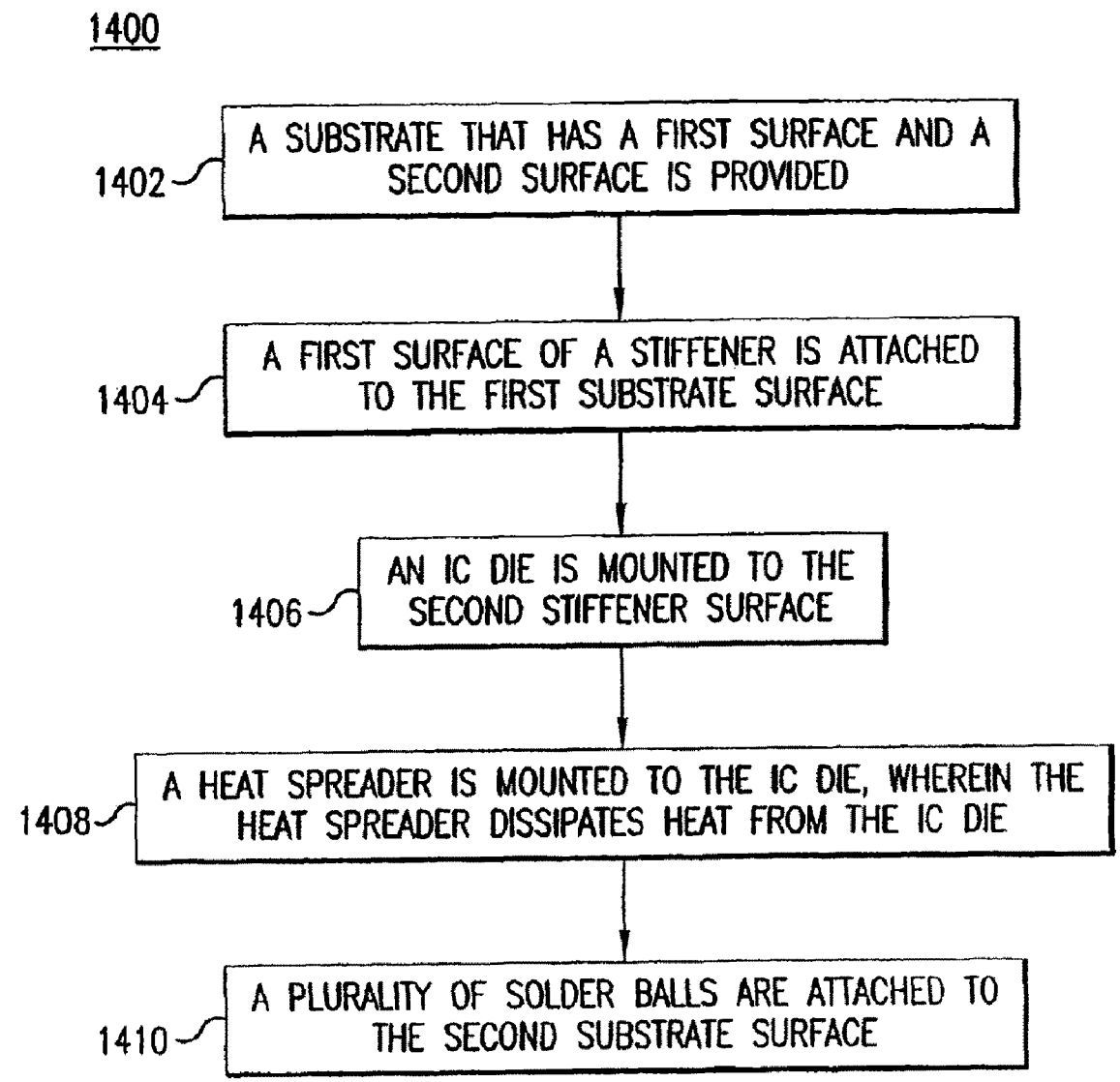
FIG. 14 shows a flowchart related to FIGS. 4 and 5, that provides operational steps of exemplary embodiments of the present invention.

FIG. 14 shows a flowchart 1400 providing operational steps for assembling one or more embodiments of the present invention. The steps of FIG. 14 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1400 begins with step 1402. In step 1402, a substrate that has a first surface and a second surface is provided. For example, the substrate is flex substrate 104, or another substrate type suitable for a BGA package. For example, an IC die mounting position and/or contact points are provided on a first, upper surface, and solder ball pads are provided on a second, bottom surface.

In step 1404, a first surface of a stiffener is attached to the first substrate surface. For example, the stiffener is stiffener 112, which is attached to substrate 104. In alternative embodiments, a stiffener is not required.

In step 1406, an IC die is mounted to the second stiffener surface. For example, the IC die is IC die 102, which is mounted to stiffener 112. In alternative embodiments, when a stiffener is not used, IC die 102 is mounted directly to the substrate.

In step 1408, a heat spreader is mounted to the IC die, wherein the heat spreader dissipates heat from the IC die. For example, the heat spreader is heat spreader 402 or 502, which is mounted with adhesive 404 or other attachment means to the upper surface of IC die 102. Heat spreader 402 or 502 typically is mounted to the center of the upper surface of IC die 102, and covers less than the entire upper surface of IC die 102. For instance, the smaller area of heat spreader 402 or 502 allows for bond pads 118 to be exposed on the upper surface of IC die 102 for wire bond connections. In alternative embodiments, heat spreader 402 or 502 is of the same size, or comprises a larger area than the upper surface of IC die 102.

In step 1410, a plurality of solder balls are attached to the second substrate surface. For example, the plurality of solder balls are plurality of solder balls 106, which connect to vias and/or solder ball pads on the bottom surface of substrate 104. The solder balls may be arranged on the bottom surface of substrate 104 as shown in FIGS. 12B and 12C, or in alternative arrangements. The solder balls are used to attach a BGA package to a PCB.

A benefit of performing the steps of flowchart 1400 is that the heat spreader relieves thermal stress at an interface of the IC die and the first stiffener surface.

Flowchart 1400 may include the additional step where the second stiffener surface is encapsulated. For instance, the second stiffener surface may be encapsulated by a resin or molding compound, that also encapsulates the IC die, heat spreader, and wire bonding.

Stiffener Ground Plane Embodiments

According to an embodiment of the present invention, electrical performance of an IC die, and thermal performance of a corresponding BGA package may be improved by allowing a stiffener to act as a ground plane. In a preferred embodiment, a stiffener in a die-up tape BGA (Flex BGA) package is coupled to PCB ground through one or more vias to ground solder balls. Ground contact pads of the IC die are connected to the stiffener by ground wire bonds. In a further aspect, one or more metal layers of a flex tape substrate may be coupled to a ground or power potential, to operate as a ground or power plane.

Figure 6:
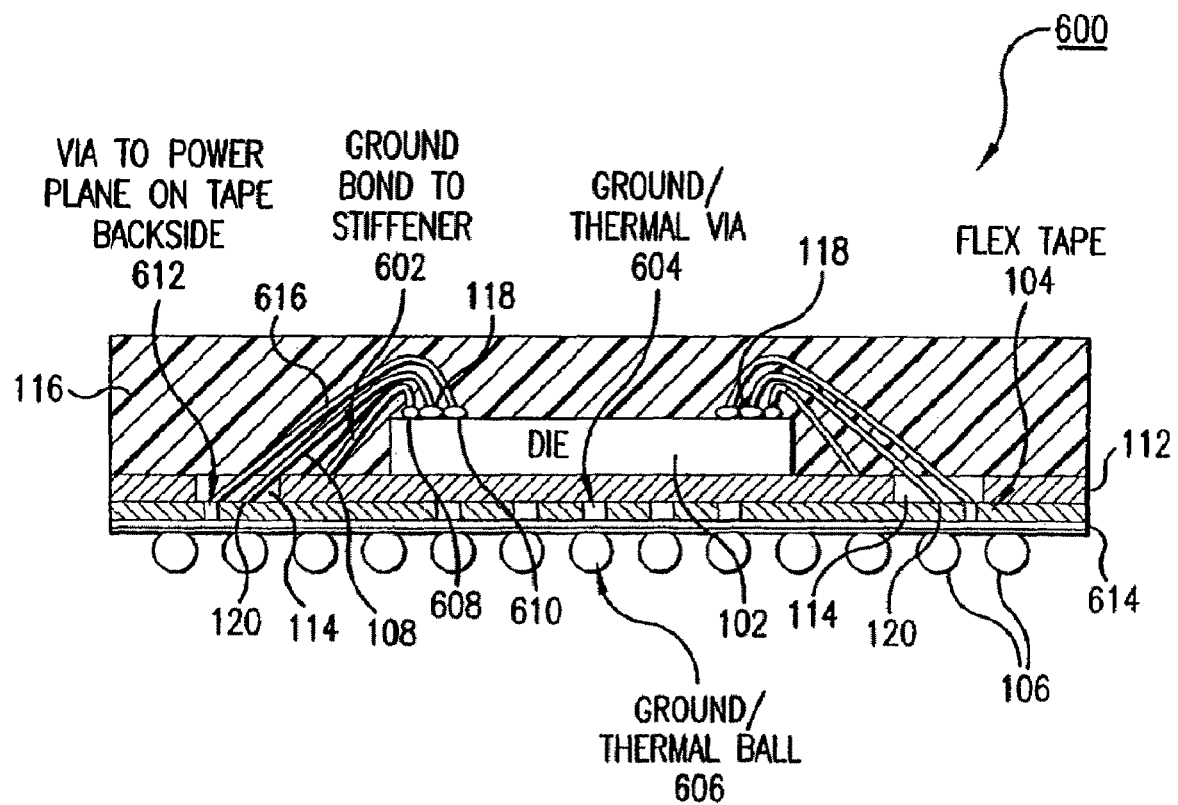
FIG. 6 illustrates a cross-sectional view of a die-up flex BGA package with stiffener ground plane, according to an embodiment of the present invention.

FIG. 6 illustrates a cross-sectional view of a die-up flex BGA package 600, according to an embodiment of the present invention. BGA package 600 includes IC die 102, substrate 104, plurality of solder balls 106, one or more wire bonds 108, stiffener 112, epoxy 116, one or more ground bonds to stiffener 602, one or more ground/thermal vias 604, one or more ground/thermal balls 606, one or more ground contact pads 608, one or more power contact pads 610, and one or more power vias 612.

Substrate 104 has a top surface to which a bottom surface of stiffener 112 is mounted. A bottom surface of substrate 104 attaches the plurality of solder balls 106. The plurality of solder balls 106 connect to vias and/or points on the bottom surface of substrate 104 to which signals internal to substrate 104 are routed and exposed.

Stiffener 112 has a top surface to which IC die 102 is mounted.

One or more wire bonds 108 connect corresponding bond pads 118 on IC die 102 to contact points 120 on substrate 104. Wire bonds 108 extend through one or more openings 114 in stiffener 112 to form connections with substrate 104.

IC die 102 has a top surface that includes at least one ground pad 608. Ground pad 608 is coupled to a ground potential signal in IC die 102. A ground wire bond 602 connects ground pad 608 to stiffener 112. The bottom surface of stiffener 112 is coupled to a ground potential signal in the PCB to which BGA package 600 is attached, to cause stiffener 112 to operate as a ground plane. Stiffener 112 is coupled to PCB ground through one or more of ground/thermal via 604 that extend through substrate 104. The one or more of ground/thermal vias 604 are located in substrate 104, underneath IC die 102, and can be filled with a conductive material, such as solder. A ground/thermal solder ball 606 is attached to each ground/thermal via 604 on the bottom surface of substrate 104. Ground/thermal solder ball 606 forms the connection to PCB ground, when reflowed to attach to the PCB. Each ground/thermal via 604 connects the respective ground/thermal solder ball 606 to stiffener 112 both electrically and thermally.

In a further embodiment, a tape substrate is configured such that a metal layer is used as a package power or ground plane. For instance, with a two-layer tape substrate, the bottom metal layer may be used as a power or ground plane.

In FIG. 6, PCB package 600 includes a bottom metal layer 614 of a two-layer tape substrate 104 that is coupled to a potential to operate as a power plane, according to an embodiment of the present invention. One or more power contact pads 610 on IC die 102 are coupled to a power potential signal in IC die 102. Power contact pad 610 on IC die 102 is connected to a corresponding power via 612 by a power wire bond 616. When a stiffener 112 is present, power wire bond 616 extends through opening 114. Power via 612 extends through substrate 104. Power via 612 can be filled with a conductive material, such as solder. Each power via 612 is coupled to the bottom metal layer 614 of substrate 104. Furthermore, one or more power vias 612 may be connected to corresponding solder balls on the bottom of substrate 104, to connect bottom metal layer 614 to PCB power pads when the solder balls are reflowed.

The introduction of a stiffener ground plane, and/or a power/ground plane using a metal layer of a tape substrate allows for very short power and ground connections. Current return path lengths are shortened, voltage drop across planes is reduced, and power/ground inductance is reduced. The shorter power and ground paths are also significant in reducing a power/ground path resistance, which advantageously reduces required IC device power levels.

For further description of the use of a thermal vias in a flex tape substrate, and of the use of a thermal ball coupled to a heat spreader in a die-down TBGA package, refer to U.S. Pat. No. 6,020,637, which is incorporated by reference in its entirety herein. For further description of the use of a thermal via and a thermal ball in a plastic substrate BGA package, refer to U.S. Pat. No. 5,894,410, which is incorporated by reference in its entirety.

Figure 15:
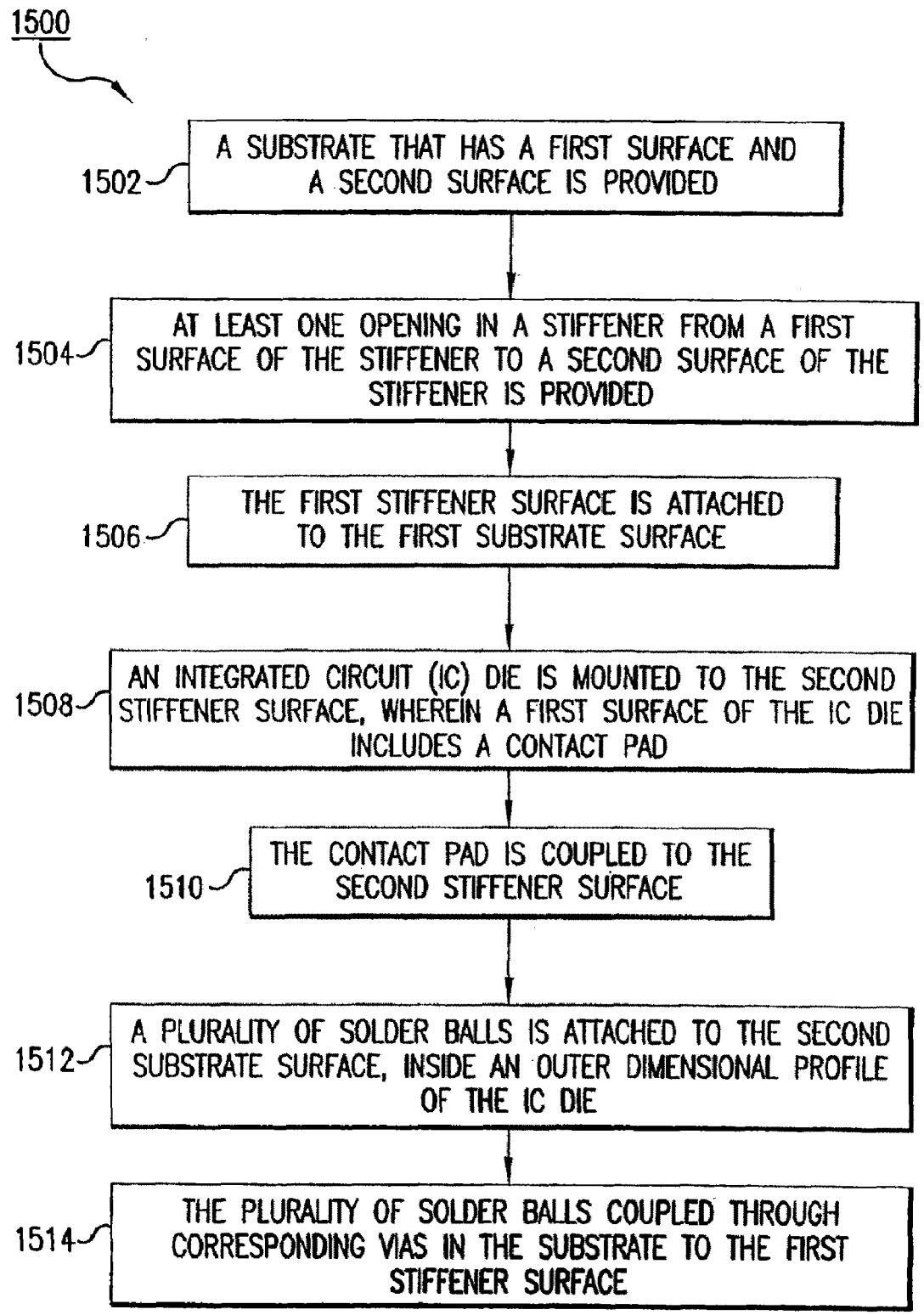
FIG. 15 shows a flowchart related to FIG. 6 that provides operational steps of exemplary embodiments of the present invention.

FIG. 15 shows a flowchart 1500 providing operational steps for assembling one or more embodiments of the present invention. The steps of FIG. 15 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1500 begins with step 1502. In step 1502, a substrate that has a first surface and a second surface is provided. For example, the substrate is flex substrate 104, or another substrate type suitable for a BGA package. For example, an IC die mounting position and/or contact points are provided on a first, upper surface, and solder ball pads are provided on a second, bottom surface.

In step 1504, at least one opening in a stiffener from a first surface of the stiffener to a second surface of the stiffener is provided. For example, the at least one opening includes openings 114 in stiffener 112. In a preferred embodiment, an opening 114 is located on each of the four edges of IC die 102.

In step 1506, the first stiffener surface is attached to the first substrate surface. For example, the stiffener is stiffener 112, which is attached to substrate 104. In alternative embodiments, a stiffener is not required, and is not attached to the substrate.

In step 1508, an integrated circuit (IC) die is mounted to the second stiffener surface, wherein a first surface of the IC die includes a contact pad. For example, the IC die is IC die 102, which is mounted to stiffener 112. In alternative embodiments, when a stiffener is not used, IC die 102 is mounted directly to the substrate. For example, the contact pad is ground contact pad 608.

In step 1510, the contact pad is coupled to the second stiffener surface. For instance, contact pad is ground contact pad 608, which is connected to stiffener 112 by ground wire bond 602. Ground wire bond 602 may be soldered, or otherwise attached to stiffener 112.

In step 1512, a plurality of solder balls is attached to the second substrate surface, inside an outer dimensional profile of the IC die. For example, the plurality of solder balls include one or more ground/thermal balls 606, which are arranged on the bottom surface of substrate 104 in the region of substrate center 1224, shown in FIG. 12C. The outer dimensional profile of the IC die is the area bounded by the edges of IC die 102.

In step 1514, the plurality of solder balls are coupled through corresponding vias in the substrate to the first stiffener surface. For example, the vias include ground/thermal via 604. The vias can be filled with a conductive material, such as solder, to allow the electrical connection of the solder balls to stiffener 112.

In a further embodiment according to flowchart 1500, the substrate includes a metal layer, wherein the metal layer is coupled to a second potential. The stiffener has at least one opening extending from the first stiffener surface to the second stiffener surface. The second IC die surface includes a second contact pad. The second contact pad is coupled to the metal layer through one of the openings in the stiffener and through a corresponding via that extends through the substrate. The second contact pad may be coupled to a power or ground potential in the IC die. For example, the second contact pad is power contact pad 610, the metal layer is metal layer 614, and the corresponding via is power via 612.

In an embodiment, flowchart 1500 may include an additional step, where the contact pad is coupled to a ground potential in the IC die. For example, the contact pad may be connected to a ground plane or ground signal in IC die that is routed to the contact pad.

Flowchart 1500 may include the additional step where the second stiffener surface is encapsulated. For instance, the second stiffener surface may be encapsulated by a resin or molding compound, that also encapsulates the IC die and wire bonding.

Flowchart 1500 may include the additional step where a second plurality of solder balls is attached to the second substrate surface, outside an outer dimensional profile of the IC die. For example, the second plurality of solder balls are plurality of solder balls 106, which connect to vias and/or solder ball pads on the bottom surface of substrate 104. The solder balls are arranged on the bottom surface of substrate 104 as shown in FIG. 12B, outside of substrate center 1224. The solder balls are used to attach a BGA package to a PCB.

Embodiments with Stiffener Coupled to a PCB

According to an embodiment of the present invention, electrical performance of the IC device, and thermal performance of a BGA package is improved by enabling an IC die pad to attach to a PCB. In an embodiment, the IC die pad is attached to the PCB by a novel patterning of the metal stiffener in a die-up tape BGA package. In an alternate embodiment, the IC die pad is attached to the PCB by placing a thermal/ground connector between the IC die pad and PCB in a die-up tape BGA package.

A BGA package junction-to-board thermal resistance can be substantially reduced by the attachment of a metal die-attach pad directly to a PCB. Metal die-attach pads are coupled to a PCB for package junction-to-board thermal resistance minimization in an exposed pad quad flat pack (QFP), a QFP with exposed heat sink at bottom, and a leadless plastic chip carrier (i.e. LPCC, QFN, SON, QLP) package, for instance. All existing such designs that involve an exposed die pad or an exposed heat sink at package bottom are "lead frame" packages. The present invention provides for an exposed die-attach pad or heat sink at the bottom of flex BGA packages.

FIG. 7 illustrates a cross-sectional view of a die-up flex BGA package 700, according to an embodiment of the present invention. BGA package 700 includes IC die 102, substrate 104, plurality of solder balls 106, one or more wire bonds 108, stiffener 112, epoxy 116, ground wire bond to stiffener 602, ground contact pad 608, and a stiffener cavity 702.

Substrate 104 has a top surface to which a bottom surface of stiffener 112 is mounted. A bottom surface of substrate 104 attaches the plurality of solder balls 106. The plurality of solder balls 106 connect to vias and/or points on the bottom surface of substrate 104 to which signals internal to substrate 104 are routed and exposed. Substrate 104 in FIG. 7 has a central window-shaped opening 704, under which solder balls are preferably not connected. FIG. 20 illustrates a bottom view of a substrate 104 that has a central window opening 704, according to an embodiment of the present invention.

Stiffener 112 has a top surface to which IC die 102 is mounted. Stiffener 112 in FIG. 7 is patterned with a cavity 702, which protrudes downward for attachment of IC die 102. As described above, a central window-shaped opening 704 exists in substrate 104. This opening 704 exists to allow stiffener 112 to protrude through, and make contact with soldering pads on a PCB to which BGA package 700 is to be mounted. The bottom exposed surface of cavity 702 can be plated with solder to facilitate surface mount to solder plated metal pads on a PCB to which BGA package 700 is mounted. Hence, stiffener 112 may act as a conduit for heat to be transferred from IC die 102 to the PCB.

Stiffener 112 may optionally be configured to operate as a ground plane. One or more ground pads 608 may be coupled to a ground potential signal in IC die 102. A ground wire bond 602 connects each ground pad 608 to stiffener 112. With one or more ground wire bonds 602 coupled to stiffener 602, the bottom exposed surface of cavity 702 may function both as an exposed ground pad of BGA package 700, and as an exposed heat spreader. As described above, the bottom exposed surface of cavity 702 may be plated with solder to allows stiffener 112 to be surface mounted to one or more soldering pads on the PCB. The pads on the PCB can be connected to a PCB ground plane to shorten the length of electrical current return paths, as well as to form a conductive heat dissipation path from BGA package 700 to the PCB.

Direct electrical and thermal connection from BGA package ground to a PCB ground plane is also possible by attaching a heat spreader between the stiffener and PCB. FIG. 8 illustrates a cross-sectional view of a die-up flex BGA package 700, according to an embodiment of the present invention. Substrate 104 in FIG. 8 has a central window-shaped opening, under which no solder balls are connected. A portion of the bottom surface of stiffener 112 is exposed through the central window-shaped opening 704 of substrate 104. A heat spreader (for example, manufactured from copper or aluminum), shown as ground/thermal connector 802, is coupled to the exposed portion of stiffener 112. Ground/thermal connector 802 can be made from the same material as stiffener 112. Material different from stiffener 112 may be used for ground/thermal connector 802 to compensate for the mismatch of thermal expansion coefficient between the die 102 and stiffener 112. Ground/thermal connector 802 may be laminated to the exposed portion of stiffener 112 using conductive epoxy or solder. The bottom surface of ground/thermal connector 802 may be plated with solder to facilitate its surface mount to soldering pads on the PCB. Metal pads on the PCB may be connected to a PCB ground plane to shorten the length of electrical current return paths, as well as enhance the conductive heat dissipation path from IC die 102 to the PCB. An advantage of this design is a high efficiency in the metal connector lamination process.

In a further embodiment, stiffener 112 and ground/thermal connector 802 may be manufactured from a single piece of metal, and hence consist of a single metal piece. FIG. 21 illustrates a side view of stiffener 112 that has a downward protruding portion 2102, according to an embodiment of the present invention. When stiffener 112 shown in FIG. 21 is attached to substrate 104, portion 2102 extends partially or entirely through window-shaped opening 704. Portion 2102 may be directly connected to the PCB, or may be connected to a ground/thermal connector 802 that is connected to the PCB. Because of the thermal and electrical improvement enabled by the coupling of stiffener 112 to a PCB, length of wire bonds can be reduced by moving opening 114 closer to the proximity of die 102 without compromising thermal performance significantly.

Figure 16A:
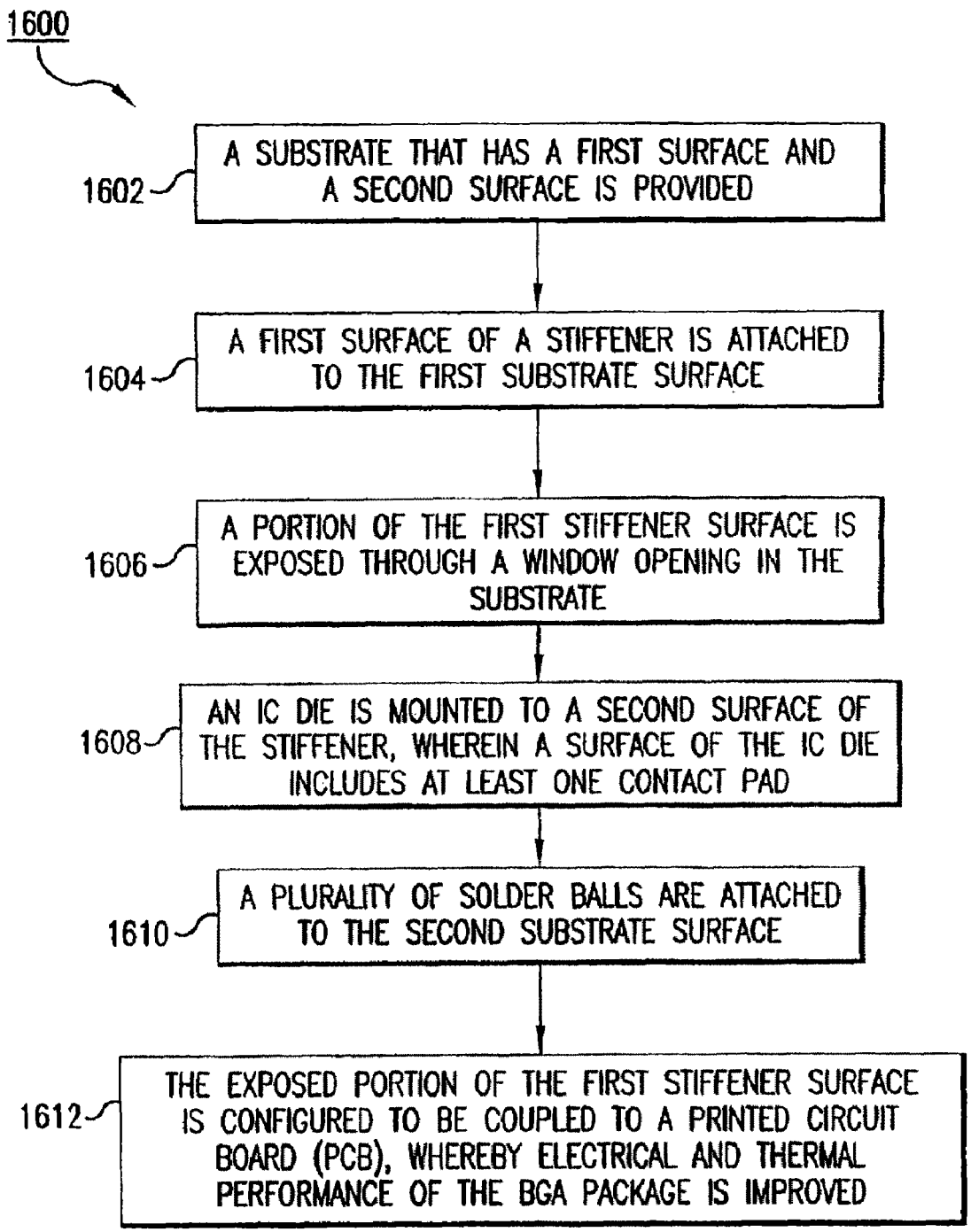
Figure 16B:
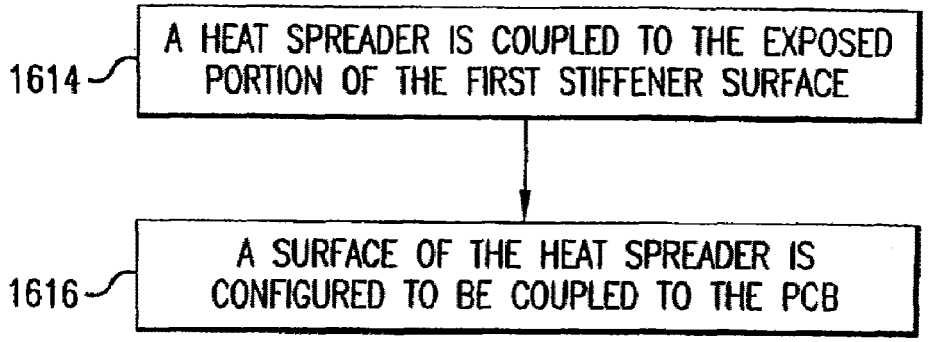
Figure 16C:
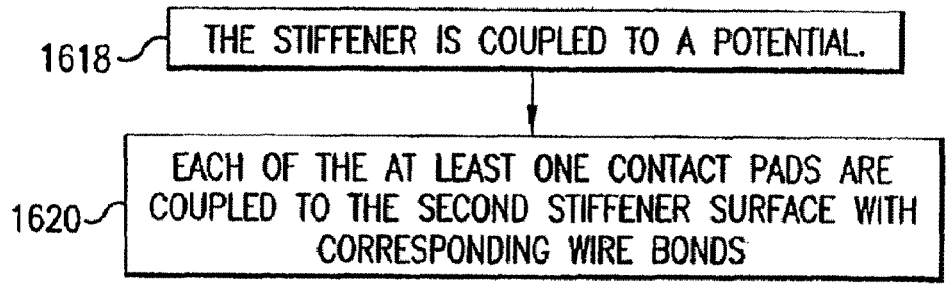
Figure 16D:
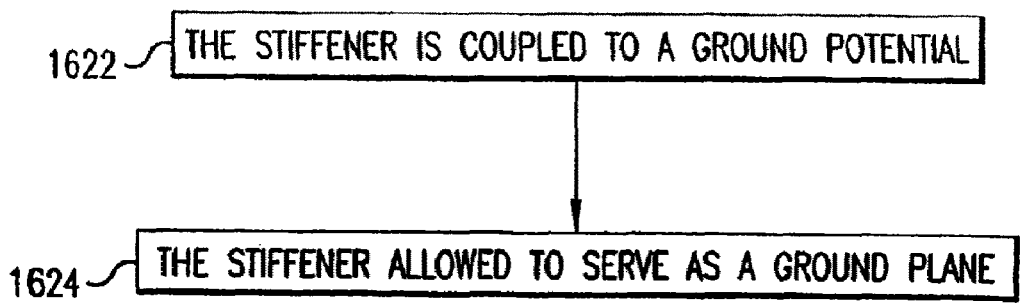

FIG. 16A shows a flowchart 1600 providing operational steps for assembling one or more embodiments of the present invention. FIGS. 16B-D provide operational steps according to further embodiments. The steps of FIGS. 16A-D do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1600 begins with step 1602. In step 1602, a substrate that has a first surface and a second surface is provided. For example, the substrate is flex substrate 104, or another substrate type suitable for a BGA package. For example, an IC die mounting position and/or contact points are provided on a first, upper surface, and solder ball pads are provided on a second, bottom surface.

In step 1604, a first surface of a stiffener is attached to the first substrate surface. For example, the stiffener is stiffener 112, which is attached to substrate 104.

In step 1606, a portion of the first stiffener surface is exposed through a window opening in the substrate. For example, substrate 104 has a window opening 704 in its center. A portion of the bottom surface of stiffener 112 is exposed through window opening 704.

In step 1608, an IC die is mounted to a second surface of the stiffener, wherein a surface of the IC die includes at least one contact pad. For example, the IC die is IC die 102, which is mounted to stiffener 112.

In step 1610, a plurality of solder balls are attached to the second substrate surface. For example, the plurality of solder balls are plurality of solder balls 106, which connect to vias and/or solder ball pads on the bottom surface of substrate 104. The solder balls are arranged on the bottom surface of substrate 104 as shown in FIG. 12B, exclusive of the area of window opening 704. The solder balls are used to attach a BGA package to a PCB.

In step 1612, the exposed portion of the first stiffener surface is configured to be coupled to a printed circuit board (PCB), whereby electrical and thermal performance of the BGA package is improved.

FIG. 16B provides exemplary steps for performing step 1612:

In step 1614, a heat spreader is coupled to the exposed portion of the first stiffener surface. For example, the heat spreader is ground/thermal connector 802, which is coupled to stiffener 112 through window opening 702.

In step 1616, a surface of the heat spreader is configured to be coupled to the PCB. In an embodiment, step 1612 further includes the step where the heat spreader surface is plated with solder to allow the heat spreader surface to be surface mounted to soldering pads on the PCB.

In an alternate embodiment, step 1612 comprises the step where the stiffener is shaped to have a centrally-located cavity shaped portion that protrudes through the window opening. In an embodiment, step 1612 further includes the step where a surface of the cavity shaped portion is plated with solder to allow the stiffener to be surface mounted to soldering pads on the PCB. For example, stiffener 112 is patterned with a cavity 702, which protrudes downward in window opening 704. The bottom surface of cavity 702 is plated with solder.

FIG. 16C provides additional exemplary steps for flowchart 1600 of FIG. 16A:

In step 1618, the stiffener is coupled to a potential. For example, the stiffener may be coupled to ground or power on the PCB. The bottom surface of cavity 702 may be coupled to the ground or power potential on the PCB, or ground/thermal connector 802 may make the connection to the PCB.

In step 1620, each of the at least one contact pads are coupled to the second stiffener surface with corresponding wire bonds.

FIG. 16D provides exemplary steps for performing step 1618:

In step 1622, the stiffener is coupled to a ground potential.

In step 1624, the stiffener allowed to serve as a ground plane.

Flowchart 1600 may include the additional step where the second stiffener surface is encapsulated. For instance, the second stiffener surface may be encapsulated by an epoxy, that also encapsulates the IC die and wire bonding.

Metal Ring Embodiments

According to an embodiment of the present invention, the mechanical and thermal performance of a BGA package is enhanced by attaching a metal ring to the top surface of the stiffener. In a preferred embodiment, a metal ring is attached to the top surface of the stiffener in a die-up tape BGA package.

FIG. 9A illustrates a cross-sectional view of a die-up tape BGA package 900, according to an embodiment of the present invention. BGA package 900 includes IC die 102, substrate 104, plurality of solder balls 106, one or more wire bonds 108, stiffener 112, epoxy 116, and a ring 902. FIG. 9B illustrates a top view of die-up tape BGA package 900, with ring 902.

Substrate 104 has a top surface to which a bottom surface of stiffener 112 is mounted. A bottom surface of substrate 104 attaches the plurality of solder balls 106. The plurality of solder balls 106 connect to vias and/or points on the bottom surface of substrate 104 to which signals internal to substrate 104 are routed and exposed.

One or more wire bonds 108 connect corresponding bond pads 118 on IC die 102 to contact points 120 on substrate 104. Wire bonds 108 extend through one or more openings 114 in stiffener 112 to form connections with substrate 104. Stiffener 112 has a top surface to which IC die 102 is mounted. Furthermore, ring 902 is attached to the top surface of stiffener 112. Ring 902 may be laminated to stiffener 112, after wire bonding is completed. Epoxy 116 is filled in and flushed to ring 902 after the attachment of ring 902. Ring 902 is preferably made of a metal, such as copper or aluminum, or a combination thereof, but may be constructed from other applicable materials. Preferably, ring 902 is made from the same material as stiffener 112, to minimize the mismatch of the thermal expansion coefficient. Ring 902 is preferably flush with the outer edges of stiffener 112 to form an outer edge of BGA package 900, but may also reside entirely within an outer profile of stiffener 112.

A primary benefit of attaching ring 902 to stiffener 112 is an increase in stiffness of BGA package 900. Ring 902 also aids in reducing the amount of warp of BGA package 900.

Furthermore, ring 902 promotes heat dissipation from stiffener 112, reduces junction-to-case thermal resistance, and facilitates the attachment of an external heat spreader to BGA package 900.

Furthermore, ring 902 enhances the process of encapsulation of the BGA package. Ring 902, with stiffener 112, creates a cavity that may be filled with a dispensed glob top or encapsulating material, that locks IC die 102 and surrounding elements in place.

FIG. 17 shows a flowchart 1700 providing operational steps for assembling one or more embodiments of the present invention. The steps of FIG. 17 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1700 begins with step 1702. In step 1702, a substrate that has a first surface and a second surface is provided. For example, the substrate is flex substrate 104, or another substrate type suitable for a BGA package. For example, an IC die mounting position and/or contact points are provided on a first, upper surface, and solder ball pads are provided on a second, bottom surface.

In step 1704, a first surface of a stiffener is attached to the first substrate surface. For example, the stiffener is stiffener 112, which is attached to substrate 104. In alternative embodiments, a stiffener is not required, and is not attached to the substrate.

In step 1706, an IC die is mounted to the first stiffener surface. For example, the IC die is IC die 102, which is mounted to stiffener 112. In alternative embodiments, when a stiffener is not used, IC die 102 is mounted directly to the substrate.

In step 1708, a plurality of solder balls are attached to the second substrate surface. For example, the plurality of solder balls are plurality of solder balls 106, which connect to vias and/or solder ball pads on the bottom surface of substrate 104. The solder balls may be arranged on the bottom surface of substrate 104 as shown in FIGS. 12B and 12C, or in alternative arrangements. The solder balls are used to attach a BGA package to a PCB.

In step 1710, a metal ring is attached to the first stiffener surface. Attaching the metal ring enhances heat dissipation from the stiffener. For example, the metal ring is ring 902. In alternative embodiments, when a stiffener is not used, ring 902 is attached directly to the substrate.

Flowchart 1700 may include the additional step where the second stiffener surface within the volume encompassed by the ring is encapsulated. For example, such a filled upper surface may be called a "glob top". For instance, this volume may be encapsulated by a resin or molding compound, that also encapsulates the IC die and wire bonding.

Embodiments Using Metal Studs to Bridge Stiffener Openings

According to an embodiment of the present invention, the thermal performance of a BGA package is improved by bridging an IC die pad to which the IC die is mounted to the outer regions of the stiffener. In a preferred embodiment, one or more metal studs are used as thermal bridges, to bridge the openings in the stiffener that surround the IC die, in a die-up tape BGA package.

The openings on a stiffener surface allow for wire bond connections between an IC die and a substrate. These openings have the additional effect of reducing the amount of heat that can spread to the outer surface regions of the stiffener, hampering the ability of the stiffener to act as a heat spreader. This effect is illustrated in FIG. 2B, which is further described above. To promote heat spreading according to the present invention, the stiffener is patterned such that one or more short studs run across each wire bond opening. More than one stud may be used to bridge each wire bond opening to promote heat spreading. The manufacturing process used for lead frame patterning may be adapted to pattern a stiffener with studs across the wire bond openings. The use of the studs, however, may reduce space for wire bonds, and may reduce BGA package I/O capability, in some situations.

FIG. 10A illustrates a stiffener 1000, that includes one or more studs 1002, according to an embodiment of the present invention. Stiffener 1000, having one or more studs 1002, may be incorporated into a BGA package in the same manner as is described elsewhere herein for stiffener 112. As shown in FIG. 10A, a stud 1002 bridges each opening 114 in stiffener 1000. In alternative embodiments, more than one stud 1002 per opening 114 may be used. Furthermore, each opening 114 may be bridged by a different number of studs 1002. Some of openings 114 may be bridged by one or more studs 1002, while other openings 114 may not be bridged at all.

FIG. 10B provides an illustration where IC die 102 is wire bound to substrate 104 through stiffener 1000, according to an embodiment of the present invention. One or more wire bonds 108 connect corresponding bond pads 118 on IC die 102 to contact points 120 on substrate 104. Wire bonds 108 avoid studs 1002 when making connections to substrate 104.

FIG. 18 shows a flowchart 1800 providing operational steps for assembling one or more embodiments of the present invention. The steps of FIG. 18 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1800 begins with step 1802. In step 1802, a substrate that has a first surface and a second surface is provided. For example, the substrate is flex substrate 104, or another substrate type suitable for a BGA package. For example, an IC die mounting position and/or contact points are provided on a first, upper surface, and solder ball pads are provided on a second, bottom surface.

In step 1804, a wire bond opening is created along each edge of an IC die mount position on a stiffener, wherein each wire bond opening extends through the stiffener. For example, the wire bond openings are wire bond openings 114 in stiffener 1000. The IC die mount position is IC die mounting position 202, shown in FIG. 10A.

In step 1806, a first surface of the stiffener is attached to the first substrate surface. For example, the stiffener is stiffener 1000, which is attached to substrate 104.

In step 1808, an IC die is mounted to a second surface of the stiffener. For example, the IC die is IC die 102, which is mounted to stiffener 1000, in IC die mounting position 202.

In step 1810, at least one of the wire bond openings are bridged with at least one stud. For example, one or more of wire bond openings 114 are bridged with one or more studs 1002. Studs 1002 allow for increased heat spreading across corresponding wire bond openings 114 to the outer edges of stiffener 1000.

In step 1812, a plurality of solder balls are attached to the second substrate surface. For example, the plurality of solder balls are plurality of solder balls 106, which connect to vias and/or solder ball pads on the bottom surface of substrate 104. The solder balls may be arranged on the bottom surface of substrate 104 as shown in FIGS. 12B and 12C, or in alternative arrangements. The solder balls are used to attach a BGA package to a PCB.

The flowchart 1800 may include the further step where a contact pad on the IC die is coupled to the substrate with a wire bond, wherein the wire bond passes through one of the wire bond openings in the stiffener.

Flowchart 1800 may include the additional step where the second stiffener surface is encapsulated. For instance, the second stiffener surface may be encapsulated by a resin or molding compound, that also encapsulates the IC die and wire bonding.

PBGA Thermal/Ground Connector Embodiments

According to an embodiment of the present invention, the electrical and thermal performance of a plastic BGA (PBGA) package is improved by attaching a thermal/ground connector to the bottom surface of a PBGA package. The thermal/ground connector couples the bottom center of a plastic substrate of a die-up PBGA to the PCB. Heat from an IC die is more easily spread to the PCB through the thermal/ground connector, which is attached to the plastic substrate underneath the IC die.

In the discussion above regarding FIG. 8, embodiments were described that used a ground/thermal connector to couple a flex BGA package to a PCB, to reduce package junction-to-board thermal resistance. Aspects of this discussion above are adaptable to other die-up BGA package types. These include BGA packages having an organic substrate, such as PBGA and fine pitch ball grid array (FBGA) packages. Further detailed description is provided in the following discussion that is applicable to BGA packages with organic substrates.

FIG. 11 illustrates a cross-sectional view of a die-up PBGA package 1100, according to an embodiment of the present invention. PBGA package 1100 includes plastic substrate 302, IC die 304, plurality of solder balls 306, plurality of wire bonds 308, die pad 310, one or more vias 314, one or more thermal/ground vias 316, epoxy 320, a ground/thermal connector 1102, adhesive material 1104, a plurality of ground bonds 1106, and a plurality of ground bond pads 1108.

IC die 304 is mounted to die pad 310. Wire bonds 308 connect signals of IC die 304 to contact pads on substrate 302. The contact pads on substrate 302 connect to solder balls 306 attached to the bottom surface of substrate 302, through vias 314 and routing within substrate 302.

Thermal/ground vias 316 connect die pad 310 to an exposed metal plane 1110 at the bottom center of substrate 302. For instance, die pad 310 and metal plane 1110 may be exposed copper pads of plastic substrate 302.

Solder balls are not attached to the bottom region of substrate 302 covered by metal plane 1110. Ground/thermal connector 1102 is attached to metal plane 1110. For instance, ground/thermal connector 1102 may be a metal piece (copper or aluminum, for example) that is laminated to metal plane 1110 at the bottom center of substrate 302 using a conductive adhesive material 1104, such as a conductive epoxy, solder, or other adhesive material. A bottom surface 1112 of ground/thermal connector 1102 may be plated with solder for surface mount to soldering pads on the PCB.

BGA package 1100 provides a thermal path of IC die 304, to die pad 310, to thermal/ground vias 316, to metal plane 1110, to adhesive material 1104, to ground thermal connector 1102 (and bottom surface 1112) to the PCB soldering pads. Heat spreading is improved by a direct thermal path from IC die 304 to the PCB.

Metal pads on the PCB can be connected to a PCB ground plane to advantageously shorten the length of electrical current return paths, as well shorten the conductive heat dissipation path from device junctions of IC die to the PCB.

Ground bonds 1106 may be used to couple ground bond pads 1108 on IC die 304 to die pad 310, when die pad 310 is coupled to ground. This provides for very short ground connections for signals in IC die 304.

FIG. 19A shows a flowchart 1900 providing operational steps for assembling one or more embodiments of the present invention. FIGS. 19B-C provide operational steps according to further embodiments. The steps of FIGS. 19A-C do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1900 begins with step 1902. In step 1902, a substrate that has a first surface and a second surface is provided. For example, the substrate is plastic substrate 302, or another substrate type suitable for a BGA package. For example, an IC die mounting position and contact points are provided on a first, upper surface, and solder ball pads are provided on a second, bottom surface.

In step 1904, an IC die is mounted to the first substrate surface. For example, the IC die is IC die 304, which is mounted to substrate 302. IC die 304 may be mounted to a die pad 310 attached to substrate 302.

In step 1906, a plurality of solder balls are attached to the second substrate surface. For example, the plurality of solder balls are plurality of solder balls 306, which connect to vias and/or solder ball pads on the bottom surface of substrate 302. The solder balls may be arranged on the bottom surface of substrate 302 as shown in FIG. 12B, or in other arrangements. The solder balls are used to attach a BGA package to a PCB.

In step 1908, a first surface of a heat spreader is coupled to the second substrate surface. For example, the heat spreader is ground/thermal connector 1102, which is coupled to substrate 302 with adhesive material 1104. Ground/thermal connector 1102 may be mounted to metal plane 1110 on substrate 302 by adhesive material 1104.

In step 1910, a second surface of the heat spreader is configured to be coupled to a printed circuit board (PCB). Second heat spreader surface is bottom surface 1112. In an embodiment, step 1910 may include the step where the second surface of the heat spreader is plated with solder.

Flowchart 1900 may comprise the additional step where the first substrate surface is coupled to the heat spreader through at least one via that extends through the substrate. For example, the first substrate surface may be coupled to the heat spreader by one or more ground/thermal vias 316.

FIG. 19B provides exemplary steps for performing step 1904:

In step 1912, a copper plated die-attach pad is exposed in the center of the first substrate surface. The copper plated die-attach pad, die pad 310, may be an exposed portion of a metal layer of plastic substrate 302.

In step 1914, the IC die is mounted to the copper plated die-attach pad. For example, the IC die may be mounted with an epoxy.

FIG. 19C provides exemplary steps for performing step 1908:

In step 1916, a copper plated plane is exposed in the center of the second substrate surface. The copper plated plane, metal plane 1110, is an exposed portion of a metal layer of plastic substrate 302.

In step 1918, the die-attach pad is coupled to the copper plated plane with at least one via.

Flowchart 1900 may include the additional step where the first substrate surface is encapsulated. For instance, the first substrate surface may be encapsulated by a resin or molding compound, that also encapsulates the IC die and wire bonding.

Example PBGA Thermal/Ground Connector Embodiments

Additional description for exemplary embodiments of die-up PBGA package 1100 are described in this section. FIG. 22 illustrates a cross-sectional view of a portion of die-up PBGA package 1100, according to an embodiment of the present invention. PBGA package 1100 includes plastic substrate 302, IC die 304, plurality of solder balls 306, one of the plurality of wire bonds 308, epoxy 320, ground/thermal connector 1102, adhesive material 1104, metal plane 1110, a connector plating 2202, and plurality of solder ball contact pads 2224 (vias 314 and 316, ground bonds 1106, and pads 310 and 1108 are not shown in FIG. 22). PBGA package 1100 is substantially configured as described above, and as further described below. Also shown in FIG. 22 is a cross-sectional view of a portion of an exemplary printed circuit board (PCB) 2222, according to an embodiment of the present invention. PCB 2222 includes a PCB substrate 2212, a PCB metal pad plating 2214, a PCB metal pad 2216, and plurality of solder ball contact pads 2226. Under normal operating conditions, PBGA package 1100 is attached to PCB 2222 in order for IC die 304 to be interfaced with an electronic circuit system.

In the configuration of package 1100 shown in FIG. 22, IC die 304 is mounted to substrate 302. Wire bond 308 connects one or more signals of IC die 304 to contact pads (not shown) on the top surface of substrate 302. These contact pads connect through substrate 302 to solder ball contact pads 2224 exposed through the solder mask on the bottom surface of substrate 302. Solder balls 306 attach to solder ball contact pads 2224.

Ground/thermal connector 1102 is attached to metal plane 1110. Metal plane 1110 is a portion of a metal layer of substrate 302 exposed though the solder mask on the bottom surface of substrate 302. As described above, ground/thermal connector 1102 may be a metal piece or slug (copper or aluminum, for example) similar to the heat spreaders described elsewhere herein, that is laminated to metal plane 1110 at the bottom center of substrate 302 using a conductive adhesive material 1104, such as a conductive epoxy, solder, or other adhesive material. A bottom surface 1112 of ground/thermal connector 1102 may be plated with a metal (including a metal alloy), such as a solder, which may include palladium, nickel, tin, gold, silver, lead and/or further related substance(s), to form connector plating 2202. Connector plating 2202 enhances the surface mounting of connector 1102 to PCB 2222.

The top surface of PCB substrate 2212 includes solder ball contact pads 2226 for surface mount of solder balls 306 to PCB 2222, and includes PCB metal pad 2216 for surface mount of connector 1102 to PCB 2222. PCB metal pad plating 2214 may be attached to PCB metal pad 2216 to enhance the surface mounting of connector 1102 to PCB metal pad 2216. For example, PCB metal pad 2216 may be screen printed with a solder paste to form PCB metal pad plating 2214. PCB metal pad plating 2214 also may be formed in other known manners from processes and substances described herein or elsewhere.

Heat spreading is improved in package 1100 by a direct thermal path from IC die 304 through connector 1102 to PCB 2222. Furthermore, PCB metal pad 2216 on PCB 2222 can be connected to a PCB ground plane to advantageously shorten the length of electrical current return paths, as well shorten the conductive heat dissipation path from device junctions of IC die 304 to PCB 2222. As described above, vias may be created in substrate 302, and filled with a conductive material, to enhance thermal and electrical performance by coupling IC die 304 to connector 1102 more directly.

Example implementations for package 1100 and PCB 2222 according to the present invention will now be described. These implementations are provided for purposes of illustration, and are not intended to limit the scope of the invention. Alternate implementations, differing slightly or substantially from those described herein, will be apparent to persons skilled in the relevant art(s) based on the teachings contained herein. Such alternate implementations fall within the scope and spirit of the present invention.

FIG. 22 illustrates various dimensions of package 1100 and PCB 2222. For package 1100, the following dimensions are shown: an adhesive material height 2204, a connector height 2206, a connector plating height 2208, a solder ball height 2218, and a ball pitch 2220. For PCB 2222, a PCB metal pad plating height 2210 is shown. These dimensions of package 1100 and PCB 2222 may have a variety of values, according to the present invention.

In an example implementation, ground/thermal connector 1102 may be attached to metal plane 1110 on substrate 302 by adhesive material 1104 that has an adhesive material height 2204 in the range of 1 to 1.5 mil (0.025 to 0.0375 mm). Connector 1102 has a connector height 2206 equal to 0.38 mm. Connector plating 2202 has a connector plating height 2208 equal to 1 mil (0.025 mm). According to these example height values, the sum of adhesive material height 2204 (using a value of 0.025 mm), connector height 2206, and connector plating height 2208 is 0.43 mm.

Furthermore, prior to attachment to substrate 302, solder balls 306 may have a height of 0.6 mm, for example. Ball pitch 2220, which represents the distance from the center of a solder ball mounted to substrate 302 to the center of an adjacent solder ball, is equal to 1 mm, for example. When attached to substrate 302, the height of solder balls 306 may decrease slightly, to have a solder ball height 2218 equal to 0.5 mm, for example. This decrease in height is due to the spreading of solder of the solder ball onto a solder ball pad 2224 to which it is attaching. In this example configuration, therefore, the difference in height between the solder ball height 2218 (0.5 mm) and the sum of adhesive material height 2204, connector height 2206, and connector plating height 2208 (0.43 mm) is equal to 0.07 mm, which is the value of a gap distance. When package 1100 is attached to PCB 2222, this gap distance appears between connector plating 2202 and PCB 2222. In this example implementation, the gap distance may vary between 2.0 to 4.0 mils (0.05 to 0.1 mm), or even outside of this range, due to variations in the actual height values recited above that occur during the manufacturing process.

As described above, the dimensions shown in FIG. 22 and described above may have values that are different from those presented above. In an embodiment, solder ball height 2218 is greater than the height of the attached connector 1102 (including connector height 2206, adhesive material height 2204, and connector plating height 2208, when present), although in alternative embodiments, the attached connector 1102 may have an equal height.

As described above, PCB metal pad plating 2210 may be formed on PCB metal pad 2216. PCB metal pad plating 2210 substantially bridges the above described gap distance, and enhances the connection of connector 1102 to PCB 2222. For example, PCB metal pad plating 2214 may be formed such that PCB metal pad plating height 2210 is in the range of 4 to 6 mil (0.1 to 0.15 mm) to substantially fill the gap distance.

In another example configuration, ball pitch 2220 may be equal to 1.27 mm and solder ball height 2218 may be equal to 0.75 or 0.76 mm. In further implementations, these dimensions may have other values. As described above, the dimension values provided in the section are examples, and are not limiting to the present invention.

Furthermore, ground/thermal connector 1102 may be shaped in additional ways, to enhance the operation and manufacturability of package 1100. FIG. 23 shows ground/thermal connector 1102 attached to a bottom surface of substrate 302, according to an exemplary embodiment of the present invention. Connector 1102 is attached to metal plane 1110, and is plated with connector plating 2202. As shown in FIG. 23, connector 1102 may be rectangular in shape. Ground/thermal connector 1102 may be formed in other shapes, such as an ellipse, polygon, star-shaped, and irregular.

Furthermore, in the example embodiment shown in FIG. 23, connector 1102 is smaller in area than metal plane 1110. In alternative embodiments, connector 1102 may have the same area, or a greater area than metal plane 1110.

Ground/thermal connector 1102 may also include two or more separate sub-sections that are attached to package 1100. FIG. 24 shows first and second ground/thermal connectors 2402 and 2404 attached to a bottom surface of substrate 302, according to an exemplary embodiment of the present invention. Connector plating, which may be present on first and second ground/thermal connectors 2402 and 2404, is not shown in FIG. 24. First ground/thermal connector 2402 is attached to first metal plane 2406 on substrate 302. Second ground/thermal connector 2404 is attached to second metal plane 2408 on substrate 302. In alternative embodiments, first and second metal planes 2406 and 2408 may be combined into a single metal plane, or may be each divided into any number of metal planes, for attachment of first and second ground/thermal connectors 2402 and 2404 to substrate 302. Furthermore, one or more PCB metal pads may be present on PCB substrate 2212 (shown in FIG. 22) to attach first and second ground/thermal connectors 2402 and 2404 to PCB 2222.

The use of more than one ground/thermal connector, as shown in FIG. 24, may enhance the functionality, thermal performance, electrical performance, mechanical performance, and the manufacturability of package 1100. For example, electrical performance may be enhanced by electrically isolating first and second connectors 2402 and 2404, and coupling them to separate potentials (i.e., ground or other potentials) of IC die 304 (through vias in substrate 302). First and second connectors 2402 and 2404 may then be coupled to the separate potential signals in PCB 2222.

Any number of additional ground/thermal connectors may be used, according to the present invention. FIG. 25 shows first, second, third, and fourth ground/thermal connectors 2502, 2504, 2506, and 2508 attached to a bottom surface of substrate 302, according to a further exemplary embodiment of the present invention. Connector plating, which may be present on first, second, third, and fourth ground/thermal connectors 2502, 2504, 2506, and 2508, is not shown in FIG. 25. First, second, third, and fourth ground/thermal connectors 2502, 2504, 2506, and 2508 are attached to first, second, third, and fourth metal planes 2510, 2512, 2514, and 2516, respectively, on substrate 302.

According to the present invention, ground/thermal connectors may be shaped and arranged in a variety of configurations. For example, one or more ground/thermal connectors may be formed around a portion of, or all of one or more other ground/thermal connectors. FIG. 27 shows first and second ground/thermal connectors 2702 and 2704 attached to a bottom surface of substrate 302, according to a further exemplary embodiment of the present invention. First and second ground/thermal connectors 2702 and 2704 are attached to first and second metal planes 2706 and 2708. As shown in FIG. 27, first ground/thermal connector 2702 is formed in a substantially rectangular shape, and second ground/thermal connector 2704 is formed in a substantially rectangular ring shape that surrounds first ground/thermal connector 2702 on the bottom surface of substrate 302. First metal plane 2706 is correspondingly formed in a rectangular-shaped metal plane, and second metal plane 2708 is formed in a rectangular ring-shaped metal plane. As shown in FIG. 27, a portion of the bottom surface of substrate 302 is present between first and second metal planes 2706 and 2708.

Vias through a package substrate may be located in a variety of places in a substrate. One example pattern for locating vias in a substrate is shown in FIG. 28. FIG. 28 shows a bottom view of a corner portion of substrate 302 with potential via locations. Substrate 302 of FIG. 28 is divided into a peripheral region 2804 and a central region 2806. The central region 2806 corresponds to the portion of the substrate adjacent to a mounted IC die 102 (and corresponding metal pad) and/or a mounted ground/thermal connector. The peripheral region 2804 corresponds to the portion of the substrate that is not adjacent to the mounted IC die 102. As shown in FIG. 28, a plurality of potential vias 2802 may be located in substrate 302 in an array configuration. In the peripheral region 2804 of substrate 302, the plurality of solder balls 306 are arranged in an array. In this region, each via of the plurality of potential vias 2802 is located between surrounding solder balls 306. In the central region 2806 of substrate 302, solder balls are not attached. In the central region 2806, potential vias 2802 continue to be arranged in the array configuration as they are in the peripheral region 2804.

The present invention is applicable to the via configuration shown in FIG. 28, and to other via configurations. According to an embodiment of the present invention, the potential vias located in the central region may be located relatively closer to each other than in the peripheral region, allowing for the use of a greater number of vias in a given area in the central region. The resulting increased density of vias allows for more connections by vias between IC die 102 and a ground/thermal connector attached to the bottom surface of substrate 302. This will allow for a greater heat transfer from IC die 102 to the PCB through the vias and ground/thermal connector. Furthermore, if the ground/thermal connector is used as a ground potential (or other potential), additional vias will enhance the ground connection, reduce ground bounce and other types of unwanted circuit noises.

FIG. 29 shows an example bottom view of a corner portion of substrate 302, according to an embodiment of the present invention. As shown in FIG. 29, the spacing of potential vias 2904 in central region 2806 is denser than the spacing of potential vias 2902 in peripheral region 2804. A variety of possible via arrangements are applicable to the present invention. FIG. 30 shows another example of a bottom view of a corner portion of substrate 302, according to an embodiment of the present invention. As shown in FIG. 30, the spacing of potential vias 3004 in central region 2806 is denser than the spacing of potential vias 3002 in peripheral region 2804. However, central region vias 3004 are not located adjacent to solder balls 306 as they are in FIG. 29. Furthermore, although central region vias 2904 and 3004 are arranged in columns and rows, central region vias may be arranged in any other applicable arrangement.

Referring to the example shown in FIG. 29, an example via 2902 may have a via diameter of 0.2 mm. The invention is applicable to alternative via diameters. In peripheral region 2804, a solder ball pitch (i.e., spacing between solder ball centers) 2906 may be equal to 1.0 mm. In peripheral region 2804, a peripheral region via pitch 2908 may be equal to 1.0 mm. In central region 2806, a central region via pitch 2910 is smaller than peripheral region via pitch 2908. For example, central region via pitch 2910 may be equal to 0.4 mm, 0.45 mm, 0.5 mm, or any other value in this range, or less than peripheral region via pitch 2908. These solder ball/via pitch values are provided for exemplary purposes, and are not limiting to the present invention.

Note that in FIGS. 29 and 30, the distances between adjacent vias in central region 2806 and peripheral region 2804 are shown to be uniform. These distances are not required to be uniform in a particular region. In an alternative embodiment, in either the central or peripheral region, a distance between a first pair of adjacent vias may differ from a distance between a second pair of adjacent vias. However, taken as a whole, the distances between adjacent vias in central region 2806 may still on average be less than the distances between adjacent vias in peripheral region 2804. In other words, in such an embodiment, a via density in central region 2806 will be greater than a via density in peripheral region 2804, even if the distances between via pairs differ.

FIG. 26 shows a flowchart 2600 providing operational steps for assembling one or more embodiments of the present invention. The steps of FIG. 26 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 2600 begins with step 2602. In step 2602, a substrate that has a first surface is provided. For example, the substrate is plastic substrate 302, or another substrate type suitable for a BGA package. The first surface is the bottom surface of substrate 302 shown in FIG. 22, for example.

In step 2604, an array of contact pads and a metal plane on the first surface of the substrate are exposed. For example, the contact pads are solder ball contact pads 2224, and the metal plane is metal plane 1110. The contact pads and metal plane are portions of a metal layer of substrate 302 that are completely or partially exposed through a solder mask on the bottom surface of substrate 302.

In step 2606, a solder ball is attached to each of the exposed contact pads on the first surface of the substrate. For example, the solder balls attached to each contact pad are plurality of solder balls 306, which attach to solder ball contact pads 2224.

In step 2608, a first surface of a thermal connector is coupled to the exposed metal plane. For example, the thermal connector is ground/thermal connector 1102, which is coupled to metal plane 1110.

In an embodiment, step 2608 may include a step wherein the first surface of the thermal connector is coupled to the exposed metal plane, wherein the thermal connector has a height that is less than a height of a solder ball attached to one of the exposed contact pads. For example, as shown in FIG. 22, ground/thermal connector height 2206 is less than solder ball height 2218. In alternative embodiments, ground/thermal connector height 2206 may be equal to or greater than solder ball height 2218. Step 2608 may include a further step wherein the first surface of the thermal connector is coupled to the exposed metal plane by a conductive adhesive material. For example, the conductive epoxy is adhesive material 1104, which may be a silver-filled epoxy, solder, or other similar substance.

Flowchart 2600 may include the additional step wherein the second surface of the thermal connector is plated with a metal. For example, as shown in FIG. 22, a bottom surface 1112 of ground/thermal connector 1102 is plated with connector plating 2202. The second surface of the thermal connector 1102 may be plated with a metal, wherein a combined height of the thermal connector, the conductive adhesive material, and the metal plating is less than a height of a solder ball attached to one of the exposed contact pads. As shown in FIG. 22, connector height 2206, adhesive material height 2204, and connector plating height 2208 are less than solder ball height 2218. In alternative embodiments, this combined height may be equal to or greater than solder ball height 2218.

Flowchart 2600 may include the additional step wherein the second surface of the thermal connector is configured to be coupled to a second metal plating formed on a metal plane on the PCB. As shown in FIG. 22, PCB 2222 has a PCB metal pad 2216, with a PCB metal pad plating 2214 formed thereon. Ground/thermal connector 1102 is configured to be coupled to PCB metal pad plating 2214 during surface mount of package 1100 to PCB 2222. For example, connector 1102 may be shaped and sized to conform to being surface mounted to PCB 2222. The second surface of the thermal connector 1102 may be configured to be coupled to the second metal plating, wherein the second metal plating has a height. For example, PCB metal pad plating 2214 has a PCB metal pad plating height 2210. The second surface of the thermal connector 1102 may be coupled to the PCB metal pad 2216 through PCB metal pad plating 2214. This may occur during the surface mount process, where package 1100 is attached to PCB 2222. Connector 2206 may be configured such that when package 1100 is attached to PCB 2222, a combined height of the thermal connector (e.g., connector height 2206), the conductive adhesive material (e.g., adhesive material height 2204), the first metal plating (e.g., connector plating height 2208), and the second metal plating (e.g., PCB metal pad plating height 2210) may be substantially equal to a height of a solder ball (e.g., solder ball height 2218) attached to one of the exposed contact pads (e.g., solder ball contact pad 2224) and attached to a contact pad (e.g., PCB contact pad 2226) on PCB 2222.

In an embodiment, the thermal connector of step 2608 may include a plurality of separate thermal connectors. For example, as shown in FIG. 24, a first and second ground/thermal connector 2402 and 2404. Step 2608 may include a step wherein a first surface of the plurality of separate thermal connectors is coupled to the exposed metal plane. The exposed metal plane of step 2604 may include a plurality of separate exposed metal planes. For example, FIG. 24 shows first and second metal planes 2406 and 2408. Step 2608 may further include the step wherein the first surface of each one of the plurality of separate thermal connectors is coupled to a corresponding one of the plurality of separate exposed metal planes. FIG. 24 shows first and second ground/thermal connectors 2402 and 2404 attached to first and second metal planes 2406 and 2408, respectively, on the bottom surface of substrate 302. Alternatively, the plurality of thermal connectors may include first and second ground/thermal connectors 2702 and 2704, and the exposed metal planes may include first and second metal planes 2706 and 2708, for example.

In an embodiment, step 2602 may include the step wherein an organic substrate that has a first surface is provided. For example, the organic substrate may be plastic substrate 302, which includes one or more metal layers formed on an organic substrate (for example, BT resin or FR4 epoxy/glass).

In an embodiment, flowchart 2600 may include the additional step wherein an IC die is mounted to a second surface of the substrate. For example, the IC die may be IC die 304. IC die 304 may be mounted to a die pad 310 attached to substrate 302, as shown in FIG. 3. Furthermore, flowchart 2600 may include the additional step wherein the IC die is coupled to the exposed metal plane by at least one via that extends through the substrate. For example, IC die 304 may be coupled to metal plane 1110 by one or more ground/thermal vias 316, as shown in FIG. 11. This step may include the step wherein the at least one via is filled with a conductive material, such as a solder.

In an example embodiment, substrate 302 has a central portion that is defined by the metal plane to which an IC die may be mounted. In an embodiment, flowchart 2600 may include the additional steps where a plurality of vias are located in the substrate in the central region, and a plurality of vias are located in the substrate outside of the central region. For example, the central region may be central region 2806, and an area outside of the central region may be peripheral region 2804. In an embodiment, a first via density for the plurality of vias in the central portion is greater than a second via density for the plurality of vias outside of the central portion.

Embodiments Allowing Attachment of Additional Electronic Devices

According to an embodiment of the present invention, the electrical performance of a BGA package is improved by configuring the BGA package to allow the attachment of electronic devices to the bottom surface of a BGA package. In an example BGA package, a thermal/ground connector couples the bottom center of the package substrate to a PCB. According to the present invention, electronic devices are attached to the bottom surface of the BGA package, in a region between the thermal/ground connector and the array of solder balls. This configuration allows for enhanced electrical performance, by allowing additional electronic devices to be present in the BGA package. Furthermore, the electronic devices are mounted closely to the thermal/ground connector, and hence may have shorter ground current paths. Further benefits may be realized, as would be understood by persons skilled in the relevant art(s) from the teachings herein.

Embodiments allowing the attachment of electronic devices to the bottom surface of the BGA package are adaptable to any BGA package types, including any of those described elsewhere herein. These BGA package types include tape and organic substrate BGA packages, and include die-up and die-down BGA package configurations. For exemplary purposes, the present invention is described below in relation to a die-up BGA package similar to BGA package 800 shown in FIG. 8, but the present invention is also applicable to other BGA package configurations, as would be understood by persons skilled in the relevant art(s) from the teachings herein.

FIG. 31 shows a bottom view of an example BGA package 3100, according to an embodiment of the present invention. BGA package 3100 is configured similarly to BGA package 800 described above. Attached to substrate 104 on the bottom of BGA package 3100 are plurality of solder balls 106 and ground/thermal connector 802. Additional or fewer solder balls 106 may be present. Ground/thermal connector 802 may be attached directly to the bottom surface of substrate 104, or may be attached to a stiffener in BGA package 3100 through a central opening formed in substrate 104. Ground/thermal connector 802 may be relatively larger or smaller, or differently shaped than as shown in FIG. 31, and may be centrally located, or located off-center of the bottom surface of substrate 104.

As shown in FIG. 31, a substrate region 3102 exists on the bottom surface of substrate 104, bounded on an outer edge 3104 by solder balls 106, and on an inner edge 3106 by thermal connector 802. According to the present invention, electronic devices may be attached/mounted to the bottom surface of substrate 104 in substrate region 3102.

FIG. 32 shows a bottom view of BGA package 3100, with first and second electronic devices 3202 and 3204 attached to the bottom surface of substrate 104, according to an embodiment of the present invention. First and second electronic devices 3202 and 3204 may be any applicable type of electronic device that would be useful to include in an integrated circuit package, that meet applicable size constraints. For example, first and second electronic devices 3202 and 3204 may be passive or active components. For instance, first and second electronic devices 3202 and 3204 may be any passive component type, including resistors, capacitors, and/or inductors. Furthermore, first and second electronic devices 3202 and 3204 may be leaded and/or leadless devices. Any number of one or more electronic devices may be attached/mounted to the bottom surface of substrate 104 in substrate region 3102.

Electronic devices may be attached to the bottom surface of substrate 104 adjacent to ground/thermal connector 802. In some configurations, electronic devices may be attached more closely to ground/thermal connector 802 than in others. For example, as described above, ground/thermal connector 802 may be coupled to a stiffener in BGA package 3100 through a central opening in substrate 104. When ground/thermal connector 802 is directly coupled to the bottom surface of substrate 104, no central opening in substrate 104 is required. The structural integrity of substrate 104 near ground/thermal connector 802 when a central opening is present may be less than when a central opening is not present. Hence, in some embodiments, electronic devices may be attached in substrate region 3102 more closely to ground/thermal connector 802 when a central opening is not present in substrate 104, than when a central opening is present.

FIG. 33 shows a PCB portion 3300 for mounting a BGA package such as BGA package 3100, according to an exemplary embodiment of the present invention. PCB portion 3300 includes PCB contact pads 3302 and a PCB metal pad 3304. When BGA package 3100 is attached to PCB portion 3300, solder balls 106 attach to PCB contact pads 3302, and ground/thermal connector 802 attaches to PCB metal pad 3304. For example, solder balls 106 may be reflowed to attach to PCB contact pads 3302, and ground/thermal connector 802 may be attached by solder to PCB metal pad 3304. The present invention is applicable to additional ways of attaching BGA package 3100 to PCB portion 3300.

As shown in FIG. 33, a PCB region 3306 exists on PCB portion 3300, bounded on an outer edge 3308 by PCB contact pads 3302, and on an inner edge 3310 by PCB metal pad 3304. According to the present invention, electronic devices attached/mounted to the bottom surface of substrate 104 in substrate region 3102, as shown in FIG. 32, will be present above PCB region 3306 when BGA package 3100 is attached to PCB portion 3300. Furthermore, according to additional embodiments of the present invention, electronic devices may be attached/mounted to PCB portion 3300 in PCB region 3306.

FIG. 34 shows PCB portion 3306 with third and fourth electronic devices 3402 and 3404 attached, according to an embodiment of the present invention. Third and fourth electronic devices 3402 and 3404 may be any applicable type of electronic device that would be useful to attach to a PCB, that meet applicable size constraints. For example, third and fourth electronic devices 3402 and 3404 may be passive or active components. For instance, third and fourth electronic devices 3402 and 3404 may be any passive component type, including resistors, capacitors, and/or inductors. Furthermore, third and fourth electronic devices 3402 and 3404 may be leaded and/or leadless devices. Any number of one or more electronic devices may be attached/mounted to PCB portion 3300 in PCB region 3306.

When BGA package 3100 is mounted on PCB portion 3306, either or both of substrate region 3102 and PCB region 3306 may have electronic devices attached/mounted on them. For example, FIG. 35 shows an cross-sectional view of a portion of BGA package 3100 mounted to PCB portion 3300, according to an embodiment of the present invention. The portion of BGA package 3100 shown in FIG. 35 includes substrate 104, respective bottom substrate surface contact pads, solder balls 106a-c, and ground/thermal connector 802. Solder balls 106-c, which are attached to solder ball contact pads 3502 on substrate 104, are attached to PCB contact pads 3302. Ground/thermal connector 802 attaches to a metal plane 3506 on the bottom surface of substrate 104 by an epoxy or other adhesive material (not shown). Ground/thermal connector 802 attaches to PCB metal pad 3304 by solder or other attachment material (not shown).

As shown in FIG. 35, first electronic device 3202 is attached to the bottom surface of substrate 104 between ground/thermal connector 802 and solder ball 106b. First electronic device 3202 attaches to one or more substrate contact pads 3504 by solder or other attachment material (not shown). Furthermore, third electronic device 3402 is attached to PCB portion 3306, between ground/thermal connector 802 and solder ball 106c. Third electronic device 3402 attaches to one or more PCB contact pads 3508 by solder or other attachment material (not shown). The present invention is applicable to any number of electronic devices attached to BGA package 3100 and/or PCB 3300.

As described above, FIG. 26 shows a flowchart 2600 providing operational steps for assembling one or more embodiments of the present invention. FIGS. 36A and 36B show additional steps for flowchart 2600, according to embodiments of the present invention. These steps do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

In an embodiment, step 2604 includes the step where the array of contact pads are arranged in at least one ring to surround the metal plane on the first surface of the substrate. For example, as shown in FIG. 31, solder balls 106, which are attached to an array of contact pads such as solder ball contact pads 3502 shown in FIG. 35, are arranged in three rectangular rings around ground/thermal connector 802. Ground/thermal connector 802 is attached to metal plane 3506. The invention is applicable to any number of such solder ball rings.

As shown in FIG. 36A, flowchart 2600 may include step 3602. In step 3602, at least one passive electronic device is attached to the first surface of the substrate in a region bounded on a first edge by the metal plane and on a second edge by the array of contact pads. For example, as shown in FIG. 32, first and second electronic devices 3202 and 3204 are attached to the bottom surface of substrate 104 in substrate region 3102. Substrate region 3102 is bounded on an inner edge 3106 by ground/thermal connector 802, and on an outer edge 3104 by solder balls 106. Ground/thermal connector 802 is attached to metal plane 3506.

As shown in FIG. 36B, flowchart 2600 may include additional steps. In step 3604, a second metal plane is exposed on a first surface of a PCB that corresponds to the first metal plane. For example, as shown in FIG. 33, PCB metal pad 3304 is exposed on PCB portion 3300. PCB metal pad 3304 corresponds to metal plane 3506 on the bottom surface of substrate 104. Ground/thermal connector 802 attaches to PCB metal pad 3304 when BGA package 3100 is mounted to PCB portion 3300.

In step 3606, a second array of contact pads are exposed arranged in at least one ring that corresponds to the first array of contact pads. For example, as shown in FIG. 33, array of PCB contact pads 3302 are exposed on PCB portion 3300. Solder balls 106 are attached to PCB contact pads 3302 when BGA package 3100 is mounted on 3300. PCB contact pads 3302 are arranged in three rectangular rings, that correspond to the three rectangular rings formed by solder balls 106 and their respective contact pads on substrate 104, as shown in FIG. 31.

In step 3608, at least one passive electronic device is attached to the first surface of the PCB in a region bounded on a first edge by the second metal plane and on a second edge by the second array of contact pads. For example, as shown in FIG. 34, third and fourth electronic devices 3402 and 3404 are attached to PCB portion 3300 in PCB region 3306. PCB region 3306 is bounded on an inner edge 3310 by PCB metal pad 3304, and on an outer edge 3308 by PCB contact pads 3302.

Additional Embodiments of a BGA Package with Thermal Connector

Further description of exemplary embodiments of BGA packages with stiffeners and thermal connectors, similar to tape BGA package 800 shown in FIG. 8 and PBGA package 1100 shown in FIG. 11, are described in this section. Features of the embodiments described below may be combined in any manner with each other, and with features of BGA packages described elsewhere herein. Features of the present invention are applicable to any substrate type, including tape and organic substrate BGA packages, and include die-up and die-down BGA package configurations. The embodiments provided herein enhance BGA package thermal, electrical and mechanical performances, and improve BGA package manufacturing yields and mechanical reliability. For illustrative purposes, the present invention is described below in relation to die-up BGA packages similar to BGA package 800 shown in FIG. 8.

Note that the thermal connectors referred to herein may also be referred to as heat spreaders, heat sinks, heat slugs, and by other labels.

FIG. 37A illustrates a cross-sectional view of a die-up BGA package 3700, according to an example embodiment of the present invention. BGA package 3700 includes IC die 102, substrate 3701, plurality of solder balls 106, a stiffener 3702 (which may also be referred to as an "interposer"), thermal connector 802, an encapsulate material 3704, and a dam 3706.

As shown in FIG. 37A, substrate 3701 has a top surface 3738. Top surface 3738 has opening 704 formed therein. Stiffener 3702 has a bottom surface 3740 that is coupled to top surface 3738 of substrate 3701. Thermal connector 802 is coupled to bottom surface 3740 of stiffener 3702 through opening 704. IC die 102 is mounted to a top surface 3742 of stiffener 3702. A plurality of solder balls 106 are attached to metal pads exposed on a bottom surface 3744 of substrate 3701. Note that in the description herein, while various surfaces may be referred to as "top" or "bottom." It should be understood that spatial descriptions (e.g., "above", "below", "up", "down", "top", "bottom", etc.) made herein are for purposes of illustration only, and that elements of the BGA package embodiments described herein can be spatially arranged in any orientation or manner.

Substrate 3701 is a substrate applicable to BGA packages, substantially similar to the other BGA package substrates described elsewhere herein, and to BGA package substrates otherwise known to persons skilled in the relevant art(s). Substrate 3701 is shown in FIG. 37A having four electrical routing layers formed in a dielectric material for illustrative purposes. In embodiments, substrate 3701 may include any number of routing layers, including two, three, four, five, and more. The electrical routing layers may be formed through a variety of processes, including lamination, build-up, and other processes. The dielectric portion of substrate 3701 can be manufactured from a variety of materials, such as those described elsewhere herein, including organic (e.g., BT, FR4, etc.), ceramic, glass, tape (e.g., polyimide), and other dielectric materials.

As shown in FIG. 37A, opening 704 is a central rectangular or window-shaped opening formed in substrate 3701. In embodiments, opening 704 may be shaped as needed to allow access to the bottom surface of stiffener 3702 by thermal connector 802 through substrate 3701. For example, opening 704 may be rectangular, elliptical or rounded, and other shapes.

As shown in FIG. 37A and described above, IC die 102 can be encapsulated in encapsulate material 3704. For example, encapsulate material 3704 may be an encapsulate, mold compound, epoxy, or other encapsulate material. In FIG. 37A, encapsulate material 3704 forms a "glob top" for BGA package 3700, and hence can be formed according to a glob top encapsulation process. For example, dam 3706 may be formed around IC die 102, on top surface 3742 of stiffener 3702 and/or on top surface 3738 of substrate 3701, to contain encapsulate material 3704. As shown in FIG. 37A, encapsulate material 3704 is applied to the top of BGA package 3700 within a boundary of dam 3706.

In the embodiment of FIG. 37A, thermal connector 802 is attached to bottom side 3740 of stiffener 3702 through opening 704 using adhesive 804. For example, adhesive 804 may be an electrically and thermally conductive adhesive, such as a solder, an epoxy filled with silver particles or flakes, or other conductive material described elsewhere herein or otherwise known. For example, adhesive 804 may be a tin-lead or silver solder material, which can be applied through processes such as solder plating and reflow, or screen printing of paste and reflow. A bottom surface 3736 of thermal connector 802 is capable of attachment to a PCB when BGA package 3700 is mounted to the PCB.

In the embodiment shown in FIG. 37A, stiffener 3702 does not cover the entire surface area of top surface 3738 of substrate 3701. This is also shown in FIG. 37F, where stiffener 3702 is shown attached to top surface 3738 of substrate 3701. As shown in FIG. 37F, stiffener 3702 is large enough to substantially cover opening 704 in substrate 3701. However, stiffener 3702 is not large enough in area to cover top surface 3738 to all of the edges of substrate 3701. In an embodiment, an area of bottom surface 3740 of stiffener 3702 is less than an area of top surface 3738 of substrate 3701. For example, stiffener 3702 may not extend to at least one edge of substrate 3701. However, stiffener 3702 is thick enough, and has enough overlap with top surface 3738 of substrate 3701 to support IC die 102 over opening 704, and allow thermal connector 802 to be attached to the bottom surface of stiffener 3702, while maintaining BGA package structural integrity. Furthermore, stiffener 3702 allows efficient heat transfer from IC die 102 to thermal connector 802, and can act as a ground or power plane for the BGA package. Note that the present invention is applicable to a stiffener having a bottom surface of substantially the same or greater area than top surface 3738 of substrate 3701 (including the area of opening 704), as is described elsewhere herein.

As shown in FIGS. 37B-37E, stiffener 3702 can be patterned according to various shapes and forms to improve mechanical, thermal, and electrical performances of BGA package 3700, and to improve BGA package reliability. FIG. 37B shows top surface 3742 of an example stiffener 3702. FIG. 37C shows bottom surface 3740 of the example stiffener 3702 of FIG. 37B. FIGS. 37D and 37E show top and bottom views of another example stiffener 3702.

For example, as shown in FIGS. 37B and 37C, stiffener 3702 may be substantially rectangular in shape. As described above, stiffener 3702 can also be patterned. For example, as shown in FIGS. 37D and 37E, one or more notches, cutouts, and/or steps can be patterned into one or more edges of stiffener 3702. The pattern may allow for reduced wire bond lengths between IC die 102 and substrate 3701, improve the routability of substrate 3701, and improve the overall manufacturing process for the BGA package. For example, as shown in FIGS. 37D and 37E, stiffener 3702 has a first, a second, a third, and a fourth edge 3716, 3718, 3720, and 3722. First, second, third, and fourth edges 3716, 3718, 3720, and 3722 are each patterned with a cutout portion 3724, 3726, 3728, and 3730, respectively. Cutout portions such as these allow wire bonds to be coupled from pads on IC die 102 to bond pads on top surface 3738 of substrate 3701 that would otherwise be covered by stiffener 3702, or would have to be located further away on substrate 3701.

As shown in FIG. 37D, stiffener 3702 also has a stepped portion 3732. Stepped portion 3732 is a portion of stiffener 3702 that is formed to be thinner than the non-stepped portions of stiffener 3702. For example, stepped portion 3732 may be formed or cut into stiffener 3702 on top surface 3742 of stiffener 3702. Stepped portion 3732 may allow a wire bond 108 to be coupled from IC die 102 to bond pads on top surface 3738 of substrate 3701, without the wire bond contacting the respective edge of stiffener 3702, because stepped portion 3732 has less height than the non-stepped portions of stiffener 3702, allowing for additional space for the wire bond. One or more edges of stiffener 3702 may be patterned in further ways, as would be understood by persons skilled in the relevant art(s) from the teachings herein.

Stiffener 3702 and thermal connector 802, and other stiffeners described elsewhere herein, may be manufactured from copper, copper-based alloys, aluminum, aluminum-based alloys, as well as other types of electrically conductive metals and alloys, ceramic materials, thermally conductive dielectric materials, organic materials, plastics, and combinations of these materials, as would be understood by persons skilled in the relevant art(s) from the teachings herein.

Surfaces of stiffener 3702 are not required to be finished. However, the surfaces of stiffener 3702 may be finished using processes such as micro-etch and oxidation to enhance adhesion of encapsulate material 3704 and/or thermal connector 802. In embodiments, one or more plated areas of silver, solder, nickel, gold, and further metals and alloys may also be applied to the top and/or bottom surfaces 3742 and 3740 of stiffener 3702. For example, one or more plated areas may be created in spot, strip, bar, ring, and other shapes on top surface 3742 of stiffener 3702 to enhance wire bond connections, and/or mounting of IC die 102. For example, as shown in FIG. 37D, a plated area 3734 is present on the top surface of stiffener 3702 to enhance attachment of IC die 102. In another example, one or more plated areas may also be applied to the bottom surface of stiffener 3702 to enhance attachment of the thermal connector 802. For example, as shown in FIGS. 37C and 37E, a plated area 3726 is present on the bottom surface of stiffener 3702 to enhance attachment of thermal connector 802.

Furthermore, surfaces of thermal connector 802 are not required to be finished. However, surfaces of thermal connector 802 may be finished using processes such as micro-etch and oxidation to enhance attachment to stiffener 3702. Selective plating or screen printing of silver, solder, nickel, gold, and further metals and alloys may be applied to top and/or bottom surfaces of thermal connector 802. For example, one or more plated areas may be applied to the top surface of thermal connector 802 to enhance attachment to bottom surface 3740 of stiffener 3702. One or more plated areas may also be applied to bottom surface 3736 of thermal connector 802 to promote attachment to a PCB when attached thereto by surface mounting or other process.

FIG. 37A shows the following dimensions related to BGA package 3700:

- h1 (3708)=height of solder ball 106/standoff height of the bottom surface of substrate 3701 to the sitting plane of the BGA package.
- h2 (3710)=distance from bottom surface 3744 of substrate 3701 to bottom surface 3736 of thermal connector 3702.
- h3 (3712)=h1-h2=distance between bottom surface 3736 of thermal connector 3702 and sitting plane of the BGA package (also, change in height of solder ball 106 prior to and after attachment to PCB).

Where h3 is typically in the range of:

$$0 < h3 < h1$$

For example, in an exemplary embodiment, h1=0.5 mm and h2=0.4 mm. Hence, h3=0.5 mm–0.4 mm=0.1 mm. For example, these dimension values may be used in a BGA package with 1 mm ball pitch and 0.6 mm ball diameter. Note that these dimension values are provided for illustrative purposes, and the present invention is applicable to other dimension values related to BGA packages.

FIG. 38 illustrates a BGA package 3800, according to a further embodiment of the present invention. BGA package 3800 is similar to BGA package 3700 shown in FIG. 37A, except that stiffener 3702 and thermal connector 802 are integrated into a single structure, stiffener 3802. Stiffener 3802 may be manufactured from the same materials as stiffener 3702, as described above.

Stiffener 3802 has a bottom surface 3808 and a protruding portion 3804, similarly to stiffener 112 shown in FIG. 21, which has a protruding portion 2102. Protruding portion 3804 is located on bottom surface 3808 of stiffener 3802. In BGA package 3800, bottom surface 3808 of stiffener 3802 is coupled to top surface 3738 of substrate 3701. Protruding portion 3804 extends through opening 704 in substrate 3701. As shown in the embodiment of FIG. 38, an area of bottom surface 3808 of stiffener 3802 (including the area covered by protruding portion 3804) is less than an area of substrate 3701, similarly to the embodiment shown in FIG. 37A. A bottom surface 3806 of protruding portion 3804 is capable of attachment to a PCB when BGA package 3800 is mounted to the PCB.

BGA package 3800 has improved thermal and electrical properties. A single-piece stiffener better conducts heat and/or electricity than the two-piece stiffener/thermal connector structure shown in FIG. 37A. Furthermore, the overall number of parts is reduced, improving the physical stability of the BGA package.

FIG. 39 illustrates a BGA package 3900, according to a further embodiment of the present invention. BGA package 3900 is similar to BGA package 3700 shown in FIG. 37A, except that encapsulate material 3704 is applied according to an over-mold process.

Note that as shown in the embodiment of FIG. 39, a portion of top surface 3738 of substrate 3701 is not covered by encapsulate material 3704, although in alternative embodiments, the entire top surface 3738 of substrate 3701 may be encapsulated by encapsulate material 3704 using an over-mold process.

FIG. 40 illustrates a BGA package 4000, according to a further embodiment of the present invention. BGA package 4000 is similar to BGA package 3700 shown in FIG. 37A, except that IC die 102 is encapsulated together with the entire top surface of substrate 3701, according to a saw singulation encapsulation process. For example, a plurality of BGA packages 4000 may be formed together in a panel strip during manufacturing. The entire panel strip may be encapsulated simultaneously by encapsulate material 3704. Subsequently, each BGA package 4000 in the panel strip may be separated from the panel strip using saw singulation. Each BGA package 4000 is cut from the panel strip, which forms the outer edges of substrate 3701 and encapsulate material 3704. In this manner, the top surface of substrate 3701 is not exposed.

FIG. 41A illustrates a BGA package 4100, according to a further embodiment of the present invention. BGA package 4100 is similar to BGA package 3700 shown in FIG. 37A, except that stiffener 112 is present (which may also be referred to as an "interposer"), similarly to BGA package 800 shown in FIG. 8. Stiffener 112 is attached to top surface 3738 of substrate 3701, and extends to the edges of substrate 3701. One or more wire bond openings 114 are patterned or formed into stiffener 112 to allow one or more wire bonds 108 to be coupled between pads on IC die 102 and bond pads on substrate 3701. For example, stiffener 112 may have wire bond openings such as wire bond openings 114 shown in FIG. 2A, wire bond openings 206 as shown in FIG. 2C, and wire bond openings 114 with studs 1002 as shown in FIG. 10A.

Furthermore, as shown in FIG. 41B, notches/cutouts and "steps" can be patterned on the edges of openings 114 and 206 to reduce wire bond lengths between IC die 102 and substrate 104, to improve routability of substrate 3701, to improve the overall manufacturing process, and to improve BGA package mechanical, thermal, and electrical performances, as well as to enhance BGA package reliability. For example, FIG. 41B shows first and second notches 4102 and 4104 formed in respective wire bond openings 114. Furthermore, a stud 1002 is formed across an opening 114. The present invention includes any combination of such patterning of openings in stiffener 112.

FIG. 42 illustrates a BGA package 4200, according to an embodiment of the present invention. BGA package 4200 is similar to BGA package 4100 shown in FIG. 41A, except that stiffener 112 and thermal connector 802 are integrated into a single structure, stiffener 4202. Stiffener 4202 includes a protruding portion 2102, similarly to stiffener 112 shown in FIG. 21. Protruding portion 2102 is located on bottom surface 4204 of stiffener 112. In BGA package 4200, bottom surface 4204 of stiffener 112 is coupled to top surface 3738 of substrate 3701. Protruding portion 2102 extends through opening 704 in substrate 3701. Bottom surface 4206 of protruding portion 2102 is capable of attachment to a PCB when BGA package 4200 is mounted to the PCB.

BGA package 4200 has improved thermal and electrical properties. A single-piece stiffener better conducts heat and/or electricity than the two-piece stiffener/thermal connector structure shown in FIG. 41A. Furthermore, the overall number of parts is reduced for package assembly, reducing process steps in manufacturing and improving reliability in application of the BGA package.

FIG. 43 illustrates a BGA package 4300, according to an embodiment of the present invention. BGA package 4300 is similar to BGA package 4100 shown in FIG. 41A, except that encapsulate material 3704 is applied according to an over-mold process.

Note that as shown in the embodiment of FIG. 43, a portion of top surface 3738 of substrate 3701 is not covered by encapsulate material 3704, although in alternative embodiments, the entire top surface 3738 of substrate 3701 may be encapsulated by encapsulate material 3704 using an over-mold process.

FIG. 44 illustrates a BGA package 4400, according to an embodiment of the present invention. BGA package 4400 is similar to BGA package 4100 shown in FIG. 41A, except that IC die 102 is encapsulated together with the entire top surface of substrate 3701, according to a saw singulation encapsulation process. For example, a plurality of BGA packages 4400 may be formed together in a panel strip during manufacturing. The entire panel strip may be encapsulated simultaneously by encapsulate material 3704. Subsequently, each BGA package 4400 in the panel strip may be separated from the panel strip according to saw singulation. Each BGA package 4400 is cut from the panel strip, which forms the outer edges of substrate 3701 and encapsulate material 3704. In this manner, the top surface of substrate 3701 is not exposed.

FIG. 45 illustrates a BGA package 4500, according to an embodiment of the present invention. BGA package 4500 is similar to BGA package 3700 shown in FIG. 37A, except that thermal connector 802 has a height 4508 such that h3 (3712) <0. In the embodiment shown in FIG. 45, thermal connector 802 extends beyond the sitting plane of BGA package 4500. An advantage of this configuration is that BGA package 4500 can be more firmly attached to a PCB, via a specialized socket or opening in the PCB. Another advantage of this configuration is that mechanical and thermal stresses on solder balls 106 are alleviated by the use of thermal connector 802, which serves as an anchor for BGA package 4500 to the PCB.

As shown in the example of FIG. 45, a cavity 4504 exists in a PCB 4502 to accommodate thermal connector 802. Cavity 4504 may be a socket that extends partially through PCB 4502, or may be an opening that extends entirely through PCB 4502. Hence, BGA package 4500 can be mounted on a PCB where thermal connector 802 extends partially or entirely through the PCB. Bottom surface 3736 of thermal connector 802 may be exposed on the opposite side of the PCB from the PCB surface to which BGA package 4500 is mounted. Hence, for example, heat sinking devices may be coupled to the exposed bottom surface 3736 of thermal connector 802 on the opposite side of the PCB from BGA package 4500.

In an embodiment, cavity 4504 is the same size as, or larger size than a footprint size of thermal connector 802. The thermal connector 802 may be attached to PCB 4502 using an adhesive 4506, which may be an electrically connective or nonconductive adhesive, epoxy, solder, metal-filled paste, or other joining agent. This configuration may be used to enhance thermal coupling of IC die 102 inside BGA package 4500 to external heat sinking and transportation devices. Such devices may include, but are not limited to heat sinks, heat pipes, radiators, a chassis and a box, and enclosure walls of electronic systems.

Embodiments for Assembling BGA Packages with Thermal Connectors

FIGS. 46A-46F, 47A-47F, 48, and 49 show flowcharts providing operational steps for assembling one or more embodiments of the present invention. The steps of the respective flowcharts do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Figure 46A:
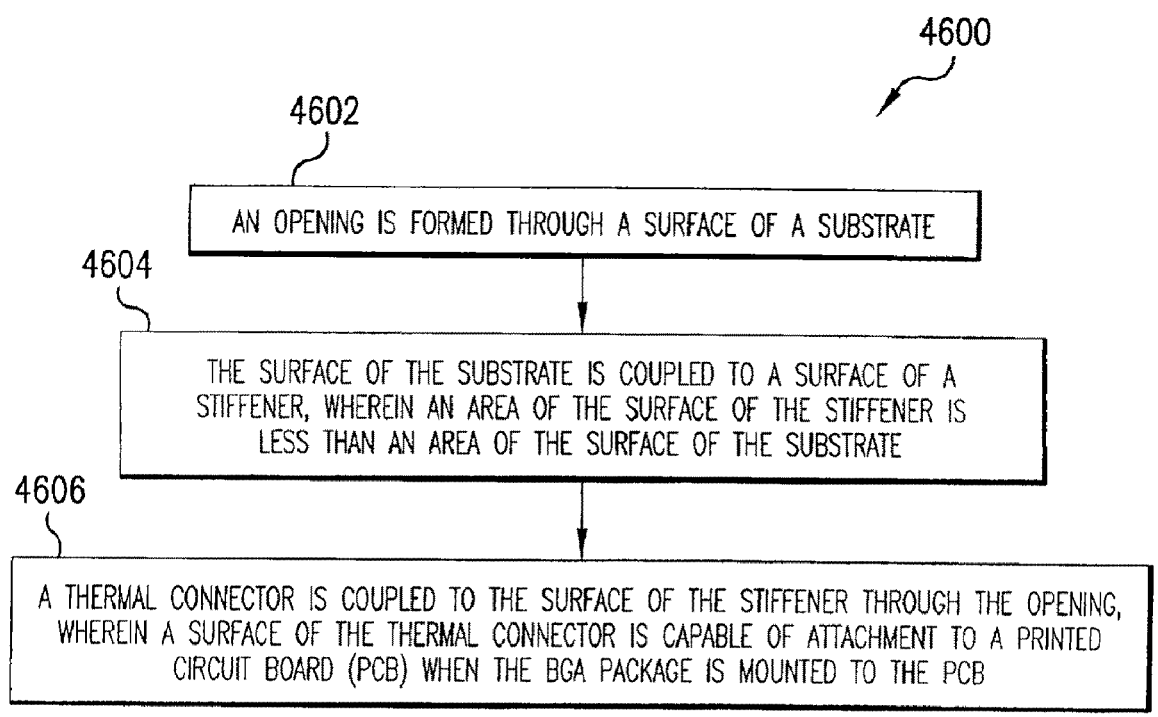

FIG. 46A provides a flowchart 4600. Flowchart 4600 provides steps for assembling a ball grid array (BGA) package. Flowchart 4600 begins with step 4602. In step 4602, an opening is formed through a surface of a substrate. For example, the opening is central window-shaped opening 704, formed in substrate 3701 of BGA package 3700 shown in FIG. 37A. Opening 704 may have any shape, and is not required to be exactly centered in substrate 3701.

In step 4604, the surface of the substrate is coupled to a surface of a stiffener, wherein an area of the surface of the stiffener is less than an area of the surface of the substrate. For example, the surface of the substrate is top surface 3738 of substrate 3701, and the surface of the stiffener is bottom surface 3740 of stiffener 3702, as shown in FIG. 37A. Bottom surface 3740 and top surface 3738 may be coupled together by a variety of means, including lamination, adhesives, epoxies, and other ways described herein or otherwise known. As shown in FIG. 37F, stiffener 3740 is smaller in area than top surface 3738 of substrate 3701.

In step 4606, a thermal connector is coupled to the surface of the stiffener through the opening, wherein a surface of the thermal connector is capable of attachment to a printed circuit board (PCB) when the BGA package is mounted to the PCB. For example, the thermal connector is thermal connector 802, which is coupled to bottom surface 3740 of stiffener 3702 through opening 704, as shown in FIG. 37A. As described above, bottom surface 3736 of thermal connector 802 is capable of attachment to a PCB when BGA package 3700 is mounted to the PCB.

Figure 46B:
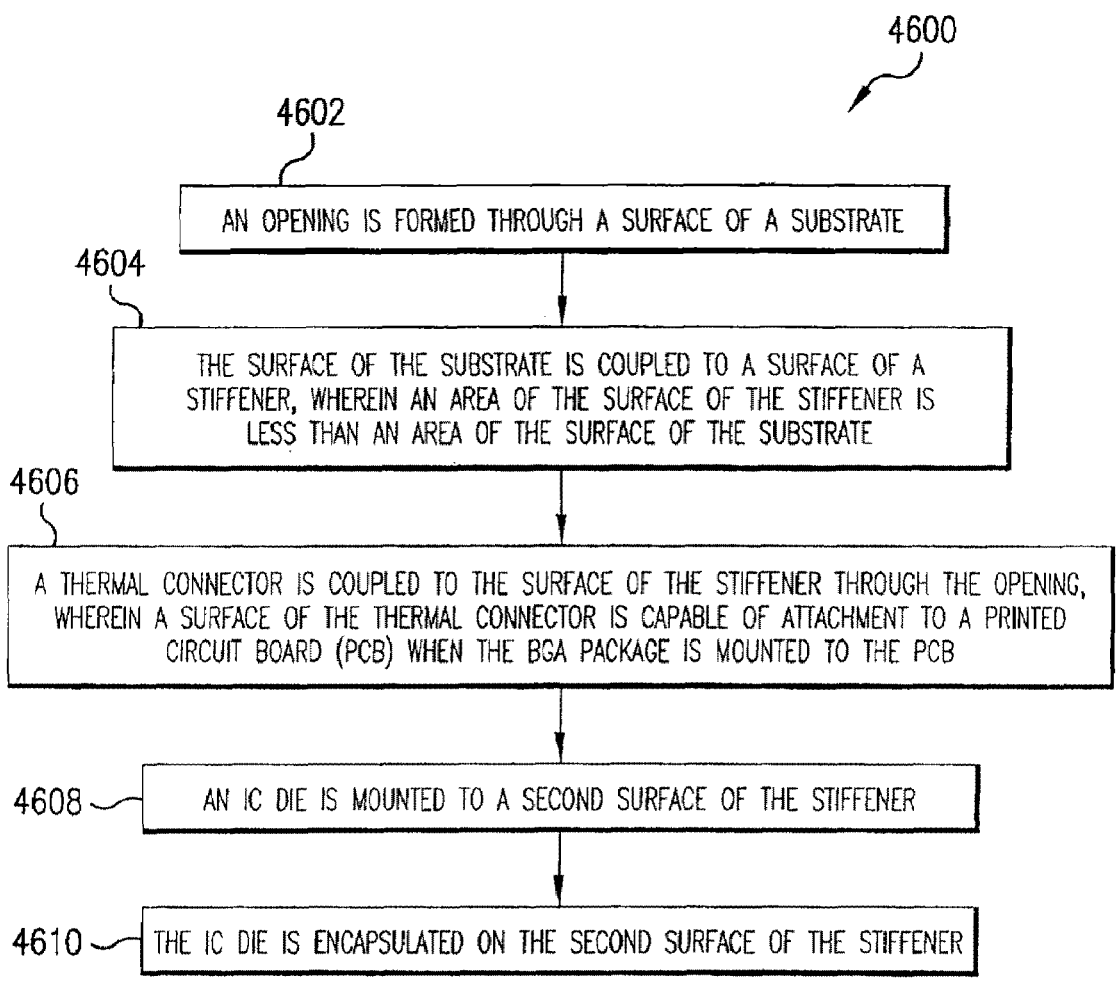

FIG. 46B provides additional exemplary steps for flowchart 4600 of FIG. 46A:

In step 4608, an IC die is mounted to a second surface of the stiffener. For example, as shown in FIG. 37A, the IC die is IC die 102, which is mounted to top surface 3742 of stiffener 3702.

In step 4610, the IC die is encapsulated on the second surface of the stiffener. For example, as shown in FIGS. 37A, 39, and 40, IC die 102 is encapsulated on top surface 3742 of stiffener 3702 by an encapsulate material 3704.

Figure 46C:
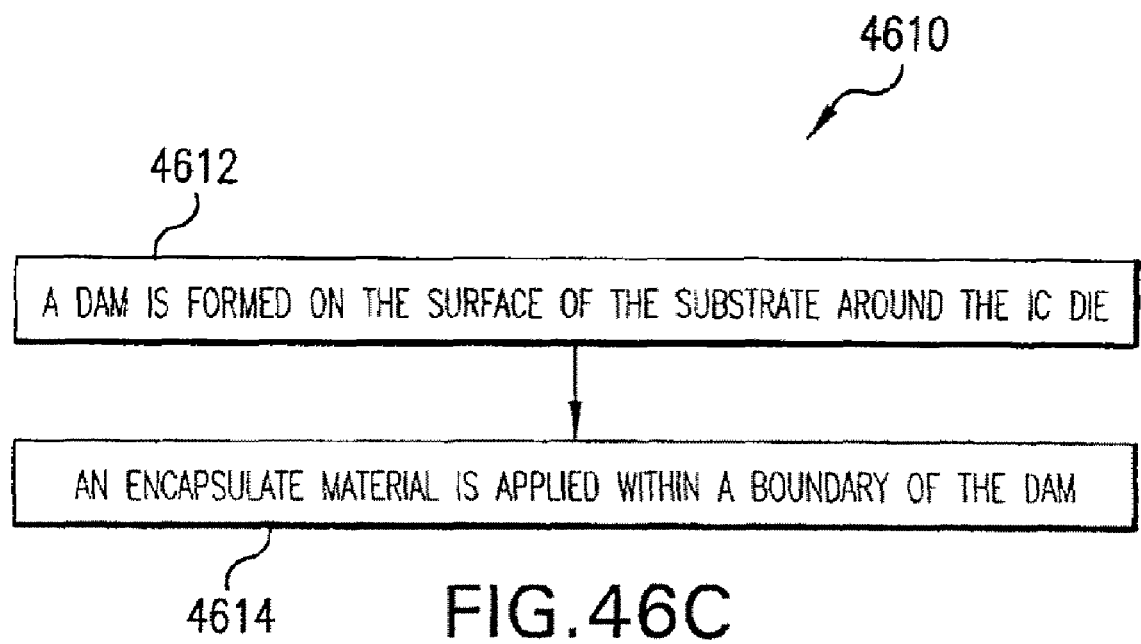

FIG. 46C provides exemplary steps for performing step 4610 shown in FIG. 46B:

In step 4612, a dam is formed on the surface of the substrate around the IC die. For example, the dam is dam 3706, which is formed on top surface 3738 of substrate 3701 around IC die 102.

In step 4614, an encapsulate material is applied within a boundary of the dam. For example, as shown in FIG. 37A, encapsulate material 3704 is applied within the boundary of dam 3706, according to a glob top encapsulation process.

In an alternative embodiment, step 4610 may include the step where an encapsulate material is applied according to an over-mold encapsulation process. For example, as shown in FIG. 39, encapsulate material 3704 was applied to encapsulate IC die 102 according to an over-mold encapsulation process.

Figure 46D:
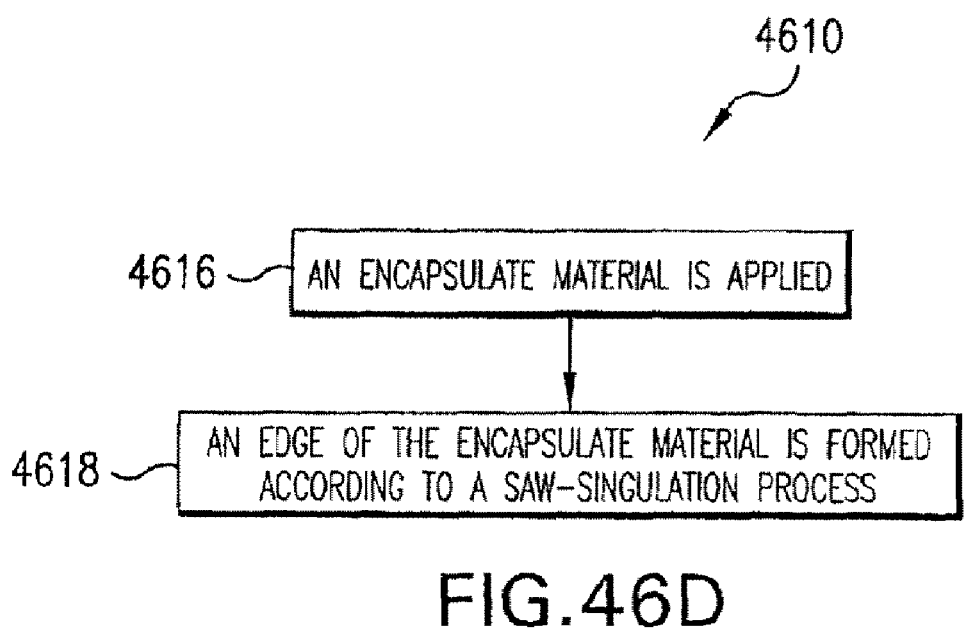

FIG. 46D provides exemplary steps for performing step 4610 shown in FIG. 46C, in still another alternative embodiment:

In step 4616, an encapsulate material is applied. For example, as shown in FIG. 40, encapsulate material 3704 is applied to encapsulate IC die 102. Encapsulate material 3704 may be applied to a plurality of BGA packages that have been manufactured in a panel strip.

In step 4618, an edge of the encapsulate material is formed according to a saw-singulation process. As described above, a saw-singulation process may be used to separate the BGA packages that were manufactured in a panel strip, thereby forming relatively straight edges for encapsulate material 3704, as shown in FIG. 40.

Figure 46E:
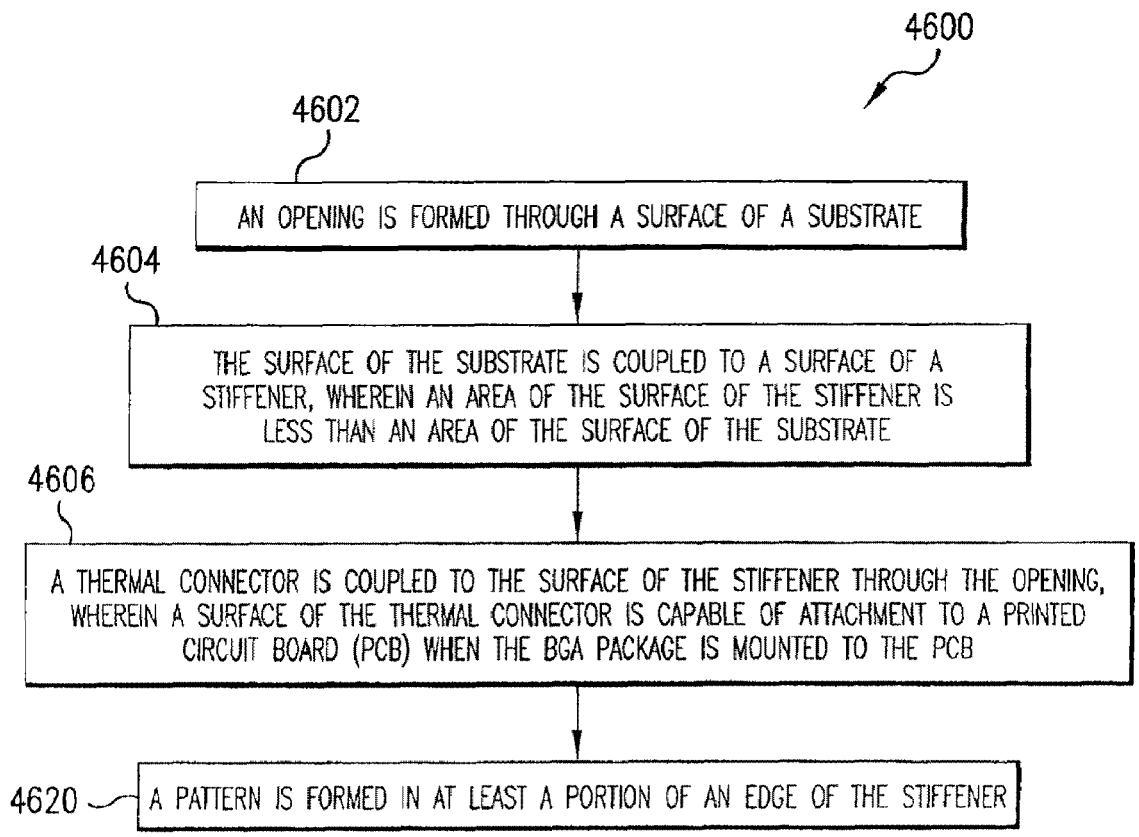

FIG. 46E provides an additional exemplary step for flowchart 4600 of FIG. 46A:

In step 4620, a pattern is formed in at least a portion of an edge of the stiffener. For example, as shown in FIGS. 37D and 37E, one or more cutout patterns may be formed in edges of stiffener 3702, including cutout portion 3724 formed in first edge 3716. Notch, hole, step, and other patterns may also be formed in an edge of stiffener 3702, as described above.

Figure 46F:
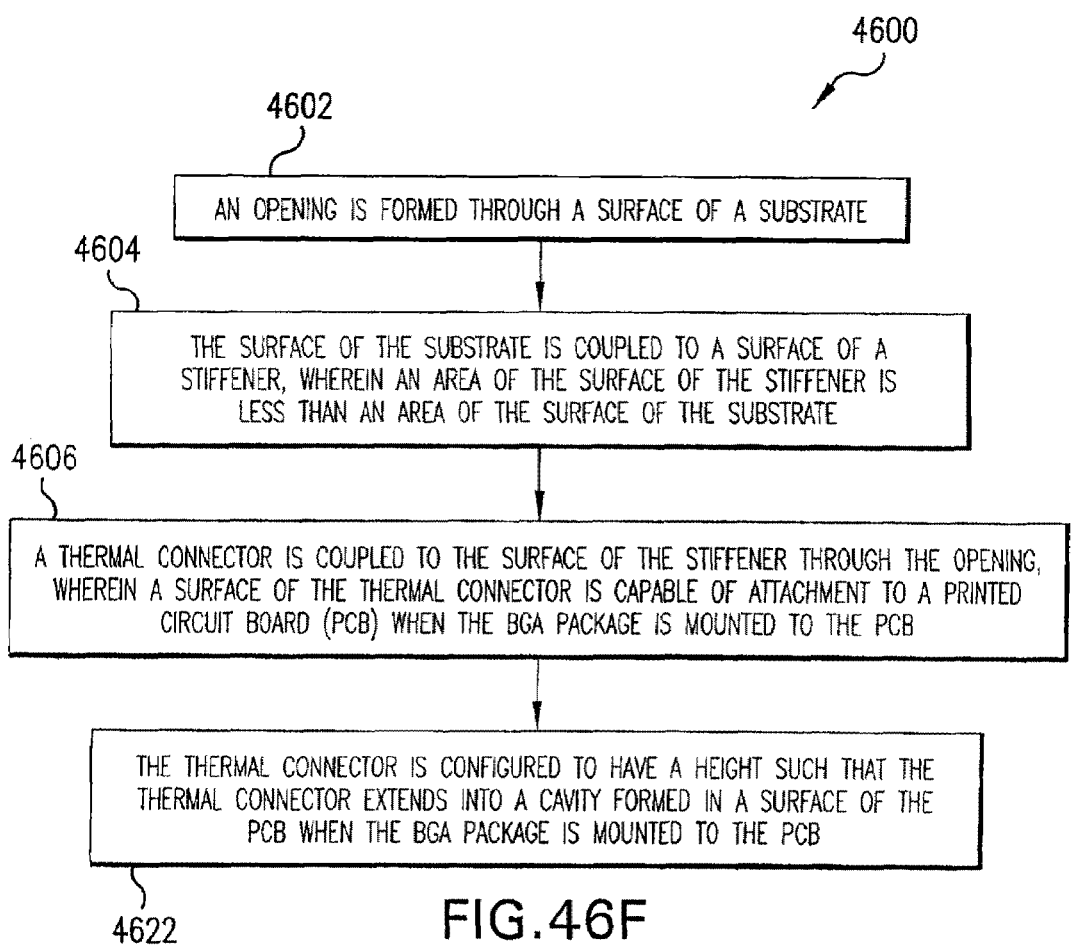

FIG. 46F provides an additional exemplary step for flowchart 4600 of FIG. 46A:

In step 4622, the thermal connector is configured to have a height such that the thermal connector extends into a cavity formed in a surface of the PCB when the BGA package is mounted to the PCB. For example, as shown in FIG. 45, thermal connector 802 has a height 4508 such that thermal connector 802 is long enough to extend into cavity 4504 in PCB 4502, when BGA package 4500 is mounted to PCB 4502.

FIG. 47 provides a flowchart 4700. Flowchart 4700 provides steps for assembling a ball grid array (BGA) package according to an additional embodiment. Flowchart 4700 begins with step 4702. In step 4702, a stiffener is provided that has a surface and a protruding portion, wherein the protruding portion is located on the surface of the stiffener. For example, the stiffener is stiffener 3802, as shown in FIG. 38. Stiffener 3802 has bottom surface 3808 and protruding portion 3804. Protruding portion 3804 is located on, and extends from bottom surface 3808.

In step 4704, an opening is formed through a surface of a substrate. For example, the opening is central window-shaped opening 704, formed in substrate 3701 of BGA package 3800 shown in FIG. 38. Opening 704 may have any shape, and is not required to be exactly centered in substrate 3701.

In step 4706, the surface of the substrate is coupled to the surface of the stiffener such that the protruding portion extends through the opening, wherein an area of the surface of the stiffener is less than an area of the surface of the substrate, wherein a surface of the protruding portion is capable of attachment to a printed circuit board (PCB) when the BGA package is mounted to the PCB. For example, as shown in FIG. 38, top surface 3738 of substrate 3701 is coupled to bottom surface 3808 of stiffener 3802, such that protruding portion 3804 extends through opening 704. As shown in FIG. 38, bottom surface 3808 of stiffener 3804 is smaller in area than top surface 3738 of substrate 3701. As described above, bottom surface 3806 of protruding portion 3804 is capable of attachment to a PCB when BGA package 3800 is mounted to the PCB.

Figure 47B:
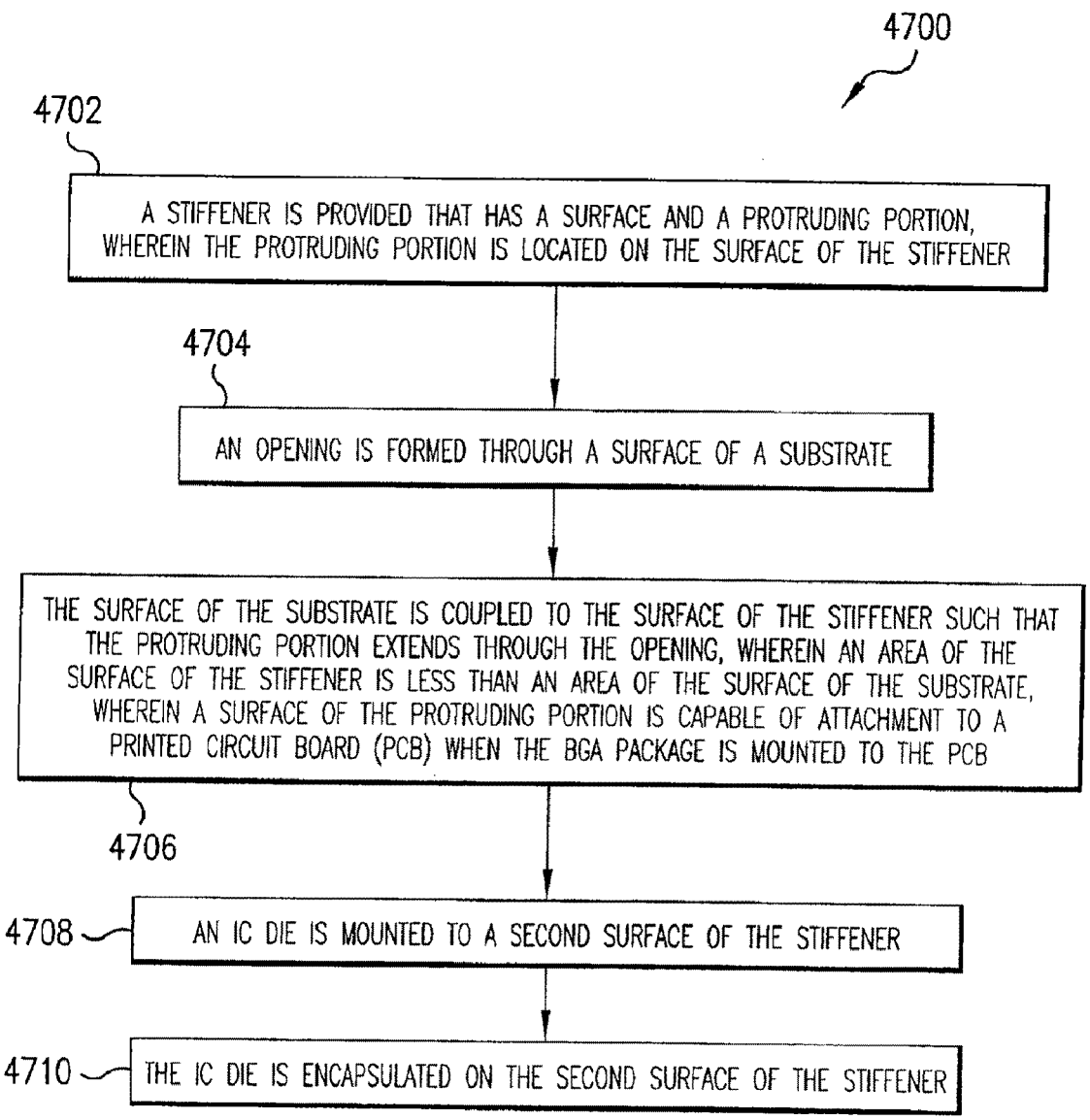

FIG. 47B provides additional exemplary steps for flowchart 4700 of FIG. 47A:

In step 4708, an IC die is mounted to a second surface of the stiffener. For example, as shown in FIG. 38, the IC die is IC die 102, which is mounted to top surface 3810 of stiffener 3802.

In step 4710, the IC die is encapsulated on the second surface of the stiffener. For example, as shown in FIGS. 38, 39, and 40, IC die 102 is encapsulated on the top surface of a stiffener by an encapsulate material 3704.

Figure 47C:
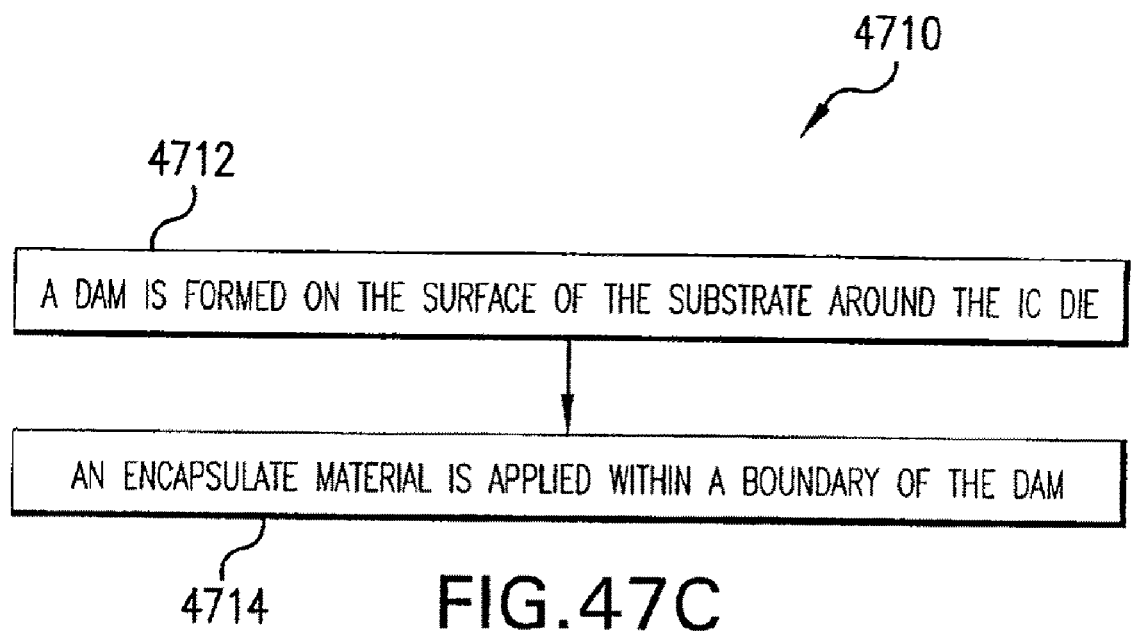

FIG. 47C provides exemplary steps for performing step 4710 shown in FIG. 47B:

In step 4712, a dam is formed on the surface of the substrate around the IC die. For example, the dam is dam 3706, which is formed on top surface 3738 of substrate 3701 around IC die 102.

In step 4714, an encapsulate material is applied within a boundary of the dam. For example, as shown in FIG. 38, encapsulate material 3704 is applied within the boundary of dam 3706, in a glob top encapsulation process.

In an alternative embodiment, step 4710 may include the step where an encapsulate material is applied according to an over-mold encapsulation process. For example, BGA package 3800 with a single piece stiffener/thermal connector is applicable to an over-mold encapsulation process, as shown in FIG. 39 for BGA package 3900.

Figure 47D:
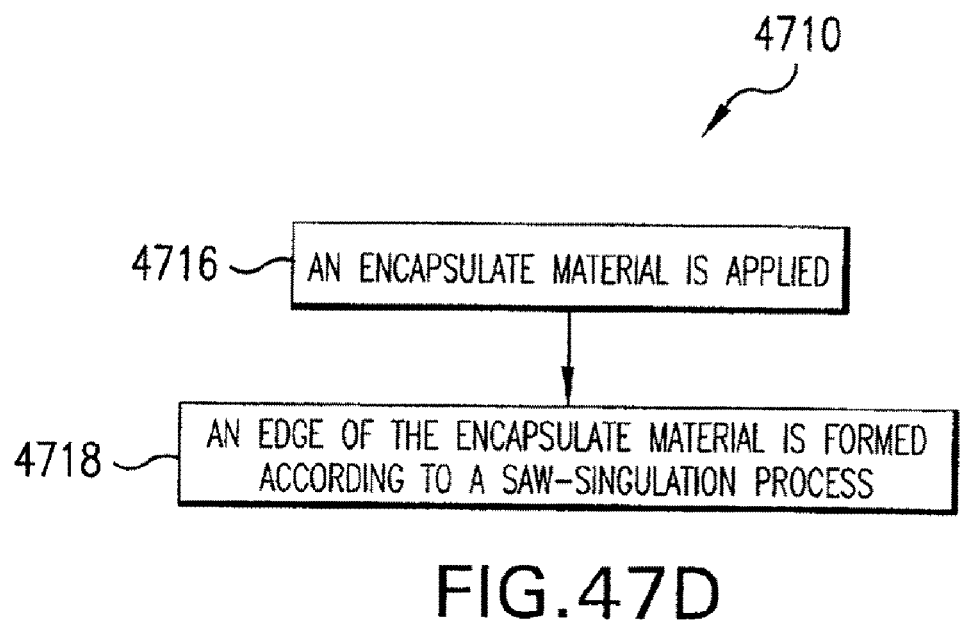

FIG. 47D provides exemplary steps for performing step 4710 shown in FIG. 47C, in still another alternative embodiment:

In step 4716, an encapsulate material is applied. For example, as shown in FIG. 40, encapsulate material 3704 is applied to encapsulate IC die 102. Encapsulate material 3704 may be applied to a plurality of BGA packages that have been manufactured in a panel strip.

In step 4718, an edge of the encapsulate material is formed according to a saw-singulation process. As described above, a saw-singulation process may be used to separate the BGA packages that were manufactured in a panel strip, thereby forming relatively straight edges for encapsulate material 3704, as shown in FIG. 40. BGA package 3800 with a single piece stiffener/thermal connector is applicable to this saw-singulation process.

Figure 47E:
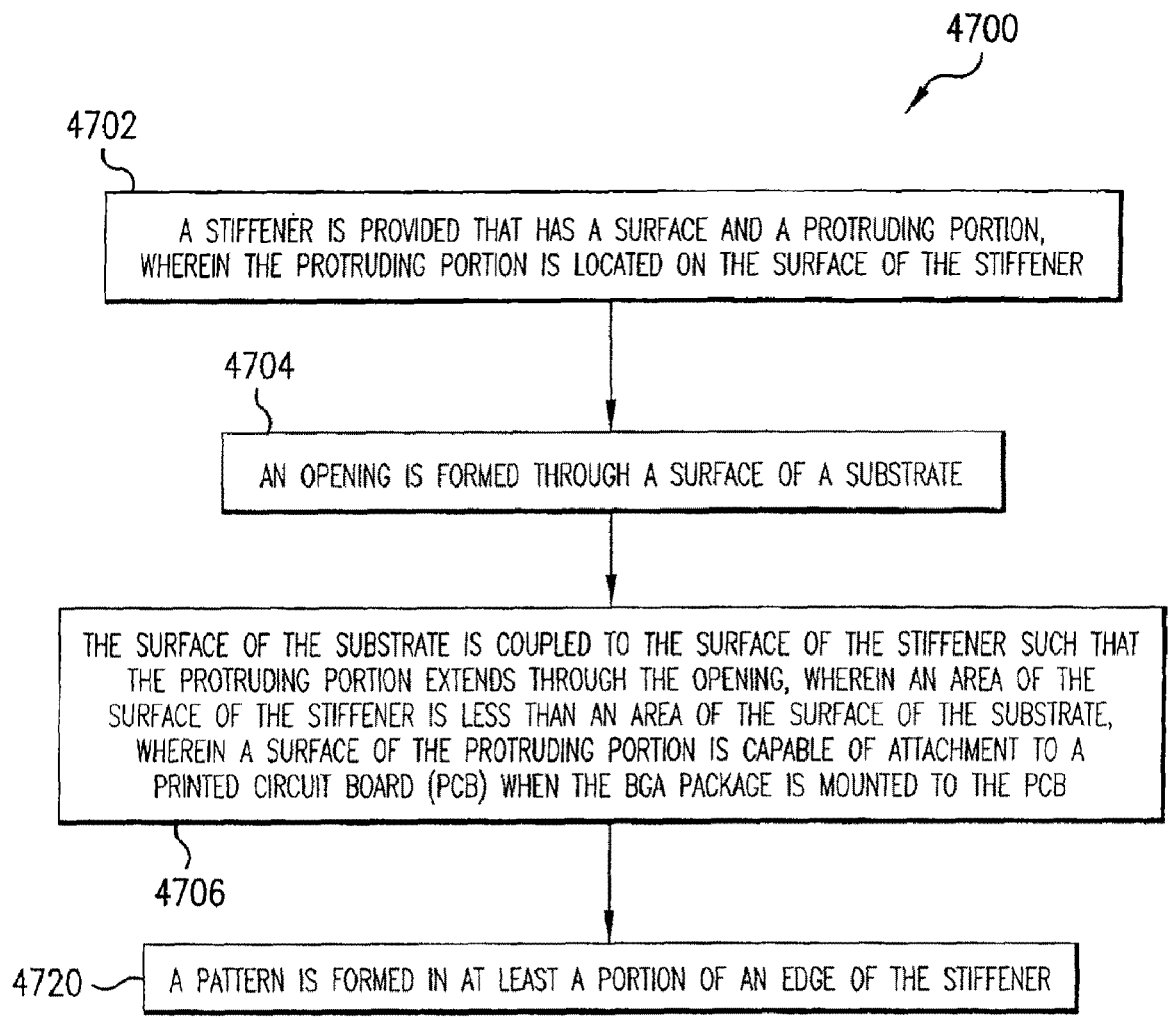

FIG. 47E provides an additional exemplary step for flowchart 4700 of FIG. 47A:

In step 4720, a pattern is formed in at least a portion of an edge of the stiffener. For example, FIGS. 37D and 37E show cutout portion 3724 formed in first edge 3716 of stiffener 3702. Stiffener 3802 is also applicable to such patterning. Hence, notch, hole, step, and other patterns as described above may also be formed in one or more edges of stiffener 3802.

Figure 47F:
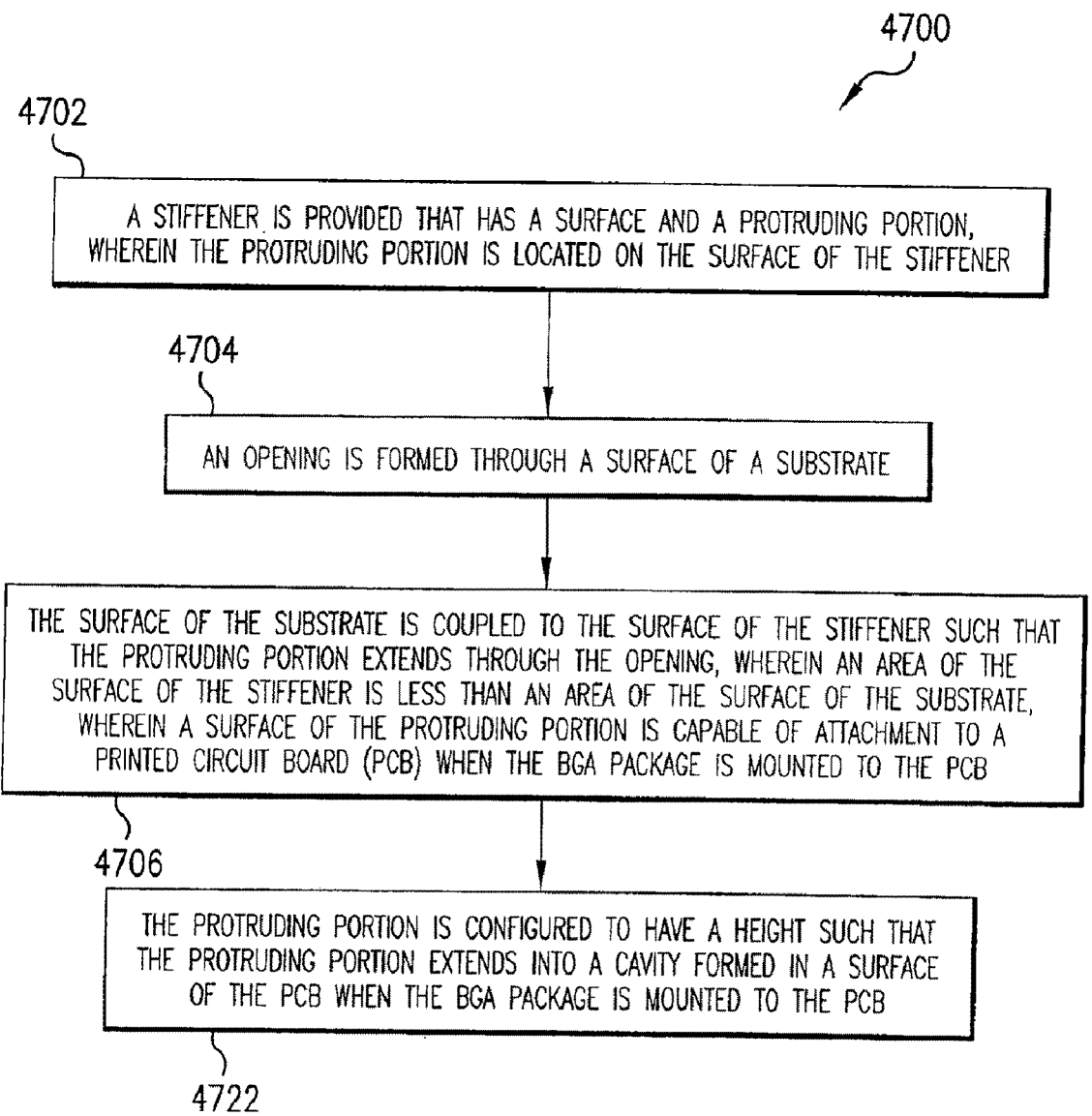

FIG. 47F provides an additional exemplary step for flowchart 4700 of FIG. 47A:

In step 4722, the protruding portion is configured to have a height such that the protruding portion extends into a cavity formed in a surface of the PCB when the BGA package is mounted to the PCB. For example, similarly to the embodiment shown in FIG. 45, protruding portion 3804 may have a height such that protruding portion 3804 is long enough to extend into cavity 4504 in PCB 4502, when BGA package 3800 is mounted to PCB 4502.

Figure 48:
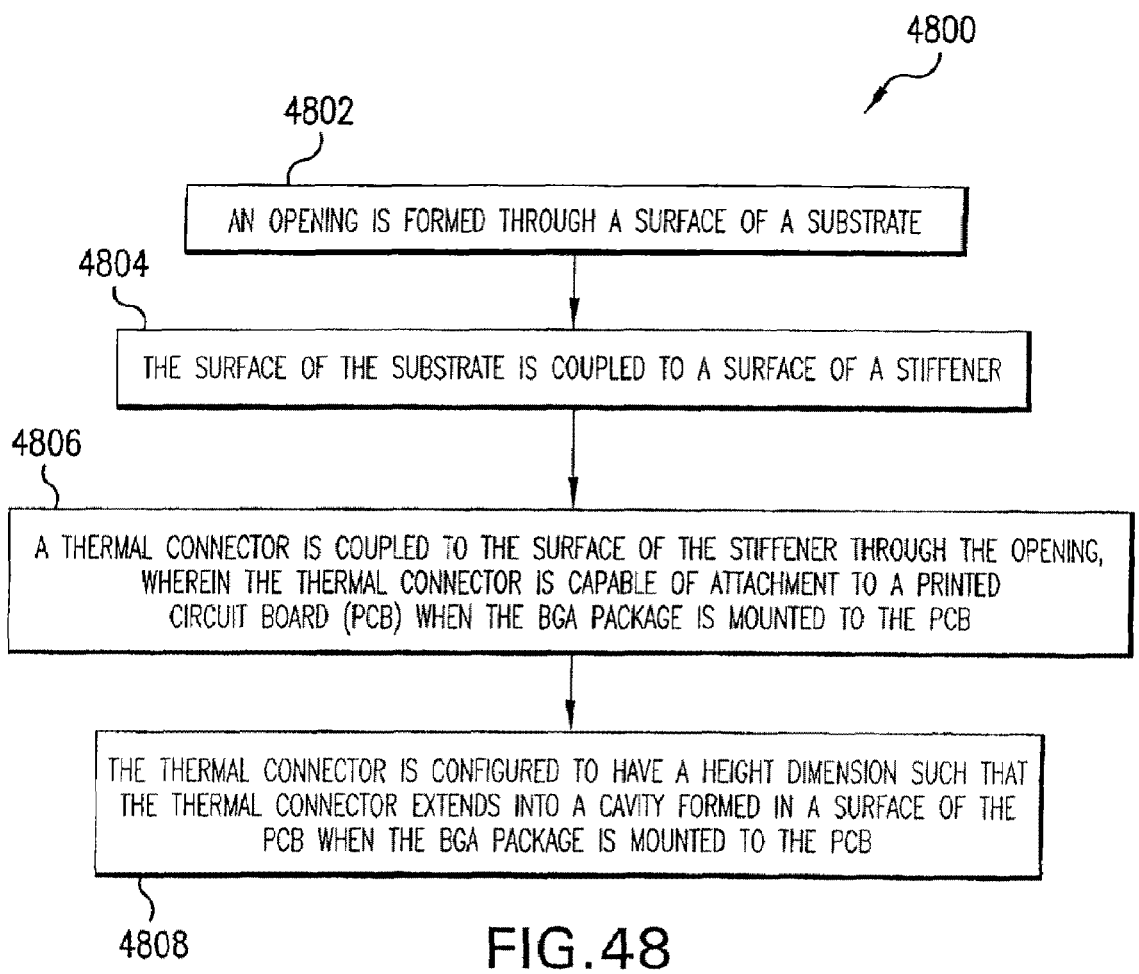

FIG. 48 provides a flowchart 4800. Flowchart 4800 provides steps for assembling a ball grid array (BGA) package according to an additional embodiment. Flowchart 4800 begins with step 4802. In step 4802, an opening is formed through a surface of a substrate. For example, the opening is central window-shaped opening 704, formed in substrate 3701 of BGA package 4100 shown in FIG. 41A. Opening 704 may have any shape, and is not required to be exactly centered in substrate 3701.

In step 4804, the surface of the substrate is coupled to a surface of a stiffener. For example, the surface of the substrate is top surface 3738 of substrate 3701, and the surface of the stiffener is bottom surface 4102 of stiffener 112, as shown in FIG. 41A. Bottom surface 4102 and top surface 3738 may be coupled together by a variety of means, including lamination, adhesives, epoxies, and other ways described herein or otherwise known.

In step 4806, a thermal connector is coupled to the surface of the stiffener through the opening, wherein the thermal connector is capable of attachment to a printed circuit board (PCB) when the BGA package is mounted to the PCB. For example, the thermal connector is thermal connector 802, which is coupled to bottom surface 4102 of stiffener 112 through opening 704, as shown in FIG. 41A. As described above, bottom surface 3736 of thermal connector 802 is capable of attachment to a PCB when BGA package 4100 is mounted to the PCB.

In step 4808, the thermal connector is configured to have a height such that the thermal connector extends into a cavity formed in a surface of the PCB when the BGA package is mounted to the PCB. For example, as shown in FIG. 45, thermal connector 802 has a height 4508 such that thermal connector 802 is long enough to extend into cavity 4504 in PCB 4502, when BGA package 4500 is mounted to PCB 4502. Similarly to BGA package 4500, BGA package 4100 may include a thermal connector 802 with a height long enough to extend into cavity 4504.

Figure 49:
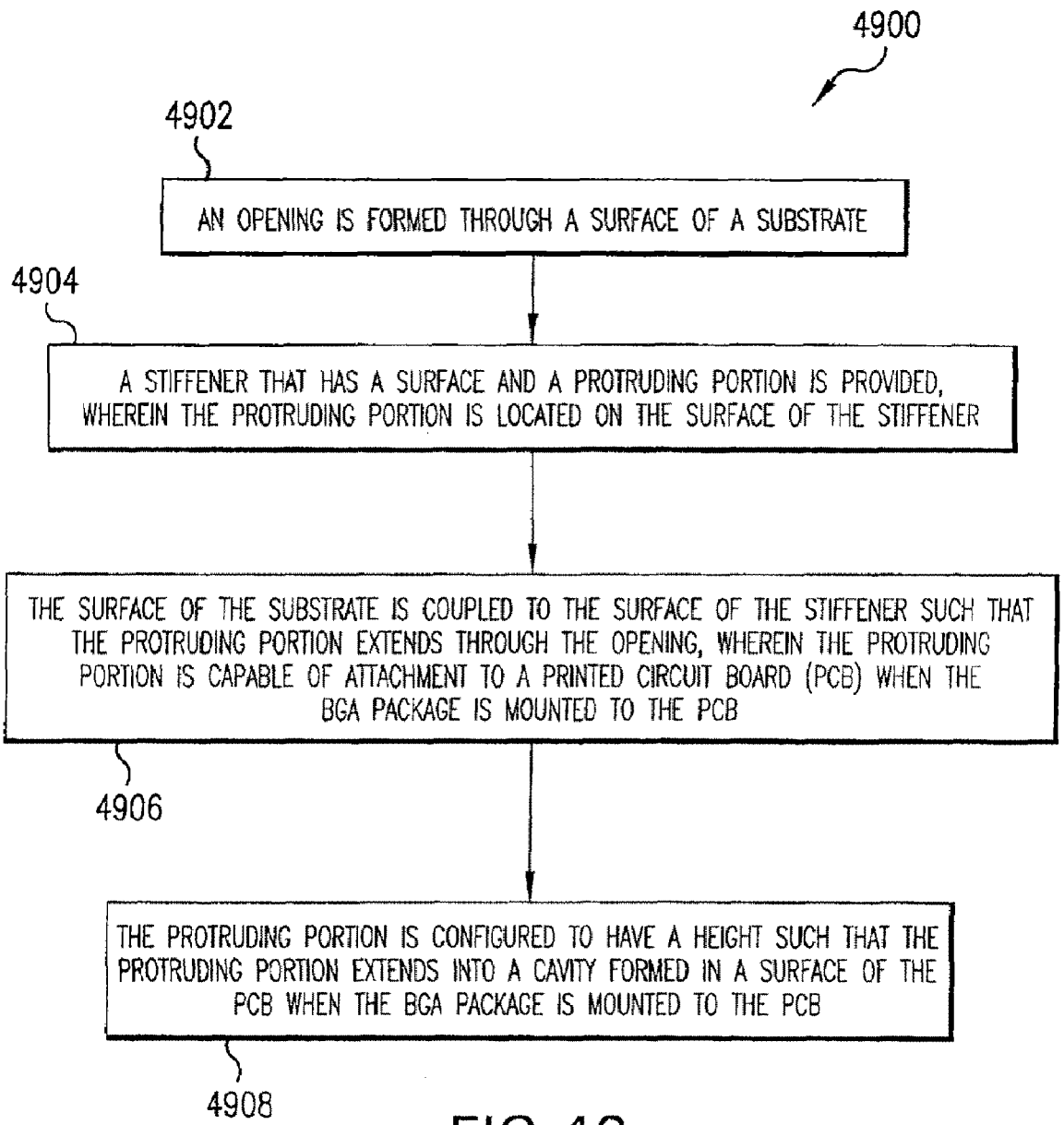

FIG. 49 provides a flowchart 4900. Flowchart 4900 provides steps for assembling a ball grid array (BGA) package according to an additional embodiment. Flowchart 4900 begins with step 4902. In step 4902, an opening is formed through a surface of a substrate. For example, the opening is central window-shaped opening 704, formed in substrate 3701 of BGA package 4200 shown in FIG. 42. Opening 704 may have any shape, and is not required to be exactly centered in substrate 3701.

In step 4904, a stiffener that has a surface and a protruding portion is provided, wherein the protruding portion is located on the surface of the stiffener. For example, the stiffener is stiffener 4202, as shown in FIG. 42. Stiffener 4202 includes bottom surface 4204 and protruding portion 2102. Protruding portion 2102 is located on, and extends from bottom surface 4204.

In step 4906, the surface of the substrate is coupled to the surface of the stiffener such that the protruding portion extends through the opening, wherein the protruding portion is capable of attachment to a printed circuit board (PCB) when the BGA package is mounted to the PCB. For example, as shown in FIG. 42, top surface 3738 of substrate 3701 is coupled to bottom surface 4204 of stiffener 4202, such that protruding portion 2102 extends through opening 704. As described above, bottom surface 4206 of protruding portion 2102 is capable of attachment to a PCB when BGA package 4200 is mounted to the PCB.

In step 4908, the protruding portion is configured to have a height such that the protruding portion extends into a cavity formed in a surface of the PCB when the BGA package is mounted to the PCB. For example, similarly to the embodiment shown in FIG. 45, protruding portion 2102 may have a height such that protruding portion 2102 is long enough to extend into cavity 4504 in PCB 4502, when BGA package 4200 is mounted to PCB 4502.

PCB Land Patterns for Connection of Thermal Connector to the PCB

This section describes PCB land patterns and configurations for attaching a thermal connector portion of a BGA package to a PCB, according to embodiments of the present invention. The PCB land patterns and configurations are applicable to mounting all types of thermal connectors. For example, applicable thermal connectors include cavity 702 shown in FIG. 7, thermal connector 802 first shown in FIG. 8, thermal connector 1102 first shown in FIG. 11, protruding portion 2102 first shown in FIG. 21, first and second thermal connectors 2402 and 2404 shown in FIG. 24, first, second, third, and fourth thermal connectors 2502, 2504, 2506, and 2508 shown in FIG. 25, first and second thermal connectors 2702 and 2704 shown in FIG. 27, and protruding portion 3804 shown in FIG. 38.

Figure 50A:
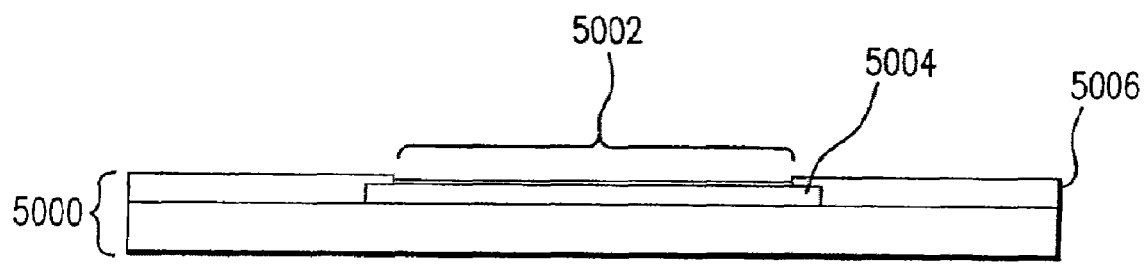
Figure 50B:
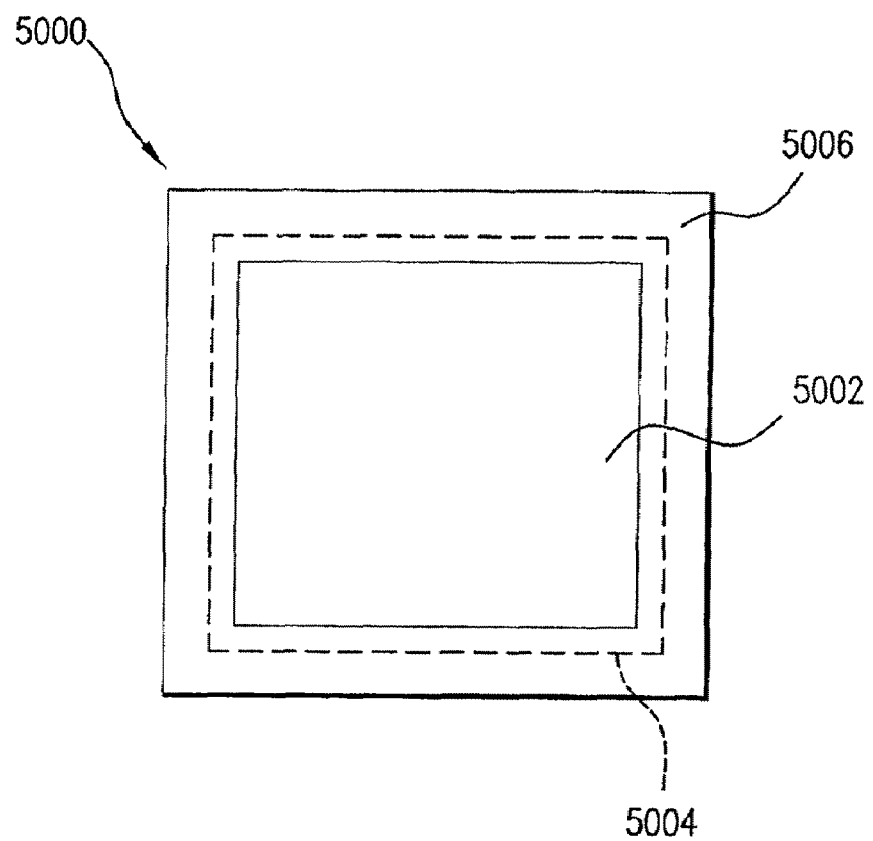

FIG. 50A shows a cross-sectional view of a portion of a PCB 5000 that has a land pattern 5002 thereon, according to an embodiment of the present invention. FIG. 50B shows a top view of a portion of PCB 5000. As shown in FIG. 50B, land pattern 5002 is substantially rectangular shaped, and is adapted to allowing a rectangular thermal connector of a BGA package to be mounted to PCB 5000, such as thermal connector 802 of BGA package 3700, as shown in FIG. 37A. Thermal connectors with shapes other than rectangular may also be mounted to PCB 5000 via land pattern 5002.

As shown in FIG. 50A, land pattern 5002 is an opening that allows access to a portion of a conductive land 5004 through a solder mask 5006 on the top surface of PCB 5000. FIG. 50B shows an outline of conductive land 5004 under solder mask 5006. A thermal connector may be attached to conductive land 5004 through land pattern 5002 by solder or other adhesive material. Conductive land 5004 may be rectangular, as shown in FIG. 50B, or may be formed in another shape, including round, elliptical, irregular, and other polygons. Conductive land 5004 may be electrically and/or thermally conductive. Conductive land 5004 may be electrically conductive in order to couple a thermal connector to a ground, power, or other signal in PCB 5000. Conductive land 5004 may be thermally conductive in order to enhance transfer of heat from the thermal connector attached to land pattern 5002. For example, conductive land 5004 may be made from copper, copper-based alloys, aluminum, aluminum-based alloys, other metals, or alloys/combinations thereof.

Figure 51A:
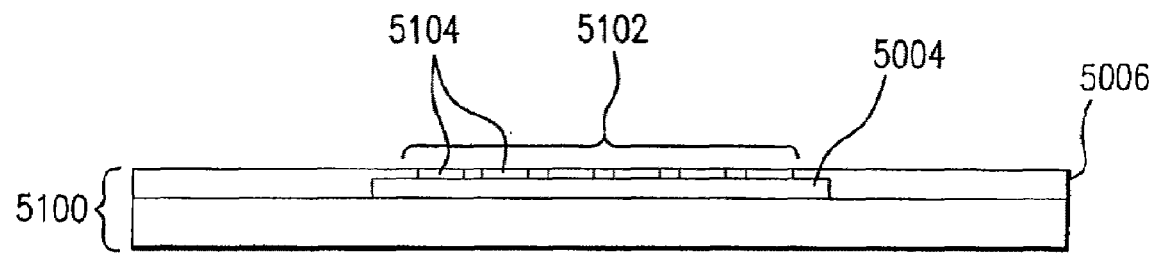
Figure 51B:
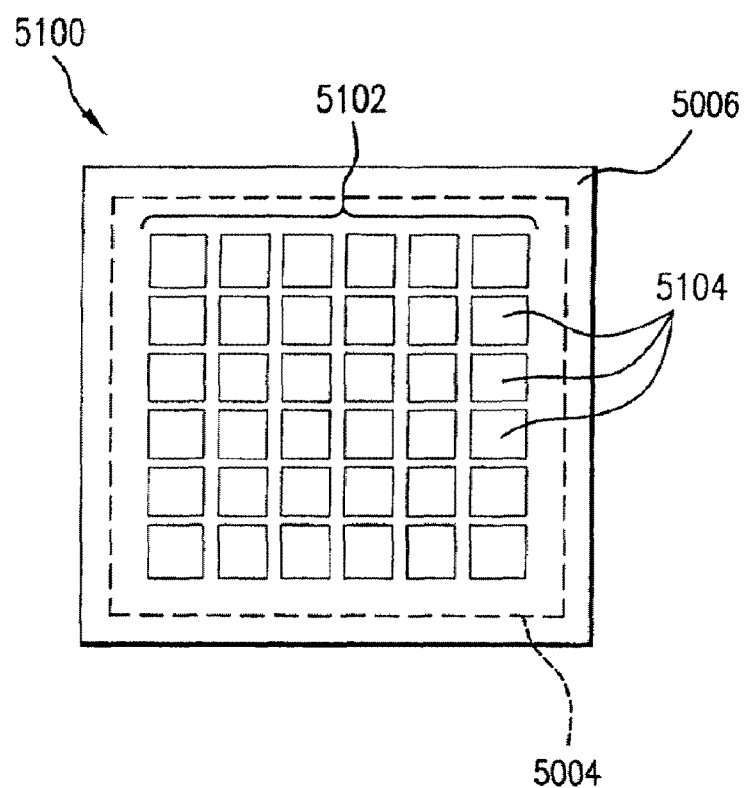

FIG. 51A shows a cross-sectional view of a portion of a PCB 5100 that has a land pattern 5102 thereon, according to an embodiment of the present invention. FIG. 51B shows a top view of a portion of PCB 5100. Land pattern 5102 of PCB 5100 is similar to land pattern 5002 of PCB 5000 shown in FIGS. 50A and 50B, subject to at least the following discussion.

As shown in FIG. 51B, land pattern 5102 includes an array or matrix of substantially rectangular shaped openings 5104. Openings 5104 allow access to a portion of conductive land 5004 through solder mask 5006 on the top surface of PCB 5100. Land pattern 5102 may include any number of openings 5104 arranged in an array or matrix. Land pattern 5102 is adapted to mounting a single thermal connector of a BGA package, such as thermal connector 802 of BGA package 3700, shown in FIG. 37A. Land pattern 5102 is also adapted to mounting multiple thermal connectors. For example, an array of thermal connectors similar to first, second, third, and fourth thermal connectors 2502, 2504, 2506, and 2508, shown in FIG. 25, may be attached to conductive land 5004 through openings 5104. An array of thermal connectors, having a thermal connector that corresponds to each of openings 5104, may be mounted to conductive land 5004 through openings 5104. In a multiple thermal connector embodiment, conductive land 5004 may be separated into multiple electrically isolated segments. The multiple electrically isolated segments can accommodate multiple electrical power, ground, and other signals that corresponding to the multiple thermal connectors.

Note that for illustrative purposes, the present description illustrates "solder mask defined land openings," (SMDs) such as land pattern 5102. For SMDs, a portion of the conductive land that is exposed through openings in the solder mask has a smaller area than the entire conductive land. The present invention, however, is also applicable to "non-solder mask defined land openings" (NSMDs). For NSMDs, the entire conductive land is exposed. For example, in an NSMD embodiment for PCB 5100, conductive land 5004 may be formed as a plurality of rectangular conductive lands arranged in an array or matrix, so that solder mask 5006 is not required to define the array or matrix, and/or is not required to define the rectangular shapes of openings 5104. Any of the land patterns described herein may be formed as SMDs or NSMDs.

Figure 52A:
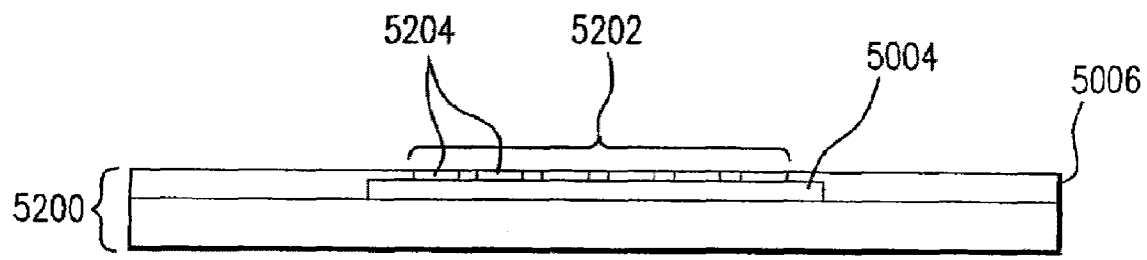
Figure 52B:
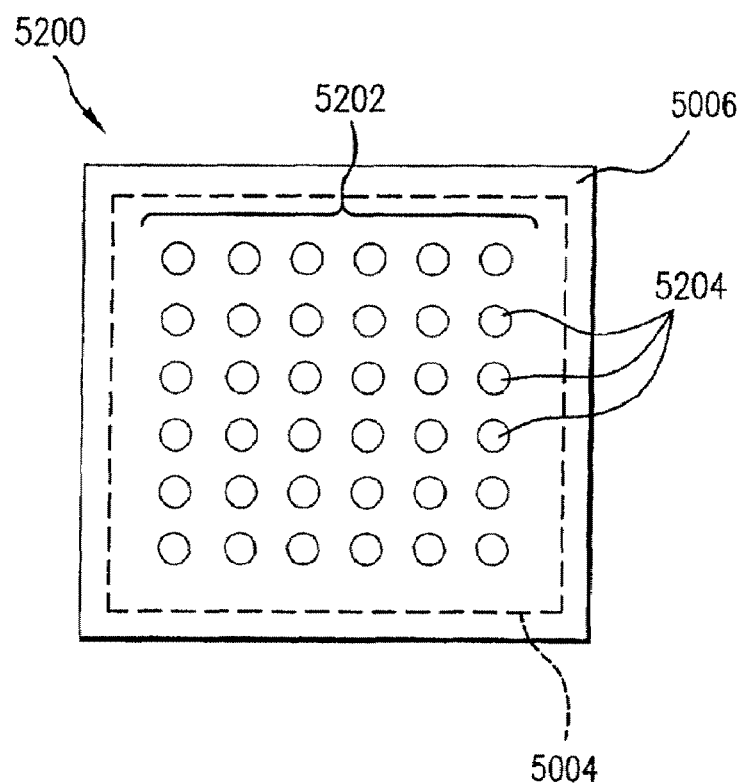

FIG. 52A shows a cross-sectional view of a portion of a PCB 5200 that has a land pattern 5202 thereon, according to an embodiment of the present invention. FIG. 52B shows a top view of a portion of PCB 5200. Land pattern 5202 of PCB 5200 is similar to land pattern 5102 of PCB 5100 shown in FIGS. 51A and 51B, except that land pattern 5202 of PCB 5200 has an array or matrix of substantially round or elliptical shaped openings 5204, rather than rectangular shaped openings.

Figure 53A:
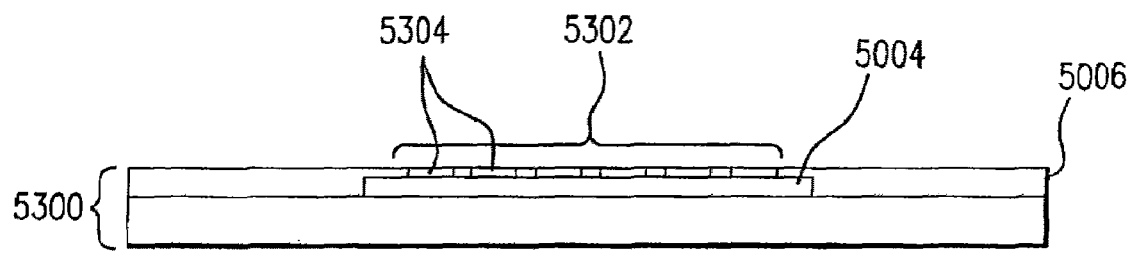
Figure 53B:
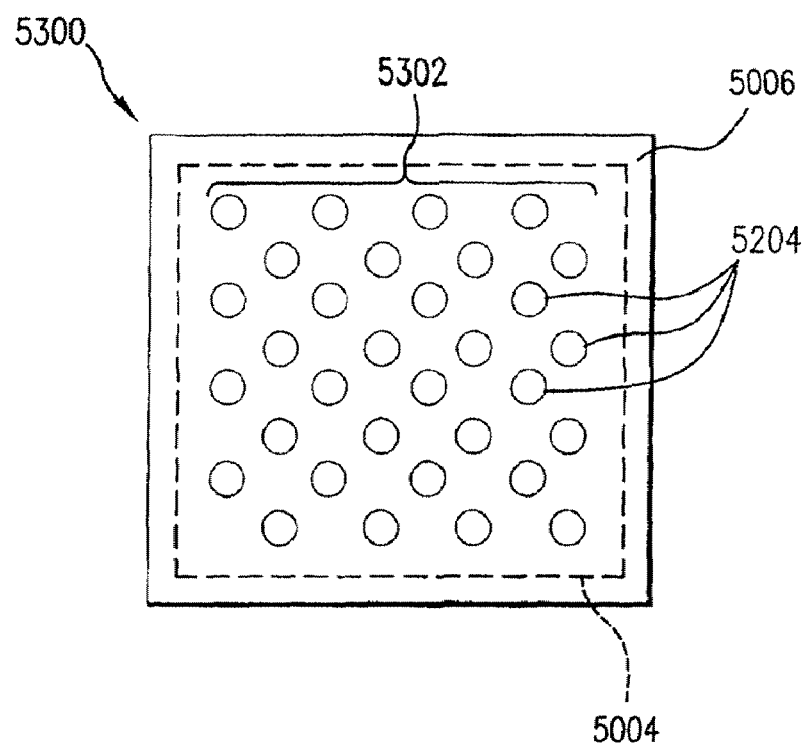

FIG. 53A shows a cross-sectional view of a portion of a PCB 5300 that has a land pattern 5302 thereon, according to an embodiment of the present invention. FIG. 53B shows a top view of a portion of PCB 5300. Land pattern 5302 of PCB 5300 is similar to land pattern 5202 of PCB 5200 shown in FIGS. 52A and 52B, except that land pattern 5302 of PCB 5300 has a staggered array or matrix of substantially round or elliptical shaped openings 5204, rather than a regular, or non-staggered array or matrix, as in land pattern 5202.

Figure 54A:
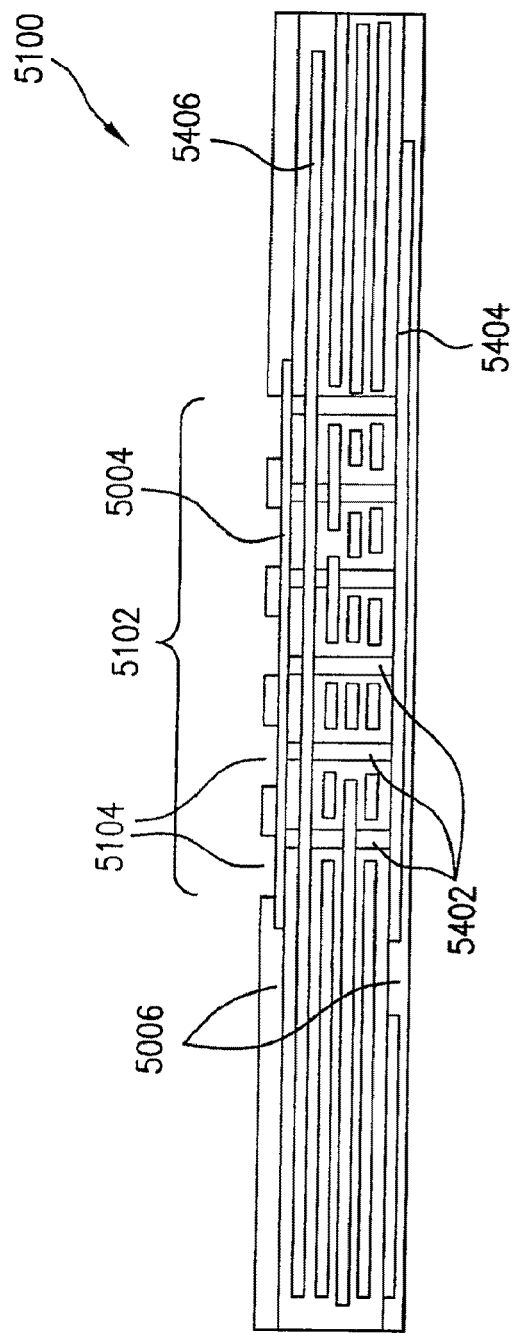
Figure 54B:
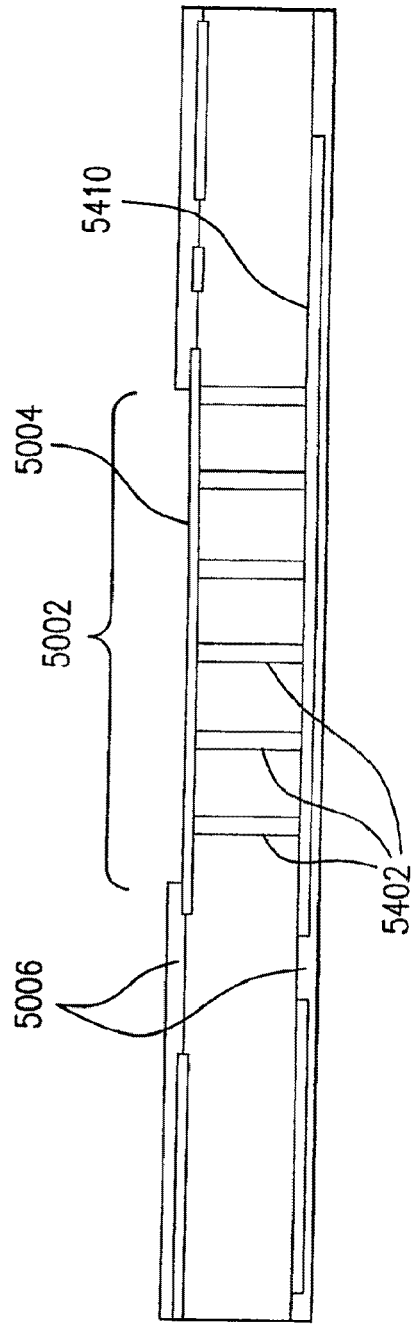

FIGS. 54A and 54B provide additional internal detail for example PCBs, according to embodiments of the present invention. The description related to FIGS. 54A and 54B is provided below for illustrative purposes, and is applicable to all PCBs described herein, including PCBs having any number of layers.

FIG. 54A shows a cross-sectional view of PCB 5100 of FIGS. 51A and 51B. As shown in the example of FIG. 54A, PCB 5100 is a multi-layer (five conductive layers shown) PCB. In embodiments, conductive land 5004 may be coupled to any number of conductive planes, layers, and/or traces in a PCB. For example, in FIG. 54A, a first electrical potential plane 5404 and a second electrical potential plane 5406 in PCB 5100 are coupled to conductive land 5004 by a plurality of vias 5402. Plurality of vias 5402 may be electrically conductive in order to electrically couple conductive land 5004 to first electrical potential plane 5404 and second electrical potential plane 5406. Plurality of vias 5404 may be thermally conductive in order to enhance heat transfer from conductive land 5004 to first electrical potential plane 5404 and second electrical potential plane 5406. In embodiments, any number of one or more vias 5402 may be present.

FIG. 54B shows a cross-sectional view of PCB 5000 of FIGS. 50A and 50B. As shown in the example of FIG. 54B, PCB 5000 is a two-layer PCB, and conductive land 5004 is coupled to electrical potential plane 5410 by plurality of vias 5402.

FIG. 55A shows a cross-sectional view of a PCB 5500 that has an opening 5502 through PCB 5500. Opening 5502 is open at a top surface 5506 and a bottom surface 5508 of PCB 5500. Opening 5502 accommodates a thermal connector in a similar fashion as does opening 4504 shown in FIG. 45, which accommodates thermal connector 802. A thermal connector may extend or protrude into/through opening 5502, to be coupled to a conductive land 5504 on an inner surface around opening 5502. For example, the thermal connector may be attached to conductive land 5504 by a solder or other adhesive material. As shown in FIG. 55A, conductive land 5504 is electrically and/or thermally coupled to one or more electrical potential planes 5506 in PCB 5500. As shown in the example of FIG. 55, PCB 5500 is a multi-layer (five conductive layers shown) PCB. FIG. 55B shows a PCB 5510 with opening 5502 therethrough for accommodating a thermal connector, similar to PCB 5500. PCB 5510 is shown as a two-layer PCB, for illustrative purposes.

Seal Ring Embodiments

This section describes a seal ring for a thermal connector portion of a BGA package, according to embodiments of the present invention. The seal ring as described herein is applicable to all configurations of BGA packages with thermal connectors. For example, the applicable thermal connectors include cavity 702 shown in FIG. 7, thermal connector 802 first shown in FIG. 8, thermal connector 1102 first shown in FIG. 11, protruding portion 2102 first shown in FIG. 21, first and second thermal connectors 2402 and 2404 shown in FIG. 24, first, second, third, and fourth thermal connectors 2502, 2504, 2506, and 2508 shown in FIG. 25, first and second thermal connectors 2702 and 2704 shown in FIG. 27, and protruding portion 3804 shown in FIG. 38. The description provided below relates to thermal connector 802, for illustrative purposes, but is applicable to all thermal connectors and BGA package configurations.

FIG. 56 shows a cross-sectional view of BGA package 5600, according to an embodiment of the present invention. BGA package 5600 is substantially similar to BGA package 4000 shown in FIG. 40, subject to the following discussion. As shown in FIG. 56, a sealant material 5602 fills a gap between thermal connector 802 and substrate 3701 in opening 704. Sealant material 5602 is formed in a ring around thermal connector 802, and therefore is also referred to as a seal ring. In an embodiment, sealant material 5602 is a dielectric sealant, an epoxy, or other electrically non-conductive sealing material. The seal ring formed by sealant material 5602 improves a BGA package resistance to moisture, BGA package manufacturing yields, stability of thermal connector 802 in opening 704, BGA package reliability, as well as additional BGA package thermal and mechanical performances.

In an alternative embodiment, sealant material 5602 is an electrically conductive material that can electrically couple thermal connector 802 to one or more electrically conductive traces, rings, and/or planes of substrate 3701, that are coupled to an electrical potential. Such an embodiment provides additional flexibility for routing of substrate 3701, and an improvement in BGA package electrical performance.

SUMMARY OF SOME FEATURES OF THE PRESENT INVENTION (1) A window opening is patterned in the package substrate to facilitate thermal and electrical connection from the IC die to the PCB.

(2) A thermal/electrical connector is exposed at the bottom of the BGA package.

(3) BGA package designs can use conventional types of substrate (such as organic, tape, and ceramic, etc.) as well as advanced types of substrate (high density substrate, build-up substrate, Teflon substrate, etc.); a single routing layer substrate, as well as two or more routing layer substrate can be used.

(4) Glob-top, over-mold, saw-singulation and other IC die encapsulation processes can be used.

(5) Stiffener/interposer can be patterned in different forms (openings, cutouts, steps, etc.) or shapes (square, rectangular, circular, spoke-like, cutouts or notches and steps on one or more edges, etc.) for enhanced wire bond connection, enhanced BGA package mechanical, thermal, and electrical performance, enhanced reliability, improved substrate design, and manufacturing process enhancement.

(6) One or more of stiffener/interposers and thermal/electrical connector surfaces may be finished using a variety of processes, materials, and methodologies at various surfaces, spots, locations.

(7) The stiffener/interposer and thermal/electrical connector may be constructed in a single piece.

(8) A cavity may be formed in a thermal/electrical connector for die attachment.

(9) Two or more stiffeners/interposers may be integrated into a BGA package.

(10) A seal ring design may be incorporated in a substrate window opening.

(11) A thermal/electrical connector may be formed to extend under the sitting plane of the BGA package.

(12) A cavity may be formed in a surface of the PCB to allow the extended thermal/electrical connector to be more easily mounted on the PCB, and/or exposed to the backside of the PCB, and/or connected to heat sinking devices at the backside of the PCB

(13) A split stiffener/interposer design may be used to provide different electrical potential planes for the BGA package.

(14) Rigid support is provided for the IC die during the BGA package assembly processes.

SUMMARY OF SOME ADVANTAGES OF THE PRESENT INVENTION (1) A thermal/electrical connector provides a low impedance path for heat and/or electrical current flow between an IC die and a PCB.

(2) A window opening formed in a substrate facilitates thermal and electrical connection between an IC die and PCB.

(3) BGA package designs can use conventional types of substrate (such as organic, tape, and ceramic, etc.) as well as advanced types of substrate (high-density substrate, build-up substrate, Teflon substrate, etc.).

(4) A substrate with a single routing layer, as well as two or more layers may be used.

(5) Various processes may be used for IC die encapsulation, including glob-top, over-mold, saw-singulated, and others to meet requirements of various applications and provide the BGA package with various forms and appearances.

(6) Different patterns (openings, cutouts, steps, etc.) or shapes (square, rectangular, circular, spoke-like, cutouts or notches and steps on one or more edges, etc.) may be formed in a stiffener/interposer to reduce wire bond lengths for critical nets, reduce risks of wire bonds shorting during the BGA package assembly processes, provide flexibility for substrate routing/design, and enhance BGA package mechanical, thermal, electrical, and reliability performances.

(7) A black-oxidized surface treatment may be applied on a top surface of a stiffener/interposer. This promotes adhesion between a molding compound used for IC die encapsulation and the stiffener/interposer. A surface coating or plating on one or more stiffener/interposer surfaces and/or thermal/electrical connector surfaces at an interface of silver, solder, or other metals and alloys promotes adhesion between elements. A surface coating or plating on a bottom surface of a thermal/electrical connector of silver, solder, or other metal(s) and/or alloy(s) promotes adhesion between the thermal connector of the BGA package and a PCB during a surface mount process.

(8) A single-piece construction for stiffener/interposer and thermal/electrical connector reduces an electrical and thermal interface impedance.

(9) A cavity formed in a thermal/electrical connector for attachment of the IC die reduces wire bond length and improves package electrical performances.

(10) A two-stiffener/interposer integration into a BGA package provides additional electrical potential planes for the BGA package.

(11) A split stiffener/interposer design provides additional electrical potential planes for the BGA package.

(12) A seal ring design in a substrate window opening improves BGA package moisture resistance as well as mechanical and thermal performances.

(13) A rigid IC die support is provided by the present invention, which reduces IC die cracking and de-lamination, and improves assembly yields during a BGA package assembly process.

(14) Extension or protrusion of the thermal/electrical connector under the sitting plane of the BGA package allows connection of heat sinking devices from the backside of an PCB to the BGA package.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A ball grid array (BGA) package, comprising:
a substrate that has a surface, wherein said surface has an opening therein;
a stiffener that has a first surface and a protruding portion, wherein the protruding portion is located on said first surface of said stiffener, wherein the first surface of said stiffener is coupled to said surface of said substrate, wherein said protruding portion extends through said opening, wherein an area of said first surface of said stiffener is less than an area of said surface of said substrate;
an IC die mounted to a second surface of said stiffener; and a wirebond coupled to a bond pad on said IC die and said second surface of the stiffener;

wherein a surface of said protruding portion is capable of attachment to a printed circuit board (PCB) when the BGA package is mounted to the PCB and wherein said IC die has first and second opposing surfaces, wherein said first surface of said IC die is coupled to said second surface of said stiffener, wherein said first and second surfaces of said IC die are located outside of said opening.

2. The package of claim 1, further comprising:

an encapsulate material that encapsulates said IC die on said second surface of said stiffener.

3. The package of claim 2, further comprising:

a dam attached to said surface of said substrate around said IC die;

wherein the encapsulate material is formed according to a glob top encapsulation process within a boundary of said dam.

4. The package of claim 2, wherein the encapsulate material is formed according to an over-mold encapsulation process.

5. The package of claim 2, wherein a saw-singulation process is used to form an edge of said encapsulate material.

6. The package of claim 1, wherein said stiffener has an edge, wherein at least a portion of said edge is patterned.

7. The package of claim 1, wherein said protruding portion has a height such that said protruding portion extends into a cavity formed in a surface of the PCB when the BGA package is mounted to the PCB.

8. The package of claim 1, further comprising:

a sealant material that substantially fills a gap around said protruding portion between said protruding portion and said substrate in said opening.

9. The package of claim 1, wherein the opening is defined by a wall of the substrate and wherein a gap separates the protruding portion from the wall.

10. The package of claim 1, wherein the second surface of the stiffener is substantially planar.

\* \* \* \* \*